(12) United States Patent
Shinomiya et al.

(10) Patent No.: US 11,506,937 B2
(45) Date of Patent: Nov. 22, 2022

(54) PLANAR LIGHT SOURCE AND METHOD OF MANUFACTURING THE SAME

(71) Applicant: NICHIA CORPORATION, Anan (JP)

(72) Inventors: Yasunori Shinomiya, Tokushima (JP); Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/337,030

(22) Filed: Jun. 2, 2021

(65) Prior Publication Data

US 2021/0382354 A1   Dec. 9, 2021

(30) Foreign Application Priority Data

| Jun. 3, 2020 | (JP) | JP2020-096970 |
| Aug. 26, 2020 | (JP) | JP2020-142852 |
| Nov. 13, 2020 | (JP) | JP2020-189799 |
| Jan. 29, 2021 | (JP) | JP2021-013393 |
| Apr. 21, 2021 | (JP) | JP2021-071507 |

(51) Int. Cl.
| G02F 1/1335 | (2006.01) |
| F21V 23/00 | (2015.01) |
| F21V 33/00 | (2006.01) |
| F21V 8/00 | (2006.01) |
| F21Y 105/16 | (2016.01) |

(52) U.S. Cl.
CPC ...... *G02F 1/133612* (2021.01); *F21V 23/002* (2013.01); *F21V 33/0052* (2013.01); *G02B 6/0083* (2013.01); *F21Y 2105/16* (2016.08)

(58) Field of Classification Search
CPC ............... F21V 23/002; F21V 33/0052; F21Y 2105/16; G02B 6/0083; G02F 1/133612; H01L 33/62; H01L 23/49827
See application file for complete search history.

(56) References Cited

U.S. PATENT DOCUMENTS

| 8,301,002 B2 | 10/2012 | Shani |
| 2005/0265029 A1 | 12/2005 | Epstein et al. |
| (Continued) | | |

FOREIGN PATENT DOCUMENTS

| EP | 3 451 371 A1 | 3/2019 |
| JP | H02-292891 A | 12/1990 |
| (Continued) | | |

*Primary Examiner* — Zheng Song
(74) *Attorney, Agent, or Firm* — Foley & Lardner LLP

(57) ABSTRACT

A planar light source includes a wiring substrate including an insulating layer comprising a first through-hole, a second through-hole, a first wiring layer, and a second wiring layer; a light source including a first electrode and a second electrode, a light guide member; a first wiring member including a first portion filling the first through-hole and electrically connected to the first electrode and a second portion disposed below the insulating layer, continuous with the first portion, and in contact with the first wiring layer; and a second wiring member including a third portion filling the second through-hole and electrically connected to the second electrode and a fourth portion disposed below the insulating layer, continuous with the third portion, and in
(Continued)

contact with the second wiring layer. The first and second wiring layers are arranged at opposite sides of the first and second through-holes in a top plan view.

16 Claims, 40 Drawing Sheets

(56) References Cited

U.S. PATENT DOCUMENTS

| | | | |
|---|---|---|---|
| 2010/0116525 A1 | 5/2010 | Oka et al. | |
| 2010/0259706 A1* | 10/2010 | Kuwaharada | H01L 33/58 |
| | | | 362/311.09 |
| 2014/0061704 A1* | 3/2014 | Yamada | H01L 33/62 |
| | | | 438/27 |
| 2015/0179905 A1* | 6/2015 | Ohmae | G02F 1/133608 |
| | | | 438/28 |
| 2017/0279019 A1* | 9/2017 | Ueda | H01L 33/56 |
| 2018/0239193 A1 | 8/2018 | Hayashi | |
| 2019/0049649 A1 | 2/2019 | Hayashi et al. | |
| 2019/0148278 A1* | 5/2019 | Imayoshi | H01L 23/49827 |
| | | | 257/774 |
| 2020/0019017 A1* | 1/2020 | Kyoukane | G02F 1/133611 |
| 2020/0107442 A1 | 4/2020 | Minato et al. | |
| 2020/0107447 A1 | 4/2020 | Sakamoto et al. | |
| 2020/0274042 A1 | 8/2020 | Lee et al. | |
| 2022/0146744 A1* | 5/2022 | Li | G02B 6/0083 |

FOREIGN PATENT DOCUMENTS

| | | |
|---|---|---|
| JP | H10-051094 A | 2/1998 |
| JP | H11-054854 A | 2/1999 |
| JP | 2000-151051 A | 5/2000 |
| JP | 2001-203439 A | 7/2001 |
| JP | 2008-205125 A | 9/2008 |
| JP | 2010-199297 A | 9/2010 |
| JP | 2014-075457 A | 4/2014 |
| JP | 2015-192095 A | 11/2015 |
| JP | 2016-018896 A | 2/2016 |
| JP | 2016-219505 A | 12/2016 |
| JP | 2017-228644 A | 12/2017 |
| JP | 2018-133304 A | 8/2018 |
| JP | 2019-012681 A | 1/2019 |
| JP | 2020-053582 A | 4/2020 |
| JP | 2020-053587 A | 4/2020 |
| JP | 2020-057664 A | 4/2020 |
| JP | 2020-522117 A | 7/2020 |
| KR | 2009-0117419 A | 11/2009 |
| WO | WO-2016/103547 A1 | 6/2016 |
| WO | WO-2017/014127 A1 | 1/2017 |

* cited by examiner

PLANAR LIGHT SOURCE AND METHOD OF MANUFACTURING THE SAME

CROSS-REFERENCE TO RELATED APPLICATIONS

This application claims priority to Japanese Patent Application No. 2020-96970, filed on Jun. 3, 2020, Japanese Patent Application No. 2020-142852, filed on Aug. 26, 2020, Japanese Patent Application No. 2020-189799, filed on Nov. 13, 2020, Japanese Patent Application No. 2021-013393, filed on Jan. 29, 2021, and Japanese Patent Application No. 2021-071507, filed on Apr. 21, 2021. The contents of these applications are hereby incorporated by reference in their entireties.

BACKGROUND

The present disclosure relates to a planar light source and a method of manufacturing the same.

A planar light source including a wiring substrate, a light source disposed above the wiring substrate, and a light guide member disposed above the wiring substrate and surrounding the light source is widely utilized in a backlight for a liquid crystal display device, for example.

For the wiring substrate, there is known a configuration including an insulating layer, and two wiring layers provided below the insulating layer and corresponding to two electrodes of the light source. As one example of a structure that electrically connects each wiring layer in such a wiring substrate and a corresponding one of the electrodes, there is known a structure in which two through-holes are provided in the insulating layer, conductive members are disposed in respective through-holes, and each conductive member is connected to the corresponding electrode and the corresponding wiring layer (for example, see Japanese Patent Application Publication No. 2015-192095).

SUMMARY

An object of certain embodiments of the present invention is to provide a planar light source in which occurrence of connection failure can be inhibited in an electrical connection structure between a wiring layer and an electrode of a light source of a wiring substrate, and a method of manufacturing the same.

A planar light source according to one embodiment includes a wiring substrate including an insulating layer defining first through-holes and second through-holes, each of the first through-holes and a respective one of the second through-holes being separated from each other, and a first wiring layer and a second wiring layer that are disposed below the insulating layer and separated from each first through-hole and each second through-hole, respectively; light sources disposed above the wiring substrate, each of the light sources comprising a first electrode and a second electrode that are separated from each other; a light guide member disposed above the wiring substrate and surrounding each of the light sources; first wiring members, each including a first portion filling a corresponding one of the first through-holes and electrically connected to the first electrode of a corresponding one of the light sources and a second portion disposed below the insulating layer, continuous with the first portion, and in contact with the first wiring layer; and second wiring members, each including a third portion filling a corresponding one of the second through-holes and electrically connected to the second electrode of a corresponding one of the light sources and a fourth portion disposed below the insulating layer, continuous with the third portion, and in contact with the second wiring layer. The first wiring layer and the second wiring layer are arranged at two opposite side to each other with respect to each first through-hole and a corresponding second through-hole in a top plan view.

A planar light source according to an embodiment includes a wiring substrate including an insulating layer defining first through-holes and second through-holes, each of the first through-holes and a respective one of the second through-holes being separated from each other and a first wiring layer and a second wiring layer that are disposed below the insulating layer and separated from each first through-hole and each second through-hole, respectively, and a covering layer covering peripheries of the first through-hole and the second through-hole on a lower surface of the insulating layer such that the first through-hole and the second through-hole are exposed, the covering layer exposing a portion of each of the first wiring layer and the second wiring layer; light sources disposed above the wiring substrate, each of the light sources comprising a first electrode and a second electrode that are separated from each other; a light guide member disposed above the wiring substrate and surrounding each of the light sources; a first wiring member including a first portion filling a corresponding one of the first through-holes and electrically connected to the first electrode of a corresponding one of the light sources and a second portion continuous with the first portion, extending on a lower surface of the covering layer, and in contact with a portion of the first wiring layer exposed from the covering layer; and a second wiring member including a third portion filling the second through-hole and electrically connected to the second electrode and a fourth portion continuous with the third portion, extending on the lower surface of the covering layer, and in contact with a portion of the second wiring layer exposed from the covering layer.

A method of manufacturing a planar light source according to an embodiment includes: providing a wiring substrate, the wiring substrate including an insulating layer defining first through-holes and second through-holes, each of the first through-holes and a corresponding one of the second through-holes separated from each other and a first wiring layer and a second wiring layer that are disposed below the insulating layer and separated from each first through-hole and each second through-hole, respectively, the first wiring layer and the second wiring layer being arranged at two opposite side to each other with respect to each first through-hole and a corresponding second through-hole in a top plan view; disposing a light guide member and light sources above the wiring substrate; and forming a first wiring member to fill the first through-hole, to be disposed below the insulating layer, to be in contact with the first wiring layer, and to be electrically connected to a first electrode of the light source, and a second wiring member to be separated from the first wiring member, to fill the second through-hole, to be disposed below the insulating layer, to be in contact with the second wiring layer, and to be electrically connected to a second electrode of the light source.

According to one embodiment, it is possible to provide a planar light source in which occurrence of connection failure can be prevented in an electrical connection structure between a wiring layer and an electrode of a light source of a wiring substrate, and a method of manufacturing the same.

DETAILED DESCRIPTION

First Embodiment

Figure 1:
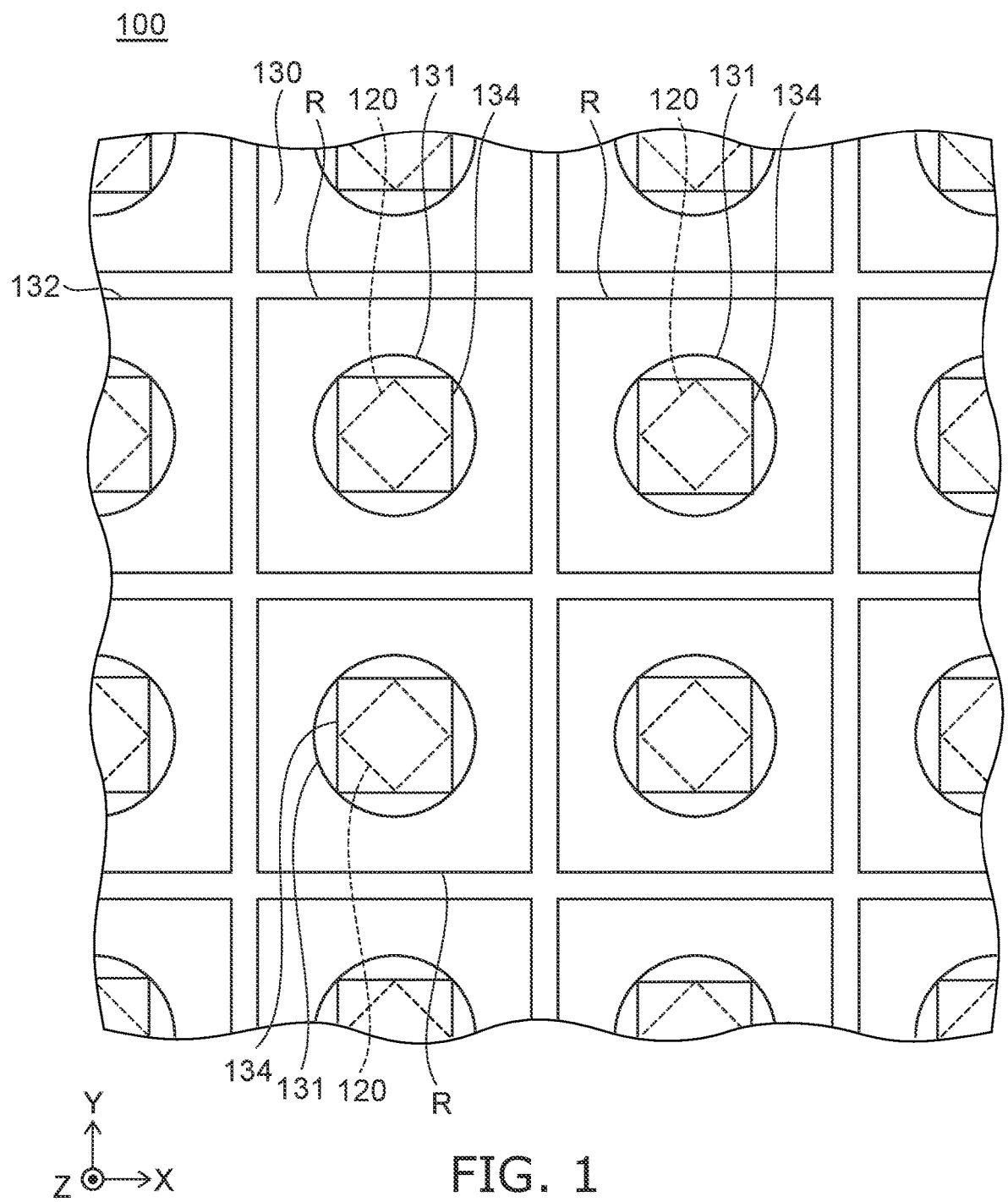
FIG. 1 is a schematic top plan view illustrating a planar light source according to a first embodiment.
Figure 2:
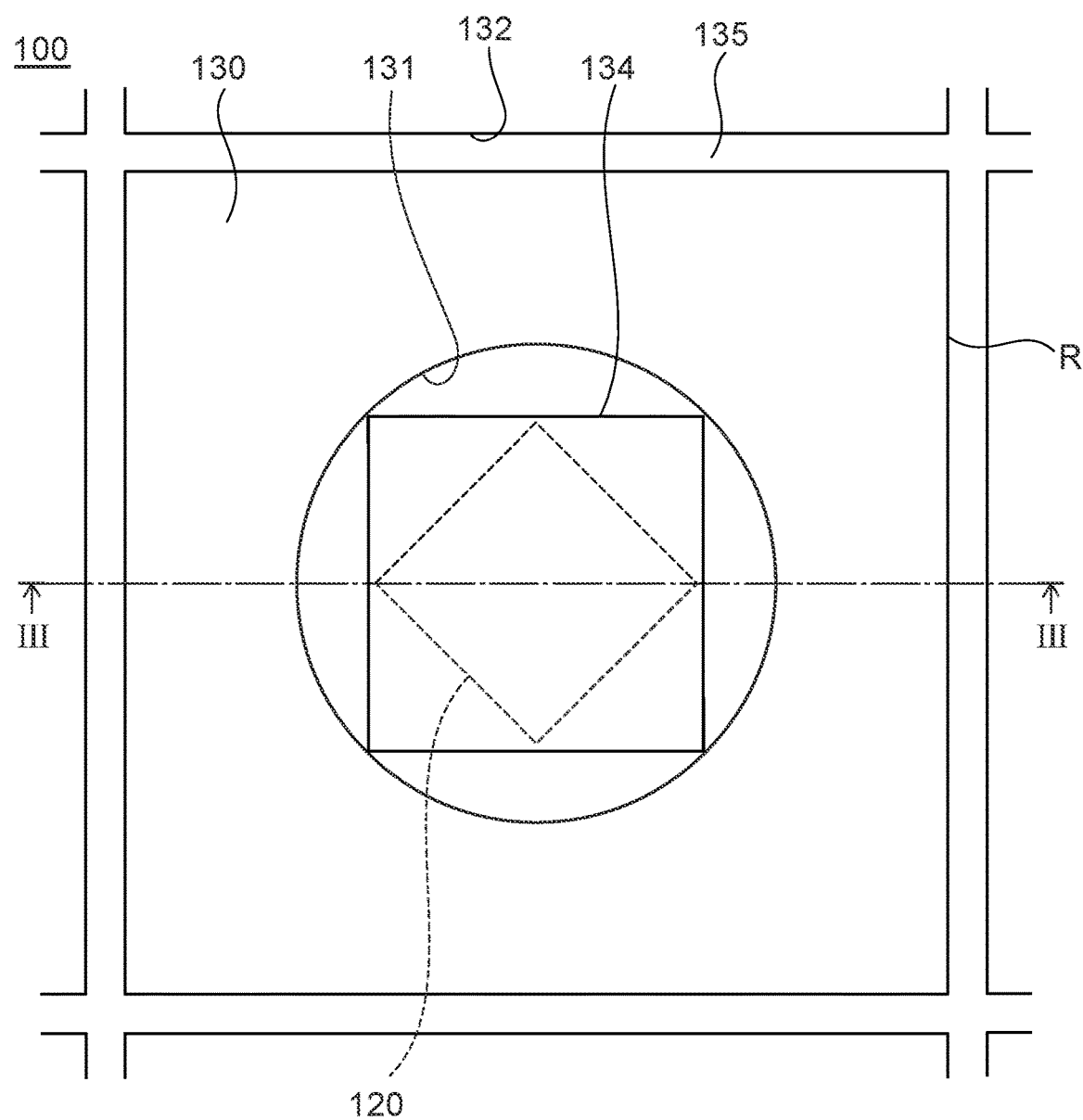
FIG. 2 is an enlarged schematic top plan view illustrating one light-emitting region and a peripheral region thereof in the planar light source.

A first embodiment will be described. FIG. 1 is a schematic top plan view illustrating a planar light source according to the present embodiment. FIG. 2 is an enlarged schematic top plan view illustrating one light-emitting region and a periphery thereof in the planar light source.

Figure 3:
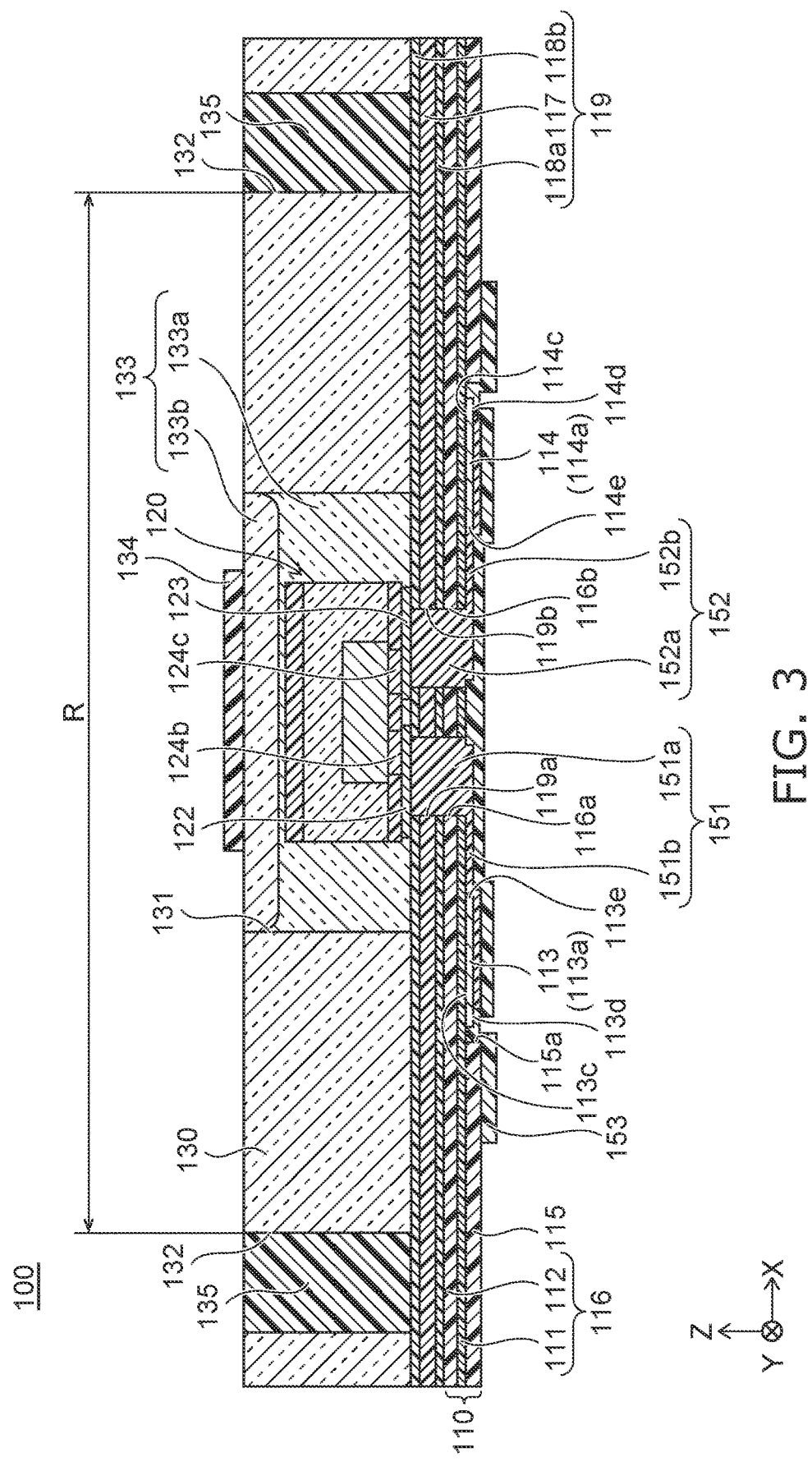
FIG. 3 is a schematic cross-sectional view taken along line in FIG. 2.

FIG. 3 is a schematic cross-sectional view taken along line III-III in FIG. 2. As illustrated in FIG. 3, a planar light source 100 according to the present embodiment includes a wiring substrate 110, light sources 120 disposed above the wiring substrate 110, and a light guide member 130 disposed above the wiring substrate 110 and surrounding a periphery of each of the light sources 120. Components of the planar light source 100 will be described below in detail.

In the description below, an XYZ Cartesian coordinate system will be used. A direction from the wiring substrate 110 toward the light sources 120 will be referred to as a "Z direction." One direction orthogonal to the Z direction will be referred to as an "X direction," and one direction orthogonal to the X direction and the Z direction is referred to as a "Y direction." Further, the "Z direction" is also referred to as an "upward direction," and an opposite direction thereof is referred to as a "downward direction." These expressions are used for convenience, and are independent of a gravity direction. Further, viewing a target member directly from above the target member with the naked eye or, when appropriate, viewing through a target member from above the target member will be referred to as a "top plan view." Further, viewing a target member directly with the naked eye from below the target member or, when appropriate, viewing through a target member from below the target member will be referred to as a "bottom plan view."

Further, in the present embodiment, the light guide member 130 is provided with a plurality of light source arrangement portions 131 in the X direction and the Y direction, as illustrated in FIG. 1. Each light source 120 is disposed in a respective one of the light source arrangement portions 131. Any appropriate number of the light sources can be arrayed as long as the number of the light sources is one or greater. Further, a demarcation groove 132 is provided in the light guide member 130, and demarcates between light-emitting regions R of respective light sources 120 in a top plan view. In the description below, a portion located in one light-emitting region R in a top plan view will mainly be described, but portions located in another light-emitting regions R in a top plan view can also have a similar structure, unless specifically stated otherwise.

As illustrated in FIG. 3, the wiring substrate 110 includes a base layer 111, a first covering layer 112 disposed on the base layer 111, a first wiring layer 113 and a second wiring layer 114 disposed below the base layer 111 and corresponding to a single light source 120, and a second covering layer 115 provided below the base layer 111.

The base layer 111 is composed of an insulating material. Examples of the insulating material constituting the base layer 111 include resin materials such as epoxy resins, silicone resins, liquid crystal polymer, polyimide (PI), polyethylene terephthalate (PET), and polyethylene naphthalate (PEN).

The first covering layer 112 is made of an insulating material. Examples of the insulating material constituting the first covering layer 112 include resin materials such as epoxy resins, silicone resins, liquid crystal polymer, polyimide (PI), polyethylene terephthalate (PET), and polyethylene naphthalate (PEN).

In the present specification, a layer having insulating properties located above the first wiring layer and the second wiring layer in the wiring substrate is referred to as an "insulating layer." Accordingly, in the present embodiment, the base layer 111 and the first covering layer 112 are equivalent to an insulating layer 116. However, the insulating layer may have other configurations. For example, an insulating adhesive layer may be disposed between the base layer and the first covering layer of the wiring substrate. In this case, the base layer, the first covering layer, and the adhesive layer are equivalent to the insulating layer. Further, for example, the first covering layer need not be disposed on the base layer. In this case, only the base layer is equivalent to the insulating layer. Further, the first wiring layer and the second wiring layer may be disposed below the second covering layer. In this case, the first covering layer, the base layer, and the second covering layer are equivalent to the insulating layer. An insulating adhesive layer may be disposed between the first covering layer and the base layer and between the base layer and the second covering layer.

The insulating layer 116 defines a first through-hole 116a and a second through-hole 116b separated from each other. The through-holes 116a, 116b extend through the insulating layer 116 in the Z direction (vertical direction). An inner surface of each of the through-holes 116a, 116b is generally parallel with the Z direction, for example.

Figure 4A:
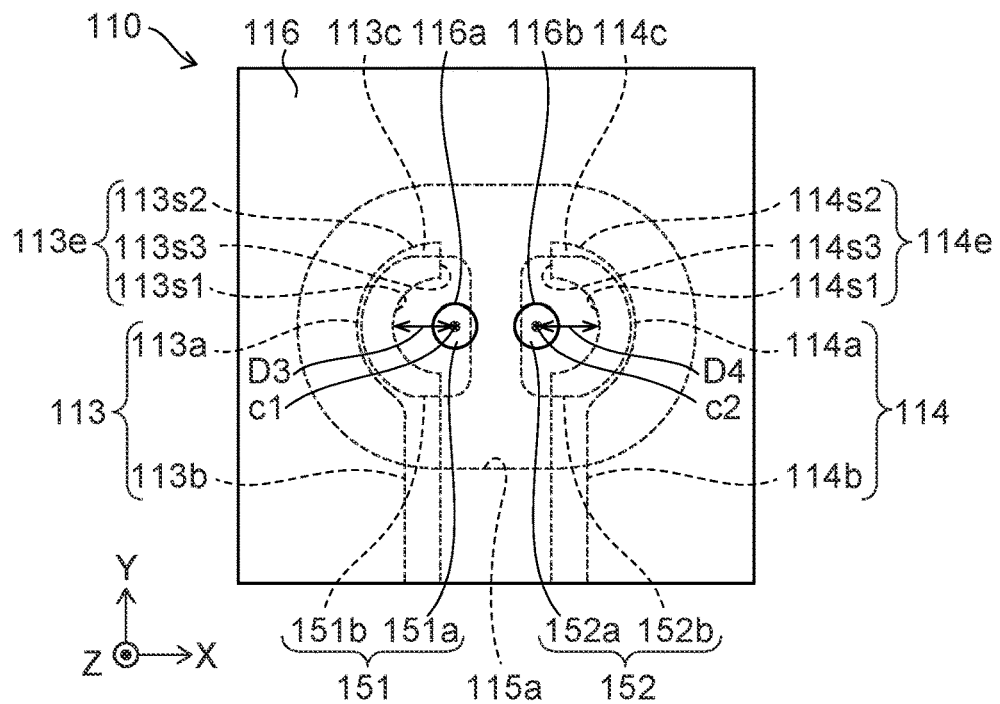
FIG. 4A is an enlarged schematic top plan view illustrating a portion of a wiring substrate.
Figure 4B:
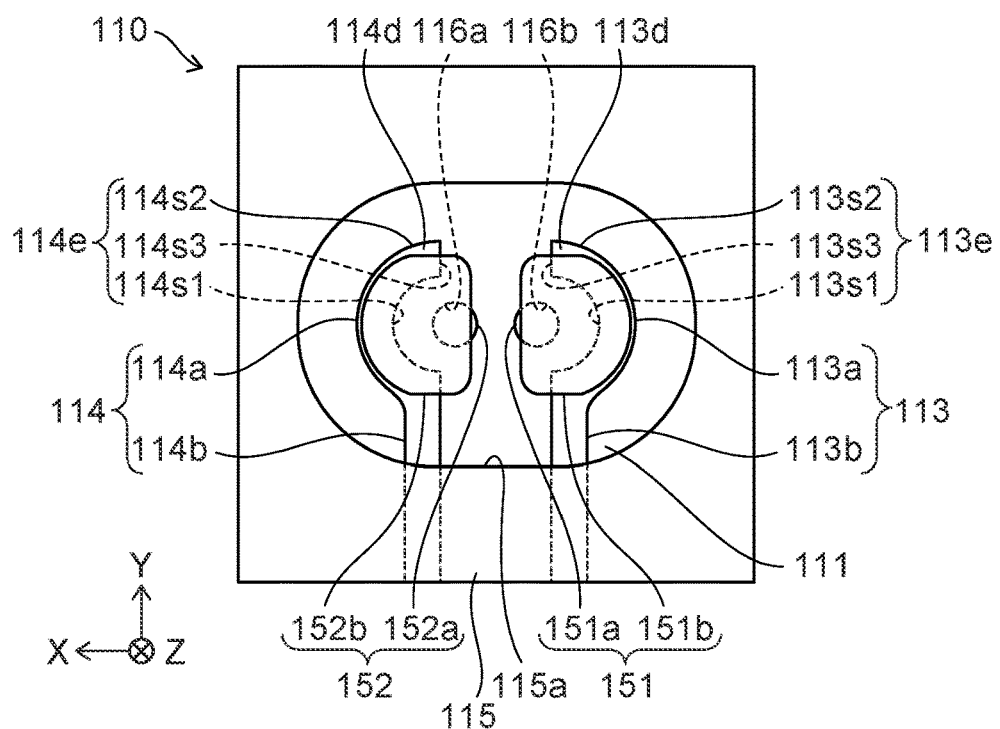
FIG. 4B is an enlarged schematic bottom plan view illustrating a portion of the wiring substrate.

FIG. 4A is an enlarged schematic top plan view illustrating a portion of the wiring substrate. FIG. 4B is an enlarged schematic bottom plan view illustrating a portion of the wiring substrate. As illustrated in FIG. 4A, each of the through-holes 116a, 116b has a circular shape in a top plan view. The through-holes may have other shapes in a top plan view, such as, for example, a polygonal shape such as a quadrangular shape, a polygonal shape with rounded corners, or an elliptic shape. The first through-hole 116a and the second through-hole 116b are arrayed in the X direction. The first through-hole and the second through-hole may be arrayed in the Y direction, or may be arrayed in a direction intersecting the X direction or the Y direction.

Each of the first wiring layer 113 and the second wiring layer 114 is made of a metal material such as copper (Cu). The first wiring layer 113 and the second wiring layer 114 are separated from each other. The first wiring layer 113 and the second wiring layer 114 are separated from the first through-hole 116a and the second through-hole 116b, respectively.

The first wiring layer 113 includes a tip portion 113a located at a light source 120 side, a middle portion 113b connected to the tip portion 113a, and an external connection portion located at a side of the middle portion 113b opposite to a side where the tip portion 113a is located. Similarly, the second wiring layer 114 includes a tip portion 114a located at the light source 120 side, a middle portion 114b connected to the tip portion 114a, and an external connection portion located at a side of the middle portion 114b opposite to a side where the tip portion 114a is located. The planar light source 100 is turned on when power is supplied to the external connection portion.

The wiring substrate 110 may include a protruding region protruding outward from an end portion of the wiring substrate 110 in a plan view, and the external connection portion may be disposed in the protruding region.

The external connection portion may be electrically connected to another member (a substrate including a drive circuit, for example). When the external connection portion is electrically connected to such another member, a connector may be used, or a conductive sheet may be used in view of reduction in thickness.

In a top plan view, the first wiring layer 113 and the second wiring layer 114 are arranged at two opposite sides to each other with respect to the first through-hole 116a and the second through-hole 116b. In the present specification, "in a top plan view, the first wiring layer and the second wiring layer are arranged at two opposite side to each other with respect to the first through-hole and the second through-hole" means that, in a top plan view, the first through-hole and the second through-hole are located between the first wiring layer and the second wiring layer such that the first wiring layer and the second wiring layer are not disposed between the first through-hole and the second through-hole. In the present embodiment, the tip portion 113a of the first wiring layer 113 and the tip portion 114a of the second wiring layer 114 are arranged at two opposite sides to each other with respect to the first through-hole 116a and the second through-hole 116b.

In the present embodiment, the tip portion 113a of the first wiring layer 113 has an arcuate shape in a top plan view. As illustrated in FIG. 3, surfaces of the tip portion 113a include an upper surface 113c in contact with the insulating layer 116, a lower surface 113d located opposite to the upper surface 113c, and a lateral surface 113e located between the upper surface 113c and the lower surface 113d.

The lateral surface 113e is parallel with the Z direction. However, the lateral surface 113e may be curved instead of being parallel with the Z direction. As illustrated in FIG. 4A, the lateral surface 113e includes a first region 113s1 facing the first through-hole 116a, a second region 113s2 located opposite to the first region 113s1, and a third region 113s3 located between the first region 113s1 and the second region 113s2, in a top plan view.

The first region 113s1 is recessed in a direction away from the first through-hole 116a, and has, for example, an arcuate shape in a top plan view. The second region 113s2 has a shape curved in the same direction as that of the first region 113s1 in a top plan view, such as an arcuate shape. The third region 113s3 is in a shape of a straight line parallel with the Y direction in a top plan view. The first region, the second region, and the third region in a top plan view may have shapes other than those described above. For example, the first region and the second region may be in a shape of a straight line parallel with the Y direction, and the third region may be in a shape of a straight line parallel with the X direction.

The tip portion 114a of the second wiring layer 114 has an arcuate shape in a top plan view in the present embodiment. As illustrated in FIG. 3, surfaces of the tip portion 114a include an upper surface 114c in contact with the insulating layer 116, a lower surface 114d located opposite to the upper surface 114c, and a lateral surface 114e located between the upper surface 114c and the lower surface 114d.

The lateral surface 114e is in parallel with the Z direction. However, the lateral surface may be curved instead of being parallel with the Z direction. As illustrated in FIG. 4A, the lateral surface 114e includes a first region 114s1 facing the second through-hole 116b, a second region 114s2 located opposite to the first region 114s1, and a third region 114s3 located between the first region 114s1 and the second region 114s2, in a top plan view.

The first region 114s1 is recessed in a direction away from the second through-hole 116b, and has, for example, an arcuate shape in a top plan view. The second region 114s2 has a shape curved in the same direction as that of the first region 114s1 in a top plan view, such as an arcuate shape. The third region 114s3 is in a shape of a straight line parallel with the Y direction in a top plan view. The first region, the second region, and the third region in a top plan view may have shapes other than those described above. For example, the first region and the second region may be in a shape of a straight line parallel with the Y direction, and the third region may be in a shape of a straight line parallel with the X direction.

Each of the middle portion 113b of the first wiring layer 113 and the middle portion 114b of the second wiring layer 114 extends in the Y direction. The middle portions may extend in other directions than the above, such as the X direction or a direction inclined with respect to the X direction or the Y direction, or the direction in which the middle portion extends may vary. Further, the direction in which the first wiring layer extends may differ from the direction in which the second wiring layer extends.

The second covering layer 115 covers a portion of the lower surface of the base layer 111, as illustrated in FIG. 4B. Further, a through-hole 115a is provided in the second covering layer 115. The through-hole 115a extends through the second covering layer 115 in the Z direction (vertical direction). Another portion of the base layer 111, the tip portion 113a and a portion of the middle portion 113b of the first wiring layer 113, the tip portion 114a and a portion of the middle portion 114b of the second wiring layer 114, a portion of a first wiring member 151 described later, and a portion of a second wiring member 152 are exposed through the through-hole 115a. As illustrated in FIG. 4A, the through-hole 115a has an oval shape in a top plan view. The through-hole in a top plan view may have a shape other than that described above, and may have, for example, a polygonal shape, such as a quadrangular shape, or a circular shape.

The wiring substrate 110 has a thickness of, for example, 50 μm or greater and 250 μm or less. With the thickness of the wiring substrate 110 within the range described above, deformation such as shrinkage or expansion of the insulating layer of the wiring substrate is likely to occur due to change in temperature, humidity, or other environmental changes.

As illustrated in FIG. 3, a light reflective sheet 117 is disposed above the wiring substrate 110. The light reflective sheet 117 is adhered to the wiring substrate 110 by an adhesive sheet 118a. The light reflective sheet 117 reflects a portion of the light emitted from the light source 120. When the light reflective sheet 117 is not disposed, a portion of the light from the light source 120 is absorbed by the base layer 111 of the wiring substrate 110, which may result in deterioration of the base layer 111. With the light reflective sheet 117 is disposed above the wiring substrate 110, light reaching the wiring substrate 110 from the light source 120 can be reduced. This can reduce absorption of light in the base layer 111 of the wiring substrate 110, and thus can reduce degradation of the base layer 111. The light reflective sheet 117 is preferably disposed in a region of an upper surface of the wiring substrate 110 other than the first through-hole 116a and the second through-hole 116b. Thus, the light reflective sheet 117 is disposed below the light source 120, which allows for further reducing light that reaches the wiring substrate 110. Further, light from the light source 120 is reflected at the light reflective sheet 117, so that the light from the light source 120 propagates in the light guide member 130 to a greater distance from the light source 120, which allows for reducing unevenness in brightness in the light-emitting region R. The light reflective sheet 117 can be constituted by a resin sheet including a large number of bubbles (for example, a foamed resin sheet), a resin sheet containing a light-diffusing material, or the like. Examples of the resin used for the light reflective sheet 117 include thermoplastic resins such as acrylic resins, polycarbonate resins, cyclic polyolefin, polyethylene terephthalate (PET), and polyester resins, and thermosetting resins such as epoxy resins and silicone resins. Further, titanium oxide, silica, alumina, zinc oxide, glass, or the like can be used for the light-diffusing material.

A material of the wiring members 151, 152 is a material including a thermosetting material as a main component, and a main component of the light reflective sheet 117 may be a thermoplastic resin. When using such a resin, a melting point of the light reflective sheet 117 is preferably higher than a curing temperature of the wiring members 151, 152. Thus, even when reaching the temperature at which each of the wiring members 151, 152 is cured, the light reflective sheet 117 does not melt, so that decrease in a light reflectivity of the light reflective sheet 117 can be reduced. When the main component of the wiring member is an epoxy resin, the curing temperature of the wiring member is in a range of approximately 120° C. to 130° C. Further, when the main component of the light reflective sheet 117 is polyethylene terephthalate, the melting point of the light reflective sheet is approximately 220° C.

The light guide member 130 is disposed above the light reflective sheet 117. The light guide member 130 is adhered to the light reflective sheet 117 by an adhesive sheet 118b. A structure constituted of the light reflective sheet 117 and the two adhesive sheets 118a, 118b is referred to as a "sheet layered body 119."

The sheet layered body 119 exposes the first through-hole 116a and the second through-hole 116b while covering the upper surface of the wiring substrate 110. More specifically, the sheet layered body 119 defines a third through-hole 119a located directly above the first through-hole 116a, and a fourth through-hole 119b located directly above the second through-hole 116b.

In a top plan view, the third through-hole 119a has the same shape as that of the first through-hole 116a, such as a circular shape. An inner surface defining the third through-hole 119a is, for example, flush with the inner surface of the first through-hole 116a and is generally parallel with the Z direction. A shape of the fourth through-hole 119b in a top plan view is the same shape as that of the second through-hole 116b, and is, for example, circular. An inner surface of the fourth through-hole 119b is, for example, flush with the inner surface of the second through-hole 116b and generally parallel with the Z direction. That is, a single through-hole having a substantially cylindrical shape is formed by the first through-hole 116a and the third through-hole 119a, and a single through-hole having a substantially cylindrical shape is formed by the second through-hole 116b and the fourth through-hole 119b.

Other configuration than that described above may be employed for the sheet layered body. For example, in the sheet layered body, instead of defining two through-holes corresponding to the first through-hole and the second through-hole as described above, a single through-hole may be defined directly over the first through-hole and the second through-hole to expose both the first through-hole and the second through-hole through the single through-hole. Further, the planar light source need not include a sheet layered body.

Figure 5A:
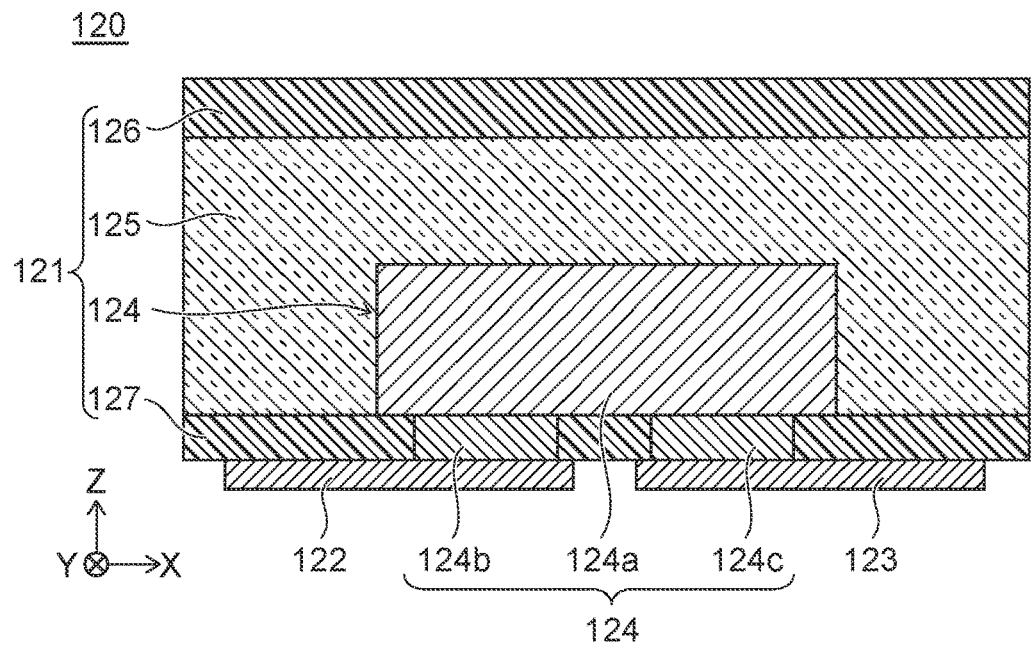
FIG. 5A is an enlarged schematic cross-sectional view illustrating a light source in FIG. 3.
Figure 5B:
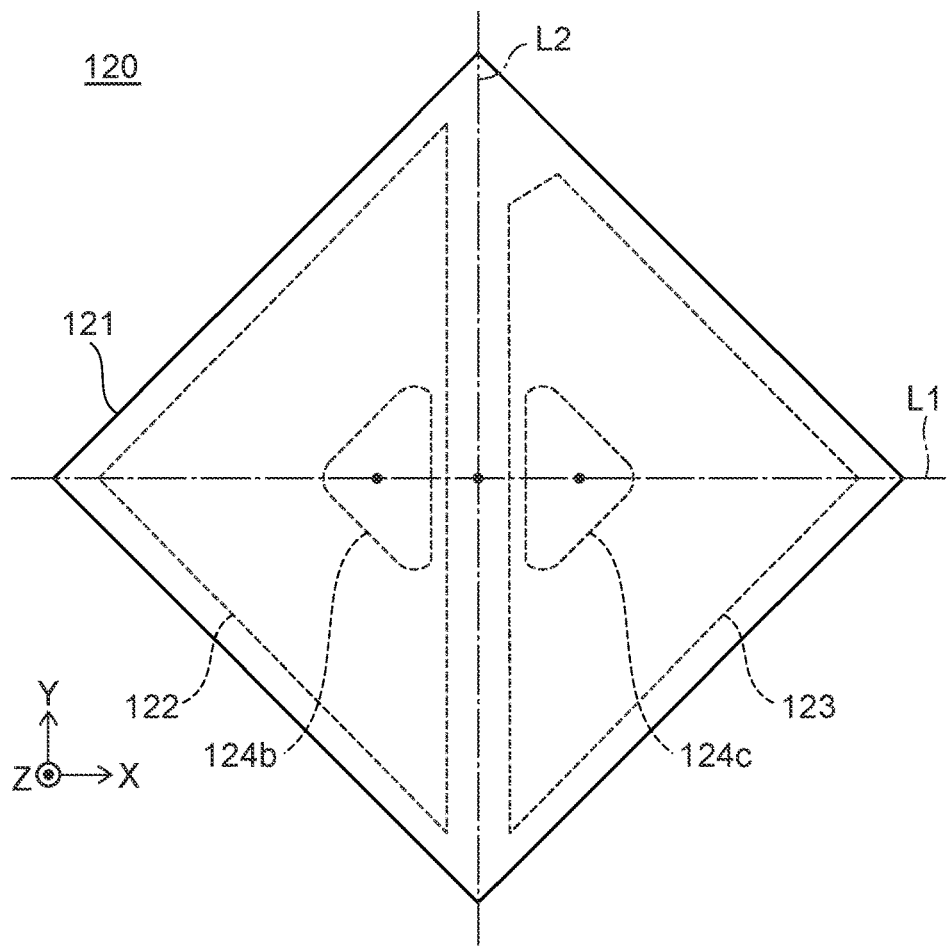
FIG. 5B is an enlarged schematic top plan view illustrating the light source in FIG. 3.
Figure 6:
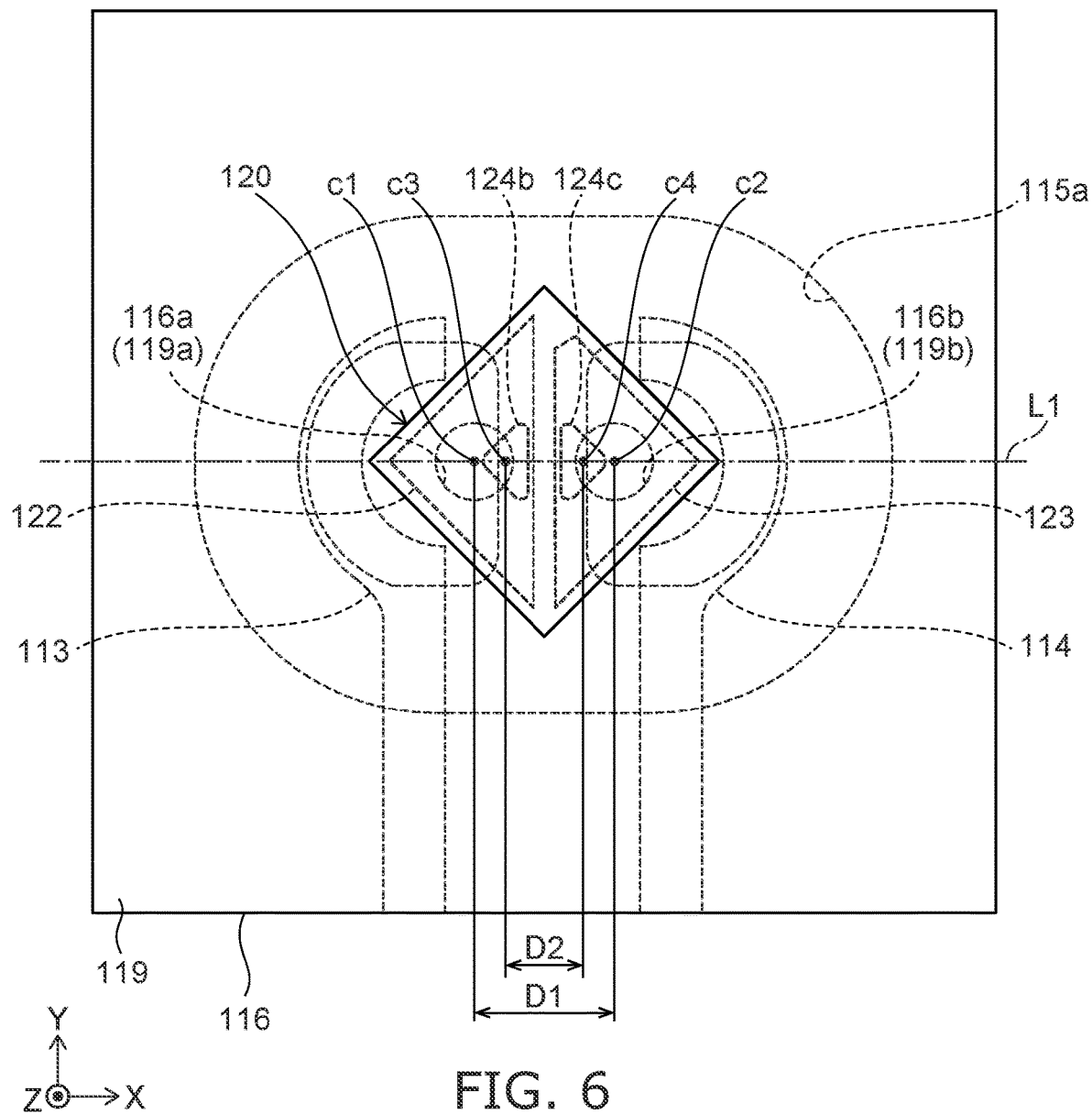
FIG. 6 is an enlarged schematic top plan view illustrating a portion of the wiring substrate, a portion of a sheet layered body, and the light source.

FIG. 5A is an enlarged schematic cross-sectional view illustrating the light source in FIG. 3. FIG. 5B is an enlarged schematic top plan view illustrating the light source in FIG. 3. FIG. 6 is an enlarged schematic top plan view illustrating a portion of the wiring substrate, a portion of the sheet layered body, and the light source. As illustrated in FIG. 5A, the light source 120 includes a light-emitting element 124, a light-transmissive member 125, a first light adjustment member 126, a covering member 127, a first terminal 122, and a second terminal 123.

The light-emitting element 124 includes a light-emitting portion 124a, and a first electrode 124b and a second electrode 124c disposed below the light-emitting portion 124a and separated from each other.

The light-emitting portion 124a includes, for example, a semiconductor growth substrate and a semiconductor layered structure disposed below the semiconductor growth substrate. The semiconductor layered structure can be configured to emit visible light or ultraviolet light, using an appropriate composition in accordance with a desired peak emission wavelength. The semiconductor layered structure includes, for example, an $In_xAl_yGa_{1-x-y}N$ ($0 \le x$, $0 \le y$, $x+y \le 1$) layer, and blue light is emitted from the light-emitting portion 124a. The light-emitting portion may be configured to emit light of a color other than blue.

The semiconductor layered structure includes an n-type semiconductor layer, a p-type semiconductor layer, and an emission layer disposed between the n-type semiconductor layer and the p-type semiconductor layer. The emission layer may have a double heterojunction or single quantum well (SQW) structure, or may have structure including a group of active layers such as a multiple quantum well structure.

The semiconductor layered structure may have a structure including one or more emission layers disposed between the n-type semiconductor layer and the p-type semiconductor layer, or a structure in which an n-type semiconductor layer, an emission layer, and a p-type semiconductor layer that are disposed in this order are repeated a plurality of times. In the case in which the semiconductor layered structure includes a plurality of emission layers, the emission layers may have the same peak emission wavelength or different peak emission wavelengths. The expression "the same peak emission wavelength" as used herein includes cases in which the peak emission wavelengths vary by about a few nanometers. Combination of peak emission wavelengths of a plurality of emission layers can be appropriately selected. In the case in which the semiconductor layered structure includes two emission layers, for example, a combination of emission layers configured to emit blue light and blue light, green light and green light, red light and red light, UV light and UV light, blue light and green light, blue light and red light, green light and red light, or the like can be selected. Each emission layer may include a plurality of active layers having different peak emission wavelengths, or a plurality of active layers having the same peak emission wavelength.

The first electrode 124b and the second electrode 124c are arrayed in the X direction. As illustrated in FIG. 5B, each of the electrodes 124b, 124c has a substantially triangular shape with rounded corners in a top plan view. The electrodes may have other shapes in a top plan view, for example, another polygonal shape (such as a quadrangular shape), a circular shape, or an elliptic shape.

As illustrated in FIG. 6, in a top plan view, a distance D1 between a center c1 of the first through-hole 116a and a center c2 of the second through-hole 116b is greater than a distance D2 between a center c3 of the first electrode 124b and a center c4 of the second electrode 124c (D1>D2). The distance between the center of the first through-hole and the center of the second through-hole may be equal to the distance between the center of the first electrode and the center of the second electrode. When the first electrode 124b has a triangular shape, the center c3 of the first electrode 124b is the intersection of three lines each connecting a respective vertex of the triangular shape and midpoints of a side opposite to the respective vertex. The same applies to the center c4 of the second electrode 124c.

As illustrated in FIG. 5A, the light-transmissive member 125 covers an upper surface and lateral surfaces of the light-emitting portion 124a. The light-transmissive member 125 is light-transmissive with respect to light emitted from the light-emitting portion 124a. The light-transmissive member 125 includes a base material made of a light-transmissive material and a plurality of wavelength conversion particles dispersed in the base material. Examples of a material used for the base material include silicone, epoxy, and glass. Examples of the wavelength conversion particles include a phosphor. Examples of the phosphor include yttrium aluminum garnet-based phosphors (e.g., $Y_3(Al,Ga)_5O_{12}$:Ce), lutetium aluminum garnet-based phosphors (e.g., $Lu_3(Al,Ga)_5O_{12}$:Ce), terbium aluminum garnet-based phosphors (e.g., $Tb_3(Al,Ga)_5O_{12}$:Ce), CCA-based phosphors (e.g., $Ca_{10}(PO_4)_6C_{12}$:Eu), SAE-based phosphors (e.g., $Sr_4Al_{14}O_{25}$:Eu), chlorosilicate-based phosphors (e.g., $Ca_8MgSi_4O_{16}C_{12}$:Eu), β-SiAlON-based phosphors (e.g., $(Si,Al)_3(O,N)_4$:Eu), α-SiAlON-based phosphors (e.g., $Mz(Si,Al)_{12}(O,N)_{16}$:Eu (0<z≤2, M is Li, Mg, Ca, Y, or lanthanide elements other than La and Ce), SLA-based phosphors (e.g., $SrLiAl_3N_4$:Eu), nitride-based phosphors such as CASN-based phosphors (e.g., $CaAlSiN_3$:Eu) or SCASN-based phosphors (e.g., $(Sr,Ca)AlSiN_3$:Eu), fluoride-based phosphors such as KSF-based phosphors ($K_2SiF_6$:Mn), KSAF-based phosphors (e.g., $K_2(Si,Al)F_6$: Mn), or MGF-based phosphors ($3.5MgO.0.5MgF_2.GeO_2$: Mn), phosphors having a perovskite structure (e.g., $CsPb(F, Cl,Br,I)_3$), quantum dot phosphors (e.g., CdSe, InP, $AgInS_2$, or $AgInSe_2$), and the like can be used. The light-transmissive member 125 may include a plurality of types of phosphors.

Alternatively, a wavelength conversion sheet containing any of these phosphors described above may be disposed on the planar light source. A wavelength conversion sheet absorbs a portion of blue light from the light source 120, and emits yellow light, green light and/or red light to obtain a planar light source that outputs white light. For example, white light can be obtained by combining a blue light emitting light source and a wavelength conversion sheet containing a yellow-emitting phosphor. A blue light emitting light source may be combined with a wavelength conversion sheet containing a red-emitting phosphor and a green-emitting phosphor. A blue light emitting light source may be combined with a plurality of wavelength conversion sheets. For the plurality of wavelength conversion sheets, for example, a wavelength conversion sheet containing a red-emitting phosphor and a wavelength conversion sheet containing a green-emitting phosphor can be selected. Alternatively, a light source including a blue light emitting element and a light transmissive member containing a red-emitting phosphor may be combined with a wavelength conversion sheet containing a green-emitting phosphor.

The light source 120 emits mixed light in which light emitted from the wavelength conversion particles within the light-transmissive member 125 and light emitted from the light-emitting portion 124a are mixed. A color of the mixed color light is white, for example. The light-transmissive member need not be provided with wavelength conversion particles. In this case, the light source may emit only the blue light emitted from the light-emitting portion.

The first light adjustment member 126 covers an upper surface of the light-transmissive member 125. The first light adjustment member 126 reflects a portion of the light emitted from the light-emitting portion 124a and transmits the other portion of the light emitted from the light-emitting portion 124a. The first light adjustment member 126 is, for example, a resin containing a light reflective material. More specifically, a resin such as a silicone or epoxy containing titanium oxide as the light reflective material can be used for the first light adjustment member 126.

The covering member 127 covers a lower surface of the light-transmissive member 125 and a lower surface of the light-emitting portion 124a. The covering member 127 is, for example, a resin containing a light reflective material. More specifically, a resin such as a silicone or epoxy including titanium oxide as the light reflective material can be used for the covering member 127.

The first terminal 122 and the second terminal 123 are made of a metal material such as copper (Cu). As illustrated in FIG. 5A, the first terminal 122 is in contact with a lower end of the first electrode 124b. The second terminal 123 is in contact with a lower end of the second electrode 124c. The first terminal 122 and the second terminal 123 are separated from each other.

Hereinafter, a portion of the light source 120 other than the two terminals 122, 123 (the light-emitting element 124, the light-transmissive member 125, the first light adjustment member 126, and the covering member 127) will be referred to as a "main body portion 121."

The main body portion 121 has, for example, a quadrangular shape in a top plan view, as illustrated in FIG. 5B. The main body portion 121 is disposed such that one diagonal line L1 of the main body portion 121 is parallel with the X direction and the other diagonal line L2 of the main body portion 121 is parallel with the Y direction. That is, the main body portion 121 is disposed with four sides forming an outer periphery in a top plan view inclined 45 degrees with respect to the X direction and the Y direction.

The two electrodes 124b, 124c are generally symmetrical with respect to the diagonal line L2 in a top plan view. As illustrated in FIG. 6, the two electrodes 124b, 124c and the two terminals 122, 123 are located on the diagonal line L1. In a top plan view, the main body portion 121 has the largest dimension on the diagonal line L1 is that. Therefore, in a case in which the two terminals 122, 123 are disposed on the diagonal line L1, the two terminals 122, 123 can be prevented from being located in close proximity to each other, even when an area of the light-emitting element 124 in a top plan view is small. The two through-holes 116a, 116b of the wiring substrate 110 are provided in correspondence with the locations of the two terminals 122, 123, respectively. Therefore, preventing the two terminals 122, 123 from being arranged in a close proximity to each other allows for preventing the two through-holes 116a, 116b from being located in a close proximity to each other. This allows for preventing a short-circuiting caused by an electrical connection between a p-type semiconductor layer and an n-type semiconductor layer in the light-emitting element 124. However, the main body portion may be disposed with the diagonal lines inclined with respect to the X direction and the Y direction in a top plan view. Further, the main body portion of the light source may have a shape in a top plan view other than those described above, for example, a polygonal shape other than a quadrangular shape (such as a pentagonal shape), or a circular shape. Further, the two electrodes may be located at other positions than those described above.

In a top plan view, a portion of the first electrode 124b overlaps the first through-hole 116a in the present embodiment. Thus, a distance between the first electrode 124b and the first wiring member 151 described later can be shortened, and a resistance between the first electrode 124b and the first wiring member 151 can be reduced. The same applies to the second electrode 124c. Each of the electrodes may cover the entire region of the corresponding through-hole in a top plan view. Moreover, each of the electrodes need not overlap a corresponding through-hole in a top plan view.

The first terminal 122 has a triangular shape in a top plan view, as illustrated in FIG. 5B. Thus, a connection area between the first terminal 122 and the first wiring member 151 described below can be increased. In a top plan view, the second terminal 123 has a triangular shape with a recess, the triangular shape substantially symmetrical to a triangular shape of the first terminal 122 with respect to the diagonal line L2. This allows for facilitating distinguishing between the positive electrode and the negative electrode. However, each terminal may have a shape other than that described above, and may have, for example, another polygonal shape such as a quadrangular shape, a polygonal shape with rounded corners, a circular shape, or an elliptic shape. Further, the first terminal and the second terminal may have the same shape.

An area of the first terminal 122 in a top plan view is larger than an area of the first electrode 124b. Similarly, in a top plan view, an area of the second terminal 123 is larger than an area of the second electrode 124c. However, in a top plan view, the area of the first terminal may be equal to the area of the first electrode, and the area of the second terminal may be equal to the area of the second electrode.

As illustrated in FIG. 6, in a top plan view, the first terminal 122 covers the first through-hole 116a, and the second terminal 123 covers the second through-hole 116b. More specifically, as illustrated in FIG. 3, the first terminal 122 blocks an upper side opening of the third through-hole 119a located directly above the first through-hole 116a, and the second terminal 123 blocks an upper side opening of the fourth through-hole 119b located directly above the second through-hole 116b. However, when the sheet layered body is not provided on the planar light source, the first terminal may block the upper side opening of the first through-hole, and the second terminal may block the upper side opening of the second through-hole.

Other configurations may be alternatively employed for the light source. For example, the light source need not be provided with a terminal. When the light source is not provided with the first terminal and the second terminal, the first electrode is electrically connected to the first wiring member, and the second electrode is electrically connected to the second wiring member. Further, two or more light-emitting elements may be included in the light source. In this case, the electrodes on the positive electrode side of each light-emitting element may be electrically connected to the same wiring layer of the wiring substrate, or may be electrically connected to wiring layers different from each other. The same applies to the electrodes on the negative electrode side of each light-emitting element. Further, the light source may be constituted by a light-emitting element only.

The first wiring layer 113 and the first electrode 124b are electrically connected together by the first terminal 122 and the first wiring member 151. The second wiring layer 114 and the second electrode 124c are electrically connected together by the second terminal 123 and the second wiring member 152.

In the present embodiment, each of the wiring members 151, 152 includes a base material composed of a resin material, and at least one type of metal particle provided in the base material. A plurality of the metal particles are in contact with each other in the base material, and the terminals 122, 123 and the wiring layers 113, 114 are electrically connected, respectively. The resin materials used in each of the wiring members 151, 152 are the same in the present embodiment, and examples thereof include a thermosetting resin such as epoxy. The metal particles used in each of the wiring members 151, 152 are, in the present embodiment, composed of a core made of a first metal material such as copper (Cu), and a covering layer made of a second metal material such as gold (Au) and covering the core. The metal particles used in each wiring member may be made of only one type of metal material such as copper (Cu), silver (Ag), or gold (Au), or may be made of two or more types of metal particles.

The first wiring member 151 includes a first portion 151a and a second portion 151b. The first portion 151a fills the first through-hole 116a and the third through-hole 119a. In the present specification, the expression "fills the through-hole" does not mean that the through-hole is completely filled, but that the through-hole is substantially filled, and this expression encompasses a case in which, for example, a gap is present in the through-hole. The first portion 151a has a shape corresponding to the shape of the first through-hole 116a and the third through-hole 119a, such as a substantially cylindrical shape.

An upper end of the first portion 151a is in contact with a lower end of the first terminal 122, and the first portion 151a is electrically connected to the first electrode 124b via the first terminal 122. As described above, the expression that two members are "electrically connected" in the present specification means either that the two members are directly connected and electricity is conducted between the two members, or that the two members are indirectly connected with another member having conductivity interposed therebetween and electricity is conducted between the two members.

The second portion 151b is a thin film-shaped portion of the first wiring member 151 located below a lower side opening of the first through-hole 116a. The second portion 151b is continuous with the first portion 151a, located below the insulating layer 116, and in contact with the first wiring layer 113. As illustrated in FIG. 4B, the second portion 151b covers a portion of the lower side opening of the first through-hole 116a and a portion of the lower surface 113d of the tip portion 113a of the first wiring layer 113. More specifically, the second portion 151b exposes a region of the lower side opening of the first through-hole 116a located at the second through-hole 116b side in the X direction. The second portion may cover the entire region of the lower side opening of the first through-hole.

Similarly, as illustrated in FIG. 3, the second wiring member 152 includes a third portion 152a and a fourth portion 152b.

The third portion 152a fills the second through-hole 116b and the fourth through-hole 119b. The third portion 152a has a shape corresponding to the shape of the second through-hole 116b and the fourth through-hole 119b, and has, for example, a substantially cylindrical shape. An upper end of the third portion 152a is in contact with a lower end of the second terminal 123, and the third portion 152a is electrically connected to the second electrode 124c via the second terminal 123.

The fourth portion 152b is a thin film-shaped portion of the second wiring member 152 located below a lower side opening of the second through-hole 116b. The fourth portion 152b is continuous with the third portion 152a, located below the insulating layer 116, and in contact with the second wiring layer 114. As illustrated in FIG. 4B, the fourth portion 152b covers a portion of the lower side opening of the second through-hole 116b and a portion of the lower surface 114d of the tip portion 114a of the second wiring layer 114. More specifically, the fourth portion 152b exposes a region of the lower side opening of the second through-hole 116b located at the first through-hole 116a side in the X direction. Thus, contact between the second portion 151b and the fourth portion 152b can be suppressed. However, the fourth portion may cover the entire region of the lower side opening of the second through-hole.

As illustrated in FIG. 3, a lower surface of the first wiring member 151 and a lower surface of the second wiring member 152 are covered by the covering layer 153. More specifically, the covering layer 153 covers the through-hole 115a of the second covering layer 115. Thus, the covering layer 153 covers a portion of the first wiring layer 113, a portion of the second wiring layer 114, a portion of the first wiring member 151, and a portion of the second wiring member 152 that are exposed from the second covering layer 115. The covering layer 153 is made of an insulating material. Examples of the insulating material used for the covering layer 153 include a resin material such as polyimide (PI), polyethylene terephthalate (PET), and polyethylene naphthalate (PEN).

The light guide member 130 is light transmissive with respect to the light emitted from the light source 120. Further, as a material of the light guide member 130, a thermoplastic resin such as acrylic, polycarbonate, cyclic polyolefin, polyethylene terephthalate (PET), or polyester, a thermosetting resin such as epoxy or silicone, or glass can be used, for example.

The light guide member 130 is constituted by a plate-like member. However, the light guide member may be constituted by one or more light-transmissive layers instead of a plate-like member. In a case in which the light guide member is constituted by a plurality of light-transmissive layers, adjacent light-transmissive layers may be bonded by a light-transmissive adhesive sheet. As a material of the light-transmissive adhesive sheet, preferably the same material as that of the light-transmissive layers is used, which allows for reducing occurrence of an interface between the light-transmissive layer and the adhesive sheet.

Each light source arrangement portion 131 provided in the light guide member 130 is a through-hole extending through the light guide member 130 in the Z direction (vertical direction). As illustrated in FIG. 2, the light source arrangement portion 131 has a circular shape in a top plan view. However, the light source arrangement portion may have a shape in a top plan view other than that described above, for example, a polygonal shape such as a quadrangular shape, a polygonal shape with rounded corners, or an elliptic shape. Alternatively, the light source arrangement portion may be a recessed portion provided in a lower surface of the light guide member.

As illustrated in FIG. 3, a light-transmissive member 133 is disposed in the light source arrangement portion 131. In the present embodiment, the light-transmissive member 133 has a two-layer structure and includes a first layer 133a disposed in a gap between the light source 120 and lateral surfaces of the light source arrangement portion 131, and a second layer 133b disposed on the first layer 133a. The light-transmissive member may have a single layer structure or may have a structure of three or more layers.

The first layer 133a seals the light source 120 in the present embodiment. The first layer may be disposed only in the gap between the light source and the lateral surfaces of the light source arrangement portion without sealing the light source. An upper surface of the first layer 133a is located below an upper surface of the light guide member 130. The upper surface of the first layer 133a is curved in a recessed shape in a downward direction. The upper surface of the first layer may be a flat surface parallel with the X direction and the Y direction.

An upper surface of the second layer 133b is a flat surface parallel with the X direction and the Y direction, and is substantially flush with the upper surface of the light guide member 130. The upper surface of the second layer may be curved in a recessed shape in the downward direction, or may be located below the upper surface of the light guide member.

The first layer 133a and the second layer 133b are light-transmissive with respect to the light emitted from the light source 120. The first layer 133a and the second layer 133b include a light-transmissive material. Further, for the light-transmissive material of the first layer 133a and the second layer 133b, a thermoplastic resin such as acrylic, polycarbonate, cyclic polyolefin, polyethylene terephthalate (PET), or polyester, or a thermosetting resin such as epoxy or silicone can be used, for example. The second layer 133b may further contain wavelength conversion particles. The light-transmissive member need not be provided in the light source arrangement portion, and an air layer may be formed within the light source arrangement portion.

A second light adjustment member 134 is disposed on the light-transmissive member 133. As illustrated in FIG. 2, the second light adjustment member 134 covers the light source 120 and exposes a portion of the light source arrangement portion 131 in a top plan view. The second light adjustment member may cover the entire region of the light source arrangement portion in a top plan view. The second light adjustment member 134 reflects a portion of the light emitted from the light source 120 and transmits the other portion of the light emitted from the light source 120. The second light adjustment member 134 is, for example, a resin that includes a light reflective material. More specifically, a resin such as a silicone or epoxy including titanium oxide as the light reflective material can be used for the second light adjustment member 134. As illustrated in FIG. 2, a shape of the second light arrangement member 134 in a top plan view is quadrangular. However, the shape of the second light adjustment member in a top plan view is not limited to the above, and may be, for example, circular.

As illustrated in FIG. 1, the demarcation groove 132 provided in the light guide member 130 has a lattice shape extending in the X direction and the Y direction. The shape of the demarcation groove is not limited to a lattice shape, and it is sufficient that the light-emitting regions are optically demarcated to a sufficient degree for practical use. For example, a demarcation groove need not be provided at intersecting portions of the lattice.

As illustrated in FIG. 3, the demarcation groove 132 extends through the light guide member 130 in the Z direction (vertical direction). Lateral surfaces of the demarcation groove 132 are parallel with the Z direction. The demarcation groove may have other structure than that described above. For example, the lateral surfaces of the demarcation groove may be inclined with respect to the Z direction or may be curved. Further, the demarcation groove may be a recessed portion defined in the upper surface of the light guide member, may be a recessed portion defined in the lower surface of the light guide member, or may be a hollow shape that does not reach the upper surface or the lower surface of the light guide member. Further, a portion of the demarcation groove may be closed. Further, the demarcation groove may be defined not only in the light guide member but also in the sheet layered body.

A demarcation member 135 is disposed in the demarcation groove 132. The demarcation member 135 is, for example, a resin including a light reflective material. Specifically, a resin such as a silicone or epoxy including titanium oxide as the light reflective material can be used for the demarcation member 135.

The demarcation groove 132 is filled with the demarcation member 135, and an upper surface of the demarcation member 135 is coplanar with the upper surface of the light guide member 130. The demarcation member may have other structure than that described above. For example, the demarcation member may be formed into a layer along an inner surface of the demarcation groove, or an upper portion of the demarcation member may protrude above the upper surface of the light guide member. Further, a demarcation member need not be disposed in the demarcation groove, and the inner portion of the demarcation groove may be an air layer.

Figure 7:
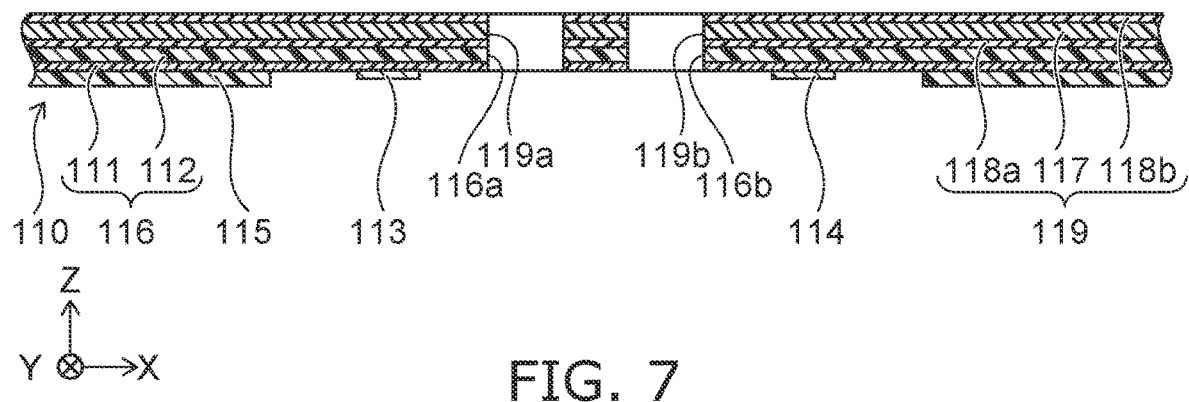
FIG. 7 is a schematic cross-sectional view illustrating a method of manufacturing the planar light source.
Figure 8A:
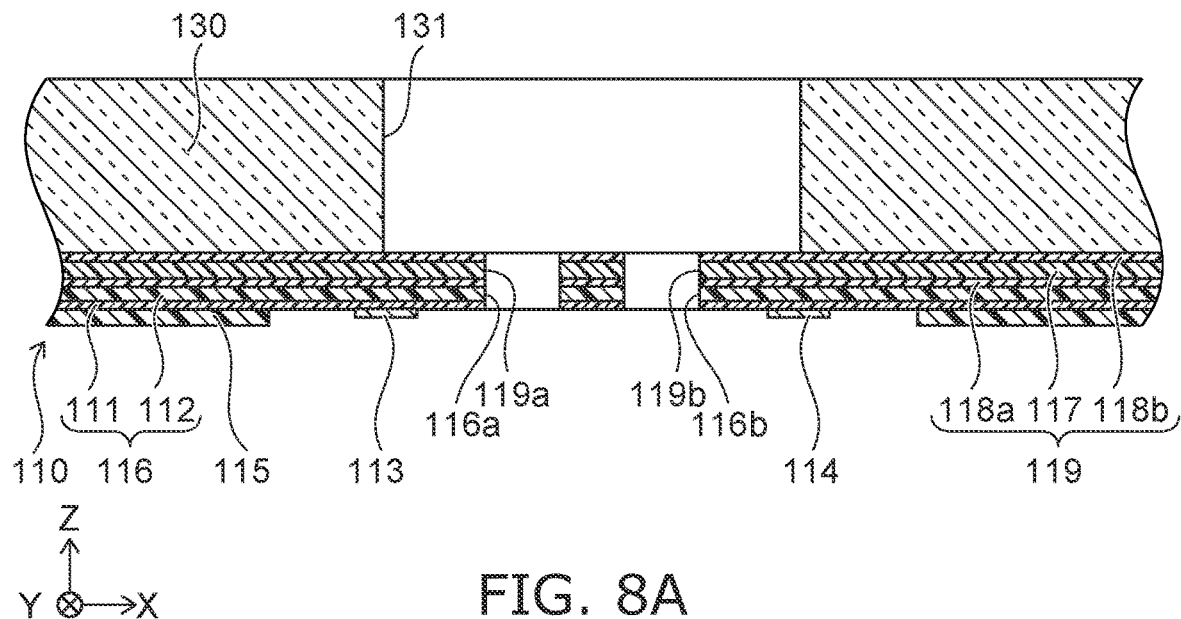
FIG. 8A is a schematic cross-sectional view illustrating the method of manufacturing the planar light source.
Figure 8B:
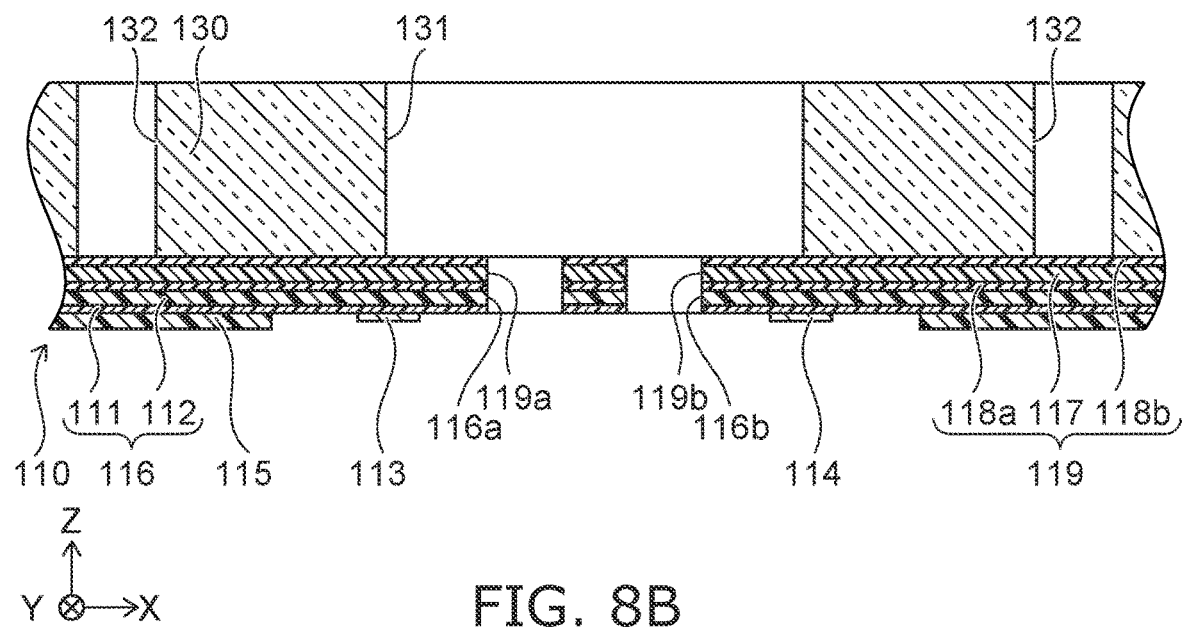
FIG. 8B is a schematic cross-sectional view illustrating the method of manufacturing the planar light source.
Figure 9:
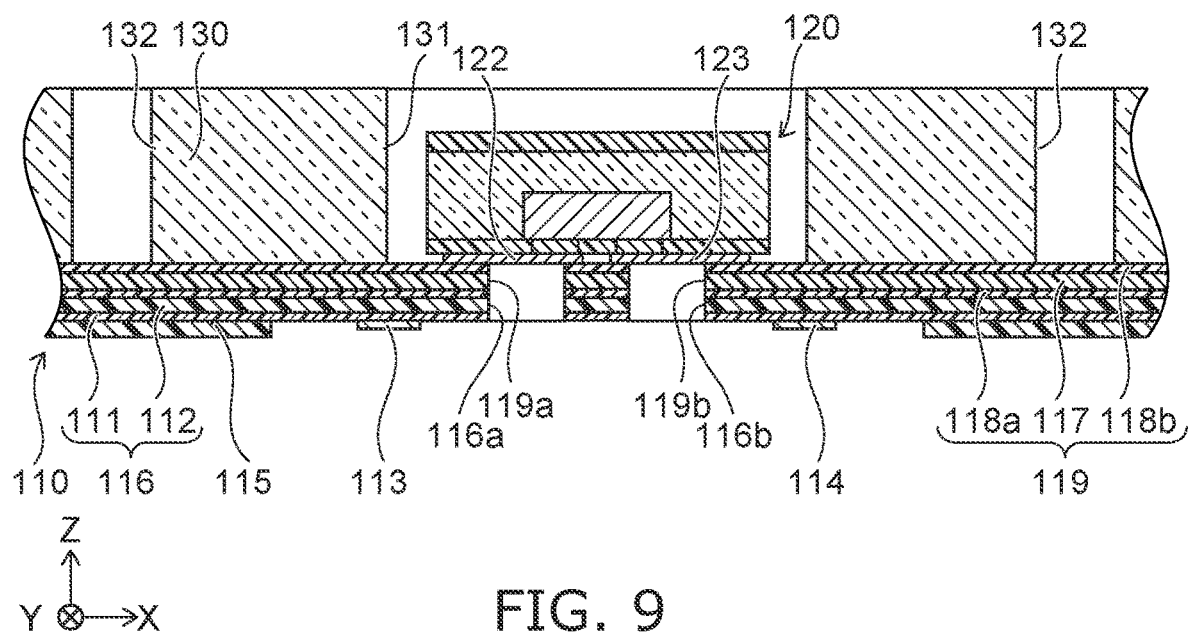
FIG. 9 is a schematic cross-sectional view illustrating the method of manufacturing the planar light source.
Figure 10A:
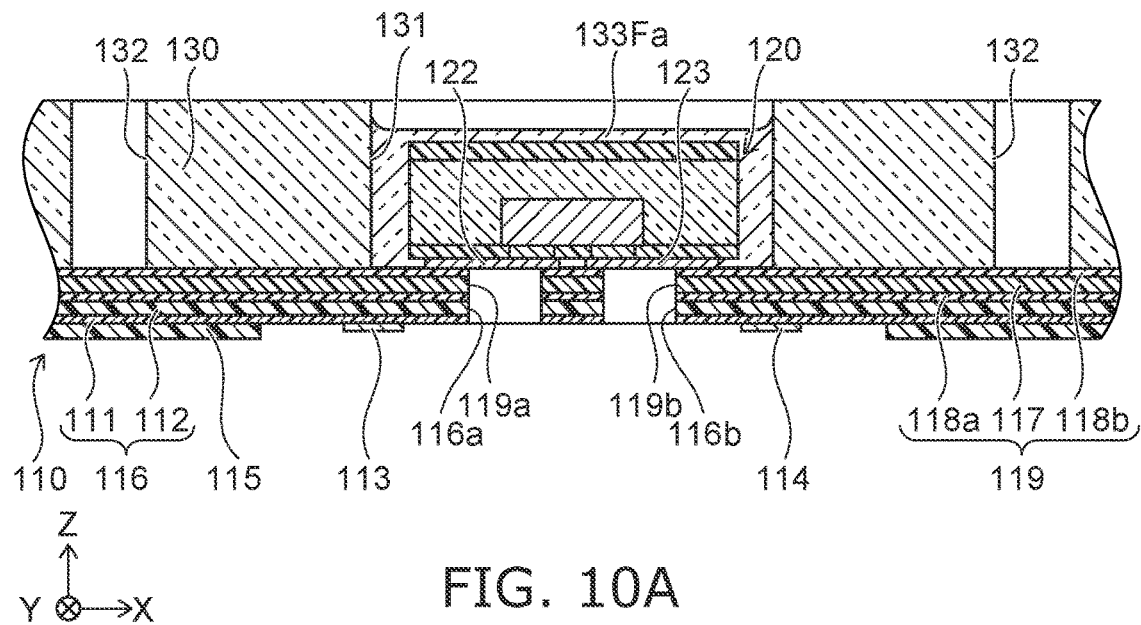
FIG. 10A is a schematic cross-sectional view illustrating the method of manufacturing the planar light source.
Figure 10B:
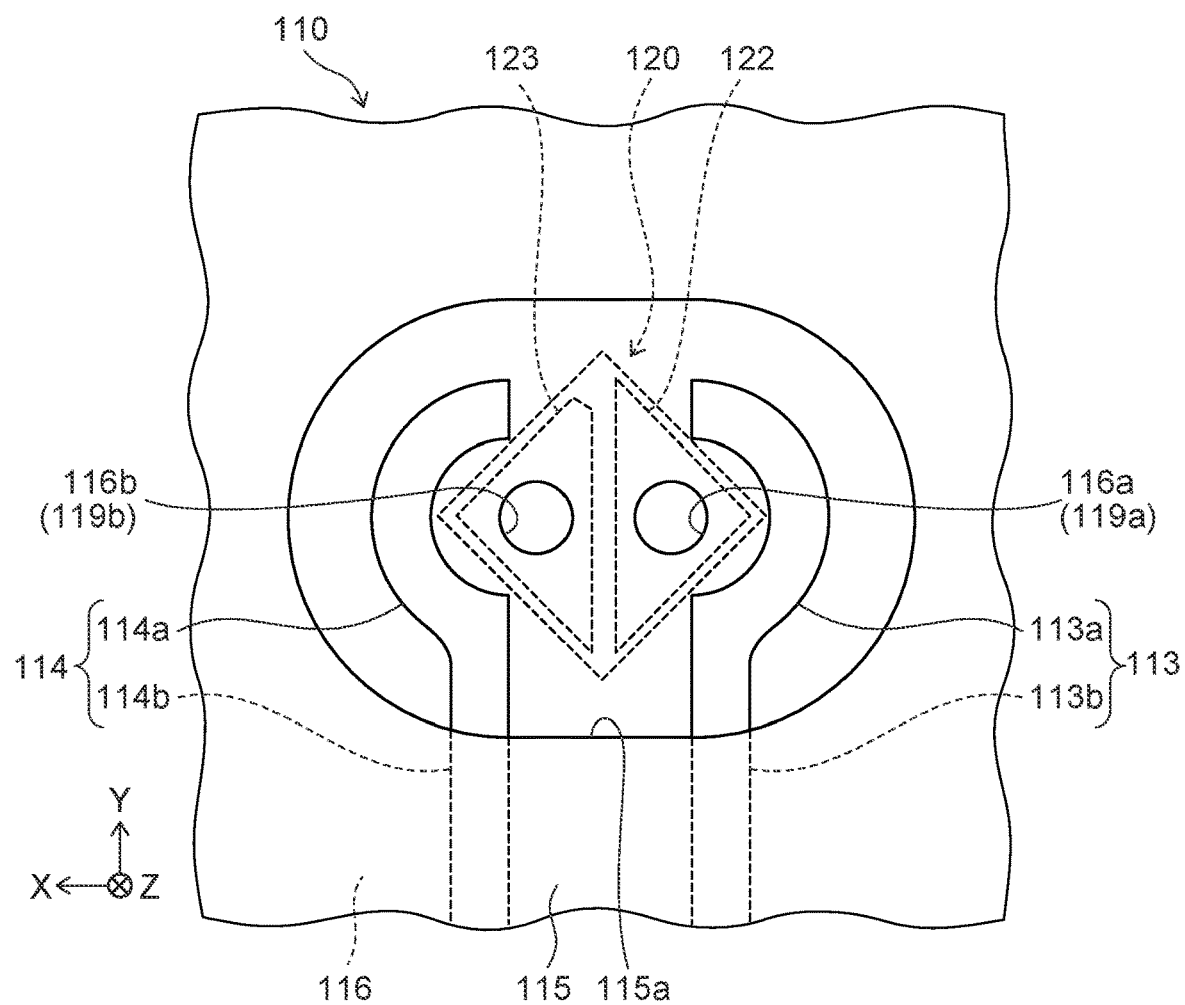
FIG. 10B is a schematic bottom plan view illustrating the method of manufacturing the planar light source.
Figure 11A:
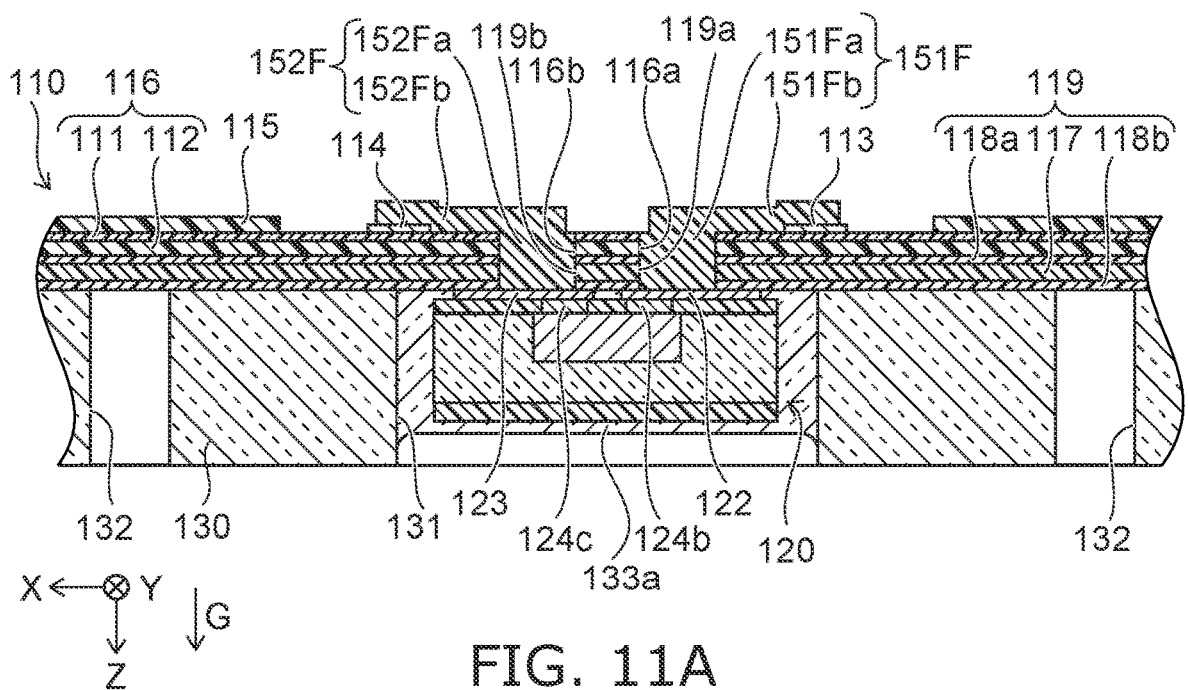
FIG. 11A is a schematic cross-sectional view illustrating the method of manufacturing the planar light source.
Figure 11B:
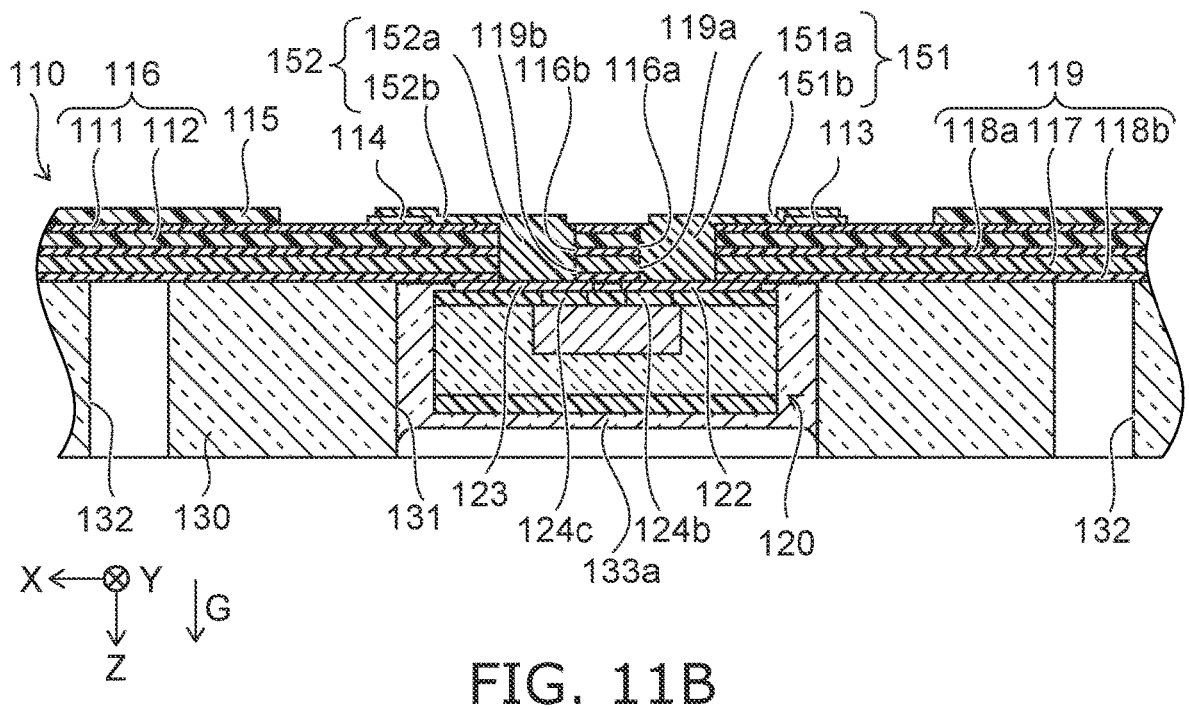
FIG. 11B is a schematic cross-sectional view illustrating the method of manufacturing the planar light source.

Next, a method of manufacturing the planar light source 100 according to the present embodiment will be described. FIG. 7 is a schematic cross-sectional view illustrating the method of manufacturing the planar light source. FIG. 8A is a schematic cross-sectional view illustrating the method of manufacturing the planar light source. FIG. 8B is a schematic cross-sectional view illustrating the method of manufacturing the planar light source. FIG. 9 is a schematic cross-sectional view illustrating the method of manufacturing the planar light source. FIG. 10A is a schematic cross-sectional view illustrating the method of manufacturing the planar light source. FIG. 10B is a schematic bottom plan view illustrating the method of manufacturing the planar light source. FIG. 11A is a schematic cross-sectional view illustrating the method of manufacturing the planar light source. FIG. 11B is a schematic cross-sectional view illustrating the method of manufacturing the planar light source.

First, as illustrated in FIG. 7, the wiring substrate 110 is provided. The wiring substrate 110 provided in the example herein includes the insulating layer 116 provided with first through-hole 116a and the second through-hole 116b separated from each other, and the first wiring layer 113 and the second wiring layer 114 that are disposed below the insulating layer 116 and separated from the first through-hole 116a and the second through-hole 116b, respectively. Further, the sheet layered body 119 is adhered to the upper surface of the wiring substrate 110. The sheet layered body 119 defines the third through-hole 119a located directly above the first through-hole 116a, and the fourth through-hole 119b located directly above the second through-hole 116b.

The first through-hole 116a and the third through-hole 119a can be formed at once by punching, drilling with a drill, laser irradiation, or the like after disposing the sheet layered body 119 above the wiring substrate 110, for example. Similarly, the second through-hole 116b and the fourth through-hole 119b can be formed at once using a similar method after disposing the sheet layered body 119 above the wiring substrate 110, for example. Alternatively, a sheet layered body in which the third through-hole and the fourth through-hole are formed in advance may be disposed on a wiring substrate in which the first through-hole and the second through-hole are formed in advance.

Subsequently, as illustrated in FIG. 8A, the light guide member 130 provided with the light source arrangement portion 131 in which the light source 120 is disposed is disposed above the wiring substrate 110. The light guide member 130 is disposed such that the third through-hole 119a and the fourth through-hole 119b are exposed in the light source arrangement portion 131. The light guide member 130 is adhered to the sheet layered body 119 by the adhesive sheet 118b.

Subsequently, as illustrated in FIG. 8B, the demarcation groove 132 is formed in the light guide member 130.

Subsequently, as illustrated in FIG. 9, the light source 120 is disposed above the wiring substrate 110. The light source 120 is disposed in the light source arrangement portion 131 with the first terminal 122 covering the first through-hole 116a and the second terminal 123 covering the second through-hole 116b in a top plan view. Thus, the first terminal 122 blocks the opening of the third through-hole 119a on the light source 120 side, and the second terminal 123 blocks the opening of the fourth through-hole 119b on the light source 120 side.

At this time, a portion of a lower surface of the first terminal 122 and a portion of a lower surface of the second terminal 123 are adhered to the adhesive sheet 118b of the sheet layered body 119. Thus, the light source 120 can be temporarily fixed to the wiring substrate 110.

Subsequently, as illustrated in FIG. 10A, a light-transmissive first resin member 133Fa is disposed in the gap between the lateral surfaces of the light source arrangement portion 131 and the light source 120 so that the temporary fixing of the light source 120 to the wiring substrate 110 by the adhesive sheet 118b is reinforced. In the present embodiment, the light-transmissive first resin member 133Fa seals the light source 120, and is disposed such that an upper surface of the light-transmissive first resin member 133Fa is located below the upper surface of the light guide member 130. An amount of the first resin member for reinforcing the temporary fixing of the light source may be such that the gap between the lateral surface of the light source arrangement portion and each terminal is blocked and the light source is not sealed.

Subsequently, in the present embodiment, the first resin member 133Fa is cured. A cured product of the first resin member 133Fa is equivalent to the first layer 133a of the light-transmissive member 133. The first resin member may be cured after respective conductive pastes 151F, 152F described later are disposed.

At this time, as illustrated in FIG. 10B, in the through-hole 115a provided in the second covering layer 115 of the wiring substrate 110, the first through-hole 116a, the second through-hole 116b, the tip portion 113a and a portion of the middle portion 113b of the first wiring layer 113, and the tip portion 114a and a portion of the middle portion 114b of the second wiring layer 114 are exposed to the outside.

Subsequently, as illustrated in FIG. 11A and FIG. 11B, the first wiring member 151 and the second wiring member 152 are formed.

Specifically, first, as illustrated in FIG. 11A, a middle body including the wiring substrate 110, the sheet layered body 119, the light source 120, and the light guide member 130 is disposed with a direction (Z direction) from the wiring substrate 110 toward the light source 120 generally matching a gravity direction G.

Subsequently, the first conductive paste 151F is disposed to fill the first through-hole 116a and the third through-hole 119a and to be brought into contact with the insulating layer 116 and the first wiring layer 113. Further, the second conductive paste 152F is disposed to fill the second through-hole 116b and the fourth through-hole 119b and to be brought into contact with the insulating layer 116 and the second wiring layer 114.

The first conductive paste 151F thus disposed includes a first portion 151Fa filled in the first through-hole 116a and the third through-hole 119a, and a second portion 151Fb having a thin film shape, continuous with the first portion 151Fa, and in contact with the insulating layer 116 and the first wiring layer 113. The second portion 151Fb exposes a portion of the first portion 151Fa. This structure allows voids present in the first portion 151Fa to easily escape from the surface exposed from the second portion 151Fb in the first portion 151Fa until the first conductive paste 151F cures. Accordingly, the voids included in the cured product of the first conductive paste 151F can be reduced.

Similarly, the second conductive paste 152F thus disposed includes a third portion 152Fa filled in the second through-hole 116b and the fourth through-hole 119b, and a fourth portion 152Fb having a thin film shape, continuous with the third portion 152Fa, and in contact with the insulating layer 116 and the second wiring layer 114. The fourth portion 152Fb exposes a portion of the third portion 152Fa. This allows voids present in the third portion 152Fa to easily escape from the surface exposed from the fourth portion 152Fb in the third portion 152Fa until the second conductive paste 152F cures. As a result, the voids included in the cured product of the second conductive paste 152F can be reduced.

The conductive pastes 151F, 152F may be disposed simultaneously or may be disposed sequentially. Each of the conductive pastes 151F, 152F contains an uncured resin material and one or more types of metal particles dispersed in the resin material. Examples of the resin material constituting the conductive pastes 151F, 152F include a thermosetting resin such as epoxy. In the present embodiment, the material of the metal particles used in the conductive pastes 151F, 152F is composed of, for example, a core made of a first metal material such as copper (Cu) and a covering layer made of a second metal material such as gold (Au) and covering the core. However, the metal particles used in each wiring member may be made of only one type of metal material such as copper (Cu), silver (Ag), or gold (Au). Each of the conductive pastes 151F, 152F may further include a volatile solvent.

As described above, the opening of the third through-hole 119a on the light source 120 side is blocked by the first terminal 122, and the opening of the fourth through-hole 119b on the light source 120 side is blocked by the second terminal 123. Therefore, leakage of the conductive pastes 151F, 152F into the light source arrangement portion 131 of the light guide member 130 can be reduced.

Furthermore, in this configuration, the gap between the lateral surfaces of the light source arrangement portion 131 and the light source 120 is blocked by the cured product of the first resin member 133Fa (the first layer 133a of the light-transmissive member 133). Therefore, when the terminals 122, 123 do not completely block the corresponding through-holes 119a, 119b, respectively, the cured product of the first resin member 133Fa can further reduce leakage of the conductive pastes 151F, 152F into the light source arrangement portion 131.

Subsequently, as illustrated in FIG. 11B, the first conductive paste 151F and the second conductive paste 152F are cured. When the resin material constituting the conductive pastes 151F, 152F is a thermosetting resin, curing is performed by heating the conductive pastes 151F, 152F. The cured product of the first conductive paste 151F is equivalent to the first wiring member 151, and the cured product of the second conductive paste 152F is equivalent to the second wiring member 152.

Figure 12:
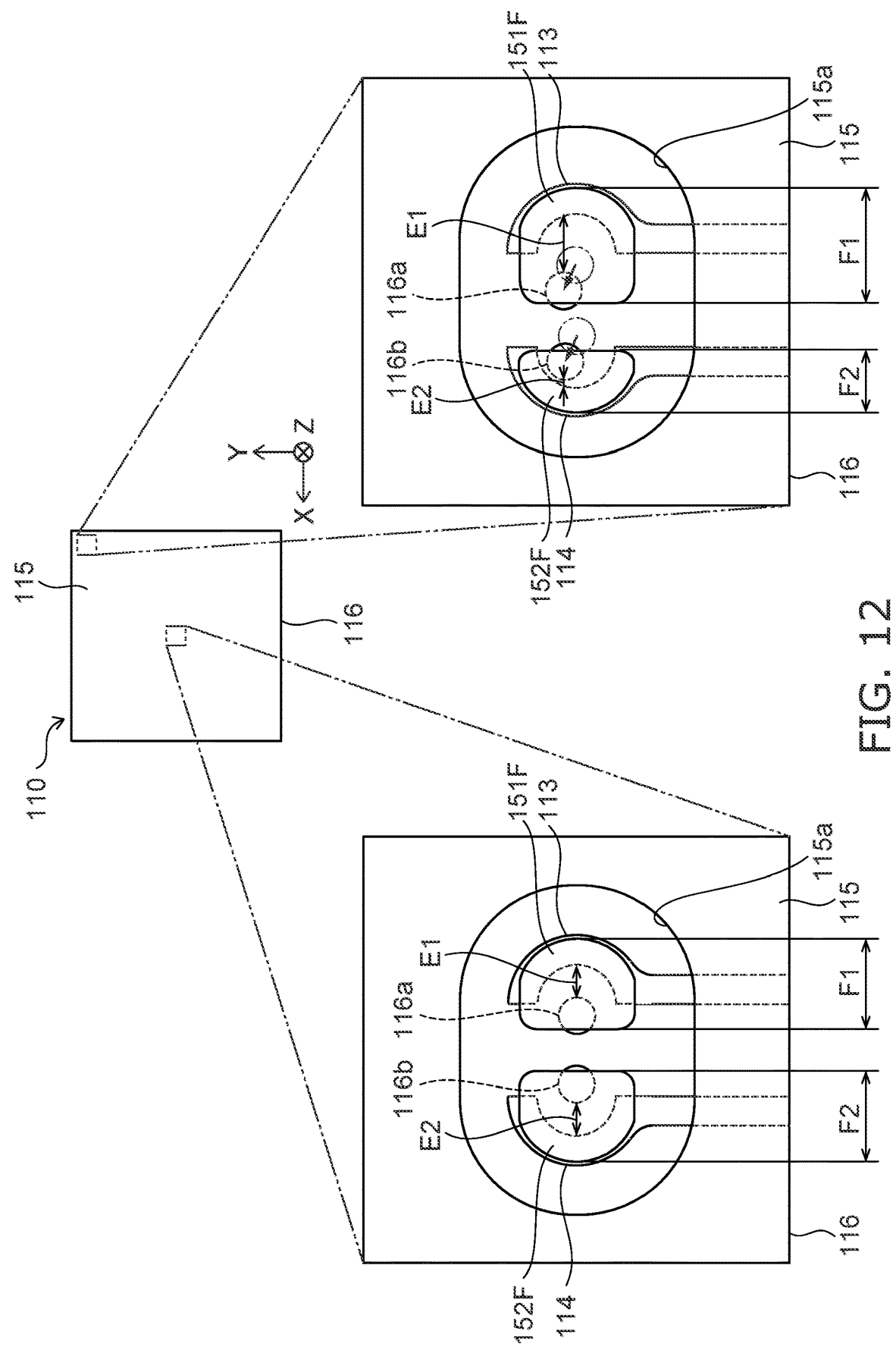
FIG. 12 is an enlarged schematic bottom plan view illustrating a central portion of the wiring substrate and an end portion of the wiring substrate.

FIG. 12 is an enlarged schematic bottom plan view illustrating a central portion of the wiring substrate and the end portion of the wiring substrate. In FIG. 12, each of the through-holes 116a, 116b before a change in location is indicated by a two-dot chain line in the end portion of the wiring substrate 110. Compared to the first wiring layer 113 and the second wiring layer 114, the insulating layer 116 is susceptible to deformation such as contraction or expansion due to environmental changes in temperature, humidity, etc. Deformation of the insulating layer 116 may occur depending on the environment, such as temperature or humidity, when the wiring substrate 110 is transported from a location where the wiring substrate 110 is manufactured to a location where the planar light source 100 is assembled, for example. Further, deformation of the insulating layer 116 may occur by an increase in temperature when the first resin member 133Fa is cured during manufacture of the planar light source 100, for example. Due to deformation of the insulating layer 116, the locations of the two through-holes 116a, 116b with respect to the two wiring layers 113, 114 may change as indicated by the arrows. The effect of such deformation of the insulating layer 116 varies depending on the location of the wiring substrate 110 in the X direction and the Y direction.

More specifically, for example, as illustrated in FIG. 12, in a central portion of the wiring substrate 110, the effect of deformation of the insulating layer 116 is small, and accordingly a distance E1 between the first through-hole 116a and the first wiring layer 113 in the X direction and a distance E2 between the second through-hole 116b and the second wiring layer 114 in the X direction are generally equal to designed values; for example, the distance E1 is generally equal to the distance E2. On the other hand, at an end portion of the wiring substrate 110, the effect of deformation of the insulating layer 116 is great, and the two through-holes 116a, 116b shift in the X direction. Accordingly, in such a portion, the distance E1 between the first through-hole 116a and the first wiring layer 113 in the X direction and the distance E2 between the second through-hole 116b and the second wiring layer 114 in the X direction differ from designed values and, for example, the distance E1 is longer than the distance E2.

In such a case, at each position on the wiring substrate 110, the first conductive paste 151F is disposed such that a dimension F1 in the X direction of a portion located outside the first through-hole 116a and the third through-hole 119a corresponds to the distance E1. Similarly, at each position on the wiring substrate 110, the second conductive paste 152F is disposed such that a dimension F2 in the X direction of a portion located outside the second through-hole 116b and the fourth through-hole 119b corresponds to the distance E2. Therefore, for example, in the central portion of the wiring substrate 110, the dimension F1 of the first wiring member 151 and the dimension F2 of the second wiring member 152 are generally equal. On the other hand, at the end portion of the wiring substrate 110, the dimension F1 of the first wiring member 151 is greater than the dimension F2 of the second wiring member 152.

Thus, the dimension F1 of each first conductive paste 151F is a dimension corresponding to the distance E1 in the X direction between the first wiring layer 113 and the first through-hole 116a corresponding thereto. Similarly, the dimension F2 of each second conductive paste 152F is a dimension corresponding to the distance E2 in the X direction between the second wiring layer 114 and the second through-hole 116b corresponding thereto. With this structure, the first electrode 124b and the first wiring layer 113 can be electrically connected in a one-to-one manner, and the second electrode 124c and the second wiring layer 114 can be electrically connected in a one-to-one manner. That is, in the electrical connection structures between the two wiring layers 113, 114 and the two electrodes 124b, 124c, occurrence of a connection failure such as a short circuit or an opening can be prevented. A short circuit is, for example, a state in which at least one of the two wiring layers 113, 114 is connected to a wiring member that is not a corresponding wiring member. An opening is, for example, a state in which at least one of the two wiring layers 113, 114 is not connected to any wiring member.

Further, as illustrated in FIG. 12, with deformation of the insulating layer 116, the two through-holes 116a, 116b may shift in a direction intersecting an array direction (X direction) of the two through-holes 116a, 116b, such as in the Y direction or the like. In view of this, the two wiring layers 113, 114 are arranged at two opposite side to each other with respect to the two through-holes 116a, 116b in a top plan view. Thus, even in a case in which the two through-holes 116a, 116b shift in either or both the array direction of the two through-holes 116a, 116b or/and the direction intersecting the array direction of the two through-holes 116a, 116b, separation of the first through-hole 116a from the first wiring layer 113 and separation of the second through-hole 116b from the second wiring layer 114 can be prevented. Further, the first wiring layer 113 and the second wiring layer 114 are not disposed between the first through-hole 116a and the second through-hole 116b in a top plan view, which allows for preventing the first through-hole 116a from being located in close proximity to the second wiring layer 114, and preventing the second through-hole 116b from being located in close proximity to the first wiring layer 113. Accordingly, in the electrical connection structures between the wiring layers 113, 114 in the wiring substrate 110 and the electrodes 124b, 124c in the light source 120, the occurrence of connection failure such as a short circuit or an opening can be prevented.

Figure 13A:
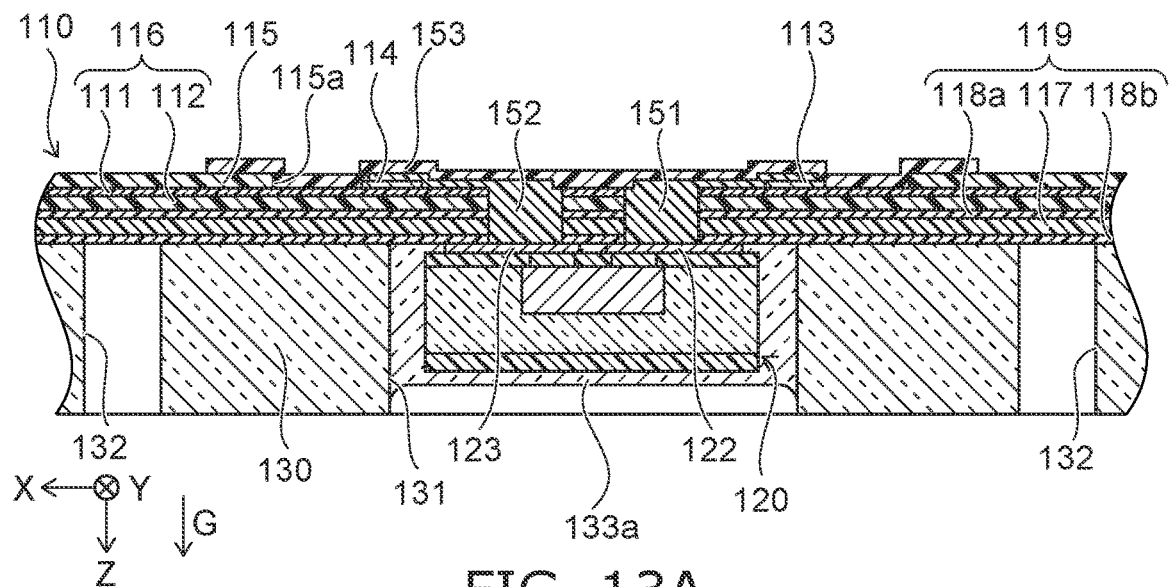
FIG. 13A is a schematic cross-sectional view illustrating the method of manufacturing the planar light source.
Figure 13B:
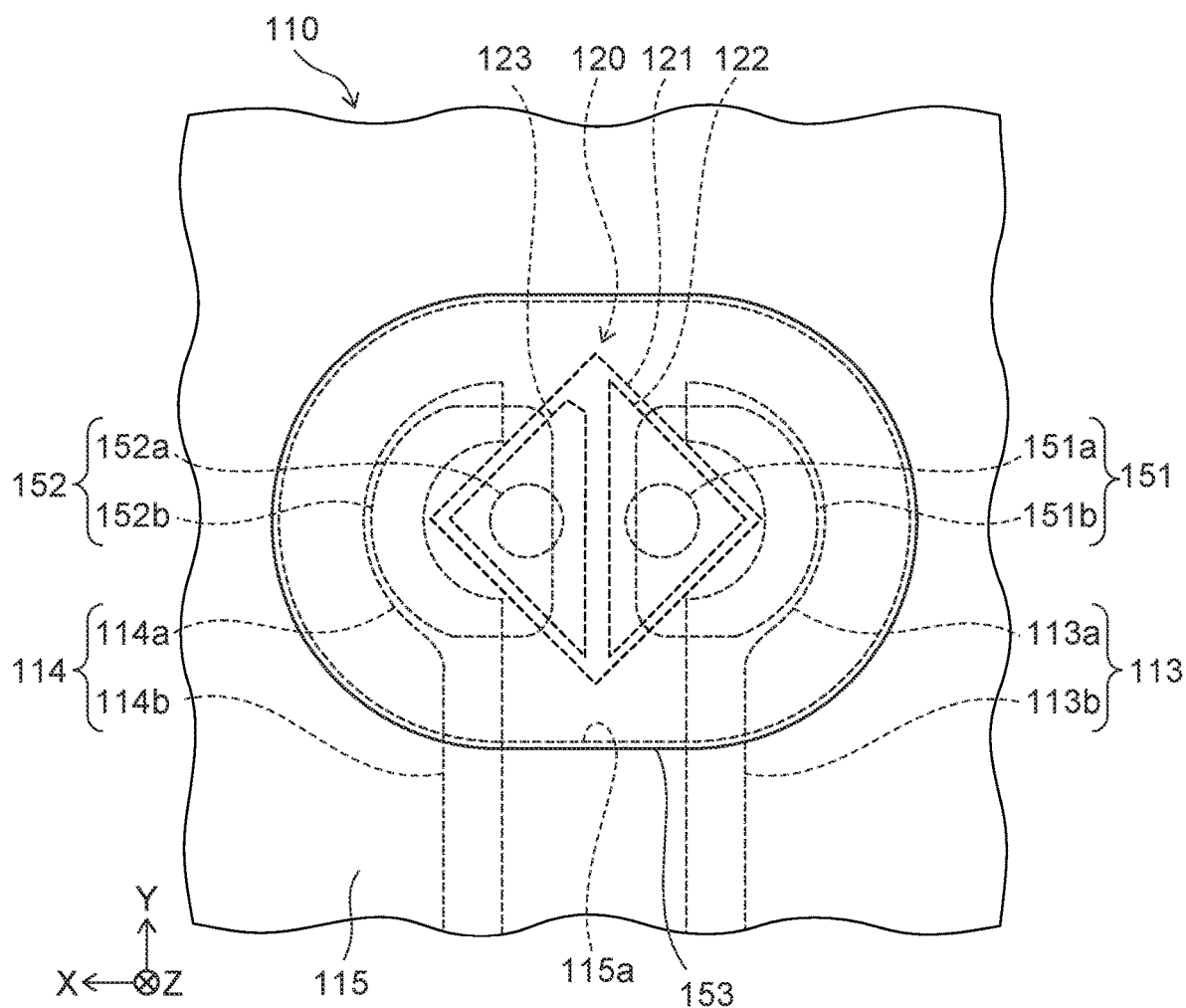
FIG. 13B is a schematic bottom plan view illustrating the method of manufacturing the planar light source.

FIG. 13A is a schematic cross-sectional view illustrating the method of manufacturing the planar light source. FIG. 13B is a schematic bottom plan view illustrating the method of manufacturing the planar light source. Subsequently, as illustrated in FIG. 13A and FIG. 13B, the covering layer 153 is disposed to cover the first wiring member 151 and the second wiring member 152. More specifically, the covering layer 153 is disposed to cover the through-hole 115a formed in the second covering layer 115. Thus, a portion of the first wiring member 151, a portion of the second wiring member 152, a portion of the first wiring layer 113, and a portion of the second wiring layer 114 that are exposed to the outside are covered by the covering layer 153. A gap may exist between the covering layer 153 and the first wiring member 151 and between the covering layer 153 and the second wiring member 152. Alternatively, a gap may not exist between the covering layer 153 and the first wiring member 151 and between the covering layer 153 and the second wiring member 152.

Figure 14:
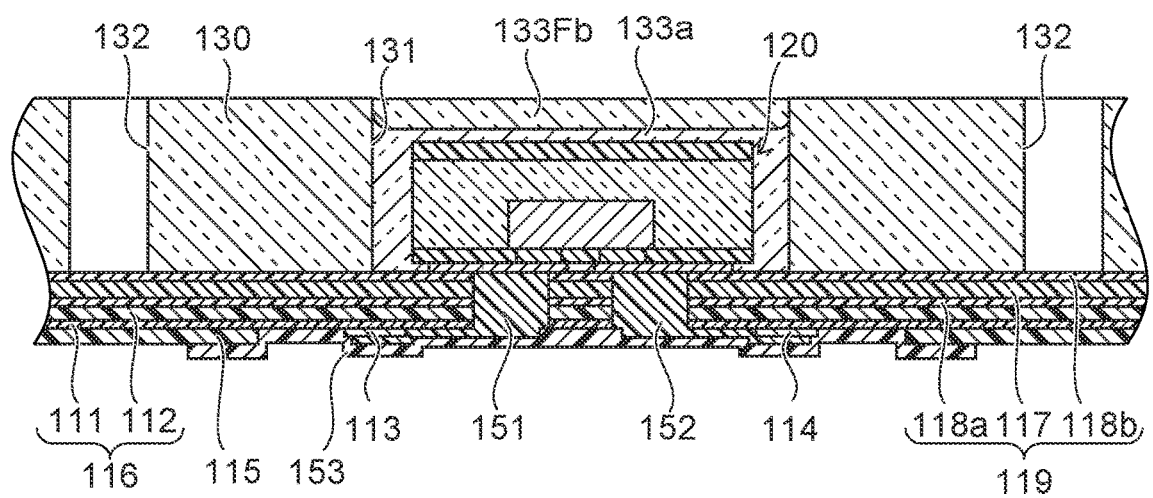
FIG. 14 is a schematic cross-sectional view illustrating the method of manufacturing the planar light source.
Figure 15A:
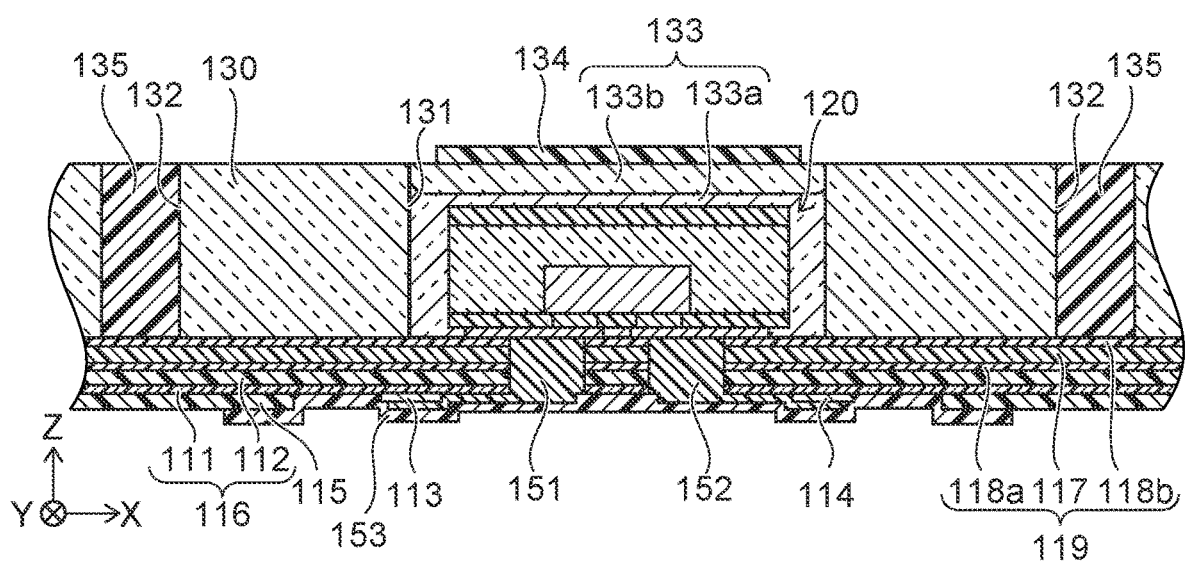
FIG. 15A is a schematic cross-sectional view illustrating the method of manufacturing the planar light source.

FIG. 14 is a schematic cross-sectional view illustrating the method of manufacturing the planar light source. FIG. 15A is a schematic cross-sectional view illustrating the method of manufacturing the planar light source.

Subsequently, as illustrated in FIG. 14, a light-transmissive second resin member 133Fb is disposed on the cured product of the first resin member (first layer 133a of the light-transmissive member 133) in the light source arrangement portion 131, and cured. The second resin member 133Fb may contain wavelength conversion particles. The cured product of the second resin member 133Fb is equivalent to the second layer 133b of the light-transmissive member 133. Thus, the light-transmissive member 133 composed of the first layer 133a and the second layer 133b is formed.

Subsequently, as illustrated in FIG. 15A, the second light adjustment member 134 is disposed on the light-transmissive member 133, and the demarcation member 135 is disposed in the demarcation groove 132. A region of a lower surface of the first wiring member 151 located directly below the first through-hole 116a is flat. Further, a region of a lower surface of the second wiring member 152 located directly below the second through-hole 116b is flat. Thus, the planar light source 100 is formed.

Figure 15B:
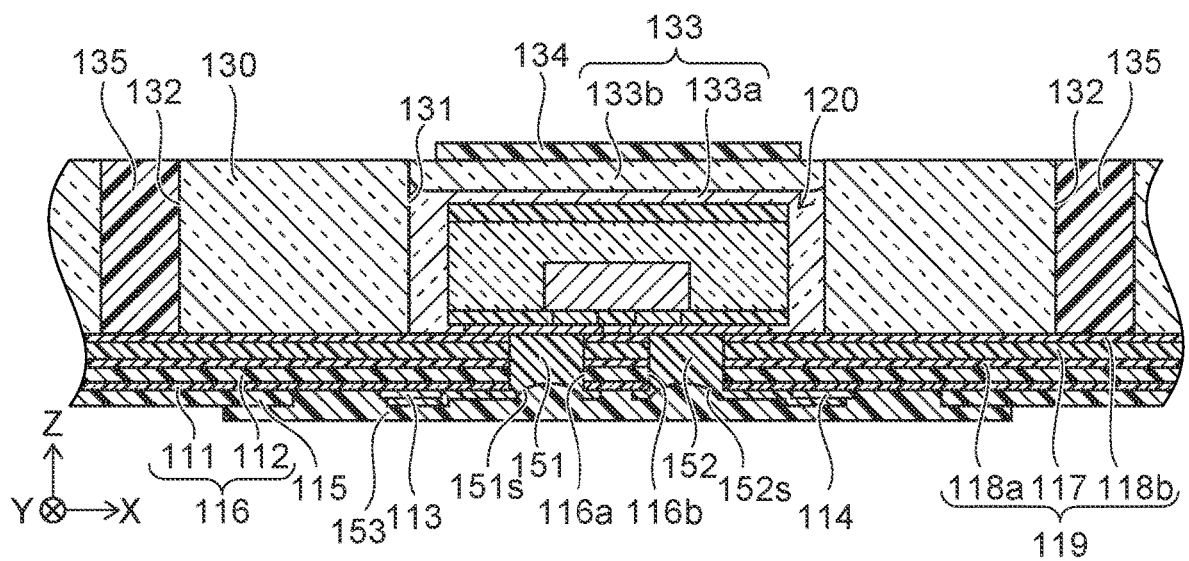
FIG. 15B is a schematic cross-sectional view illustrating other examples of shapes of a first wiring member, a second wiring member, and a covering layer.

FIG. 15B is a schematic cross-sectional view illustrating another example of the shapes of the first wiring member, the second wiring member, and the covering layer. A region 151s of the lower surface of the first wiring member 151 located directly below the first through-hole 116a may be recessed in the upward direction. Further, a region 152s of the lower surface of the second wiring member 152 located directly below the second through-hole 116b may be recessed in the upward direction. In the example illustrated in FIG. 15B, the lower surface of the covering layer 153 is generally flat. However, a region of the lower surface of the covering layer 153 located directly below the light source 120 may project in the downward direction. Further, regions of the lower surface of the covering layer 153 located directly below the region 151s and located directly below the region 152s may be recessed in the upward direction along the lower surfaces of the wiring members 151, 152.

For example, when the conductive pastes 151F, 152F are cured, a dilute material such as a solvent included in the conductive pastes 151F, 152F is removed, so that the wiring members 151, 152 having the shapes described above is obtained.

Figure 15C:
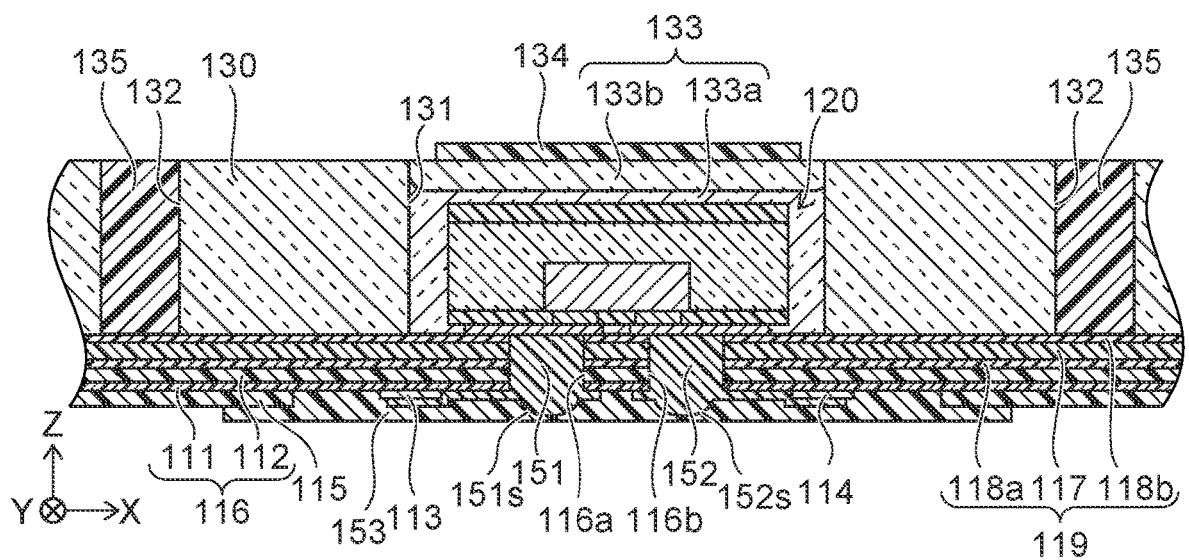
FIG. 15C is a schematic cross-sectional view illustrating other examples of the shapes of the first wiring member, the second wiring member, and the covering layer.

FIG. 15C is a schematic cross-sectional view illustrating another example of the shapes of the first wiring member, the second wiring member, and the covering layer. The region 151s of the lower surface of the first wiring member 151 located directly below the first through-hole 116a may project in the downward direction. Further, the region 152s of the lower surface of the second wiring member 152 located directly below the second through-hole 116b may project in the downward direction. In the example illustrated in FIG. 15C, the lower surface of the covering layer 153 is generally flat. A region of the lower surface of the covering layer 153 located directly below the light source 120 may project in the downward direction. Further, regions of the lower surface of the covering layer 153 located directly below the region 151s and located directly below the region 152s may project in the downward direction along the lower surfaces of the wiring members 151, 152.

For example, the wiring members 151, 152 having the shapes described above are formed by disposing the conductive pastes 151F, 152F with a dispenser such that portions of the conductive pastes 151F, 152F located directly above the through-holes 116a, 116b project in the upward direction. Further, for example, the wiring members 151, 152 having the shapes described above are formed by printing the conductive pastes 151F, 152F a plurality of times such that portions located directly above the through-holes 116a, 116b project in the upward direction.

When the regions 151s, 152s are flat or project in the downward direction, a force in a direction in which the wiring members 151, 152 are pressed against the wiring substrate 110 is readily applied. Therefore, the wiring members 151, 152 can be firmly fixed to the wiring substrate 110. Further, when the planar light source 100 is driven, a temperature of the planar light source 100 rises or falls according to a state of lighting, non-lighting, or the like of the light sources 120. This may cause deformation of the wiring substrate 110, the sheet layered body 119, the light guide member 130, and the wiring members 151, 152 constituting the planar light source 100. At this time, because thermal expansion coefficients thereof differ from each other, stress is applied to the wiring members 151, 152, which may cause cracks. In the present embodiment, as described above, firmly fixing the wiring members 151, 152 to the wiring substrate 110 allows for reducing stress acting on the wiring members 151, 152. This allows for reducing occurrence of cracks in the wiring members 151, 152.

A material having a thermal expansion coefficient less than that of the light guide member 130 is preferably used as a material of the light reflective sheet 117. A material having such a thermal expansion coefficient greater than that of the wiring substrate 110 is preferably used. This allows for accommodating a difference in thermal expansion coefficients between the light guide member 130 and the wiring substrate 110. When the light guide member 130 is polycarbonate, the thermal expansion coefficient is approximately 60 ppm/° C. When the main component of the light reflective sheet 117 is polyethylene terephthalate, the thermal expansion coefficient is approximately 25 ppm/° C. When the wiring substrate 110 includes polyimide and copper, the thermal expansion coefficient is approximately 17 ppm/° C. Such a structure allows for improving a strength of the planar light source 100.

The method of manufacturing the planar light source is not limited to the above. For example, the first resin member for reinforcing the temporary fixing of the light source in the light source arrangement portion may be disposed to fill the light source arrangement portion, and there need not be a step of disposing the second resin member. Further, the first resin member for reinforcing the temporary fixing of the light source in the light source arrangement portion need not be disposed before disposing the conductive pastes. Further, the step of forming the demarcation groove and the step of disposing the second light adjustment member and the demarcation member may be performed before the step of forming the first wiring member and the second wiring member. Further, the step of disposing the light guide member may be performed after the step of disposing the light source.

Subsequently, operation of the planar light source 100 according to the present embodiment will be described. The first wiring layer 113 is electrically connected to the first electrode 124b of the light source 120 via the first wiring member 151 and the first terminal 122, and the second wiring layer 114 is electrically connected to the second electrode 124c of the light source 120 via the second wiring member 152 and the second terminal 123. Therefore, the light source 120 can be turned on by supplying power to the light source 120 from an external power source via the first wiring layer 113 and the second wiring layer 114.

The planar light source 100 can be applied to, for example, a backlight for a liquid crystal display. In a backlight in which the light-emitting regions R are demarcated for respective ones of the plurality of light sources 120, local dimming can be performed with high accuracy by individually adjusting an output of each of the light sources 120.

Next, an effect that can be obtained in the present embodiment will be described. The planar light source 100 according to the present embodiment includes the wiring substrate 110, the light source 120, the light guide member 130, the first wiring member 151, and the second wiring member 152. The wiring substrate 110 includes the insulating layer 116 defining first through-hole 116a and the second through-hole 116b separated from each other, and the first wiring layer 113 and the second wiring layer 114 disposed below the insulating layer 116 and separated from the first through-hole 116a and the second through-hole 116b. The light source 120 is disposed above the wiring substrate 110 and includes the first electrode 124b and the second electrode 124c separated from each other. The light guide member 130 is disposed above the wiring substrate 110 and surrounds the periphery of the light source 120. The first wiring member 151 includes the first portion 151a and the second portion 151b. The first portion 151a fills the first through-hole 116a and is electrically connected to the first electrode 124b. The second portion 151b is disposed below the insulating layer 116, continuous with the first portion 151a, and in contact with the first wiring layer 113. The second wiring member 152 includes the third portion 152a and the fourth portion 152b. The third portion 152a fills the second through-hole 116b and is electrically connected to the second electrode 124c. The fourth portion 152b is disposed below the insulating layer 116, continuous with the third portion 152a, and in contact with the second wiring layer 114. In a top plan view, the first wiring layer 113 and the second wiring layer 114 are arranged at two opposite side to each other with respect to the first through-hole 116a and the second through-hole 116b.

Thus, the first through-hole 116a and the first wiring layer 113 separated from each other are electrically connected by the first wiring member 151 disposed in accordance with the locations of the first through-hole 116a and the first wiring layer 113, and the second through-hole 116b and the second wiring layer 114 separated from each other are electrically connected by the second wiring member 152 disposed in accordance with the locations of the second through-hole 116b and the second wiring layer 114. Furthermore, in a top plan view, the first wiring layer 113 and the second wiring layer 114 are arranged at two opposite side to each other with respect to the first through-hole 116a and the second through-hole 116b. That is, in a top plan view, while the first through-hole 116a and the second through-hole 116b are disposed between the first wiring layer 113 and the second wiring layer 114, the first wiring layer 113 and the second wiring layer 114 are not disposed between the first through-hole 116a and the second through-hole 116b. Therefore, even if the through-holes 116a, 116b have been shifted in location with respect to the wiring layers 113, 114 when the wiring members 151, 152 are formed, occurrence of connection failure such as a short circuit or an opening can be prevented in the electrical connection structures between the wiring layers 113, 114 in the wiring substrate 110 and the electrodes 124b, 124c in the light source 120.

Further, in a top plan view, the distance D1 between the center c1 of the first through-hole 116a and the center c2 of the second through-hole 116b is greater than the distance D2 between the center c3 of the first electrode 124b and the center c4 of the second electrode 124c (D1>D2). Therefore, in a case in which the insulating layer 116 deforms, such as during manufacture of the planar light source 100, the first wiring member 151 and the second wiring member 152 can be prevented from being close proximity to or in contact with each other.

Further, the region (first region 113s1) of the lateral surface 113e of the first wiring layer 113 facing the first through-hole 116a in a top plan view is recessed in a direction away from the first through-hole 116a, and the region (first region 114s1) of the lateral surfaces 114e of the second wiring layer 114 facing the second through-hole 116b in a top plan view is recessed in a direction away from the second through-hole 116b.

Therefore, as illustrated in FIG. 4A, compared to a case in which each of the regions 113s1, 114s1 has a shape of a straight line in a top plan view, a maximum value of a distance D3 between each location of the first region 113s1 and the center c1 of the first portion 151a in a top plan view, and a maximum value of a distance D4 between each location of the first region 114s1 and the center c2 of the third portion 152a in a top plan view can be reduced. This allows for reducing internal resistances of the first wiring member 151 and the second wiring member 152.

Further, in a top plan view, each of the first through-hole 116a and the second through-hole 116b has a circular shape, and each of the region (first region 113s1) of the lateral surface 113e of the first wiring layer 113 facing the first through-hole 116a the region (first region 114s1) of the lateral surface 114e of the second wiring layer 114 facing the second through-hole 116b in a top plan view has an arcuate shape. With the first region 113s1 of the first wiring layer 113 thus having a shape corresponding to the shape of the first through-hole 116a, the distance D3 between each location of the first region 113s1 and the center c1 of the first portion 151a in a top plan view can be made generally constant. The same applies to the second wiring layer 114. Accordingly, the internal resistances of the first wiring member 151 and the second wiring member 152 can be reduced.

Further, the light source 120 further includes the first terminal 122 disposed below the first electrode 124b, in contact with the upper end of the first portion 151a, and having an area in a top plan view greater than or equal to the area of the first electrode 124b, and the second terminal 123 disposed below the second electrode 124c, in contact with the upper end of the third portion 152a, and having an area in a top plan view greater than or equal to the area of the second electrode 124c. Therefore, the first through-hole 116a and the second through-hole 116b separated from each other can be formed in accordance with the locations of the first terminal 122 and the second terminal 123.

Further, the first terminal 122 covers the first through-hole 116a in a top plan view, and the second terminal 123 covers the second through-hole 116b in a top plan view. Therefore, the contact area between the terminals 122, 123 and the wiring members 151, 152 can be increased. This allows for strengthening the connection between the terminals 122, 123 and the wiring members 151, 152.

Further, the planar light source 100 further includes the covering layer 153 that covers the first wiring member 151 and the second wiring member 152. Therefore, exposure of the wiring members 151, 152 to the outside can be prevented.

Further, each of the first wiring member 151 and the second wiring member 152 includes a base material made of a resin material and at least one type of metal particle contained in the base material. Thus, each of the wiring members 151, 152 is composed of the conductive pastes 151F and 152F. Therefore, even if the relative locations of the two through-holes 116a, 116b and the two wiring layers 113, 114 change due to deformation of the insulating layer 116 that may occur during, for example, manufacture of the planar light source 100, the first wiring member 151 and the second wiring member 152 can be easily formed by the conductive pastes 151F, 152F in accordance with the relative locations of the two through-holes 116a, 116b and the two wiring layers 113, 114.

Further, the method of manufacturing the planar light source 100 according to the present embodiment includes providing the wiring substrate 110 including the insulating layer 116 defining the first through-hole 116a and the second through-hole 116b separated from each other and the first wiring layer 113 and the second wiring layer 114 disposed below the insulating layer 116 and separated from the first through-hole 116a and the second through-hole 116b, the first wiring layer 113 and the second wiring layer 114 being arranged at two opposite side to each other with respect to the first through-hole 116a and the second through-hole 116b in a top plan view, disposing the light guide member 130 above the wiring substrate 110, the light guide member 130 having the light source arrangement portion 131 on which the light source 120 is to be disposed, disposing the light source 120 above the wiring substrate 110, and forming the first wiring member 151 to fill the first through-hole 116a, to be in contact with the first wiring layer 113, and to be electrically connected to the first electrode 124b of the light source 120, and the second wiring member 152 to be separated from the first wiring member 151, to fill the second through-hole 116b, to be in contact with the second wiring layer 114, and to be electrically connected to the second electrode 124c of the light source 120.

Thus, in a case in which the locations of the two through-holes 116a, 116b with respect to the two wiring layers 113, 114 change due to deformation of the insulating layer 116, during, for example, manufacture of the planar light source 100, the wiring members 151, 152 are formed in accordance with the locations of the two wiring layers 113, 114 and the two through-holes 116a, 116b. Furthermore, in a top plan view, the first wiring layer 113 and the second wiring layer 114 are arranged at two opposite side to each other with respect to the first through-hole 116a and the second through-hole 116b. Therefore, even if the through-holes 116a, 116b have been shifted in location with respect to the wiring layers 113, 114 when the wiring members 151, 152 are formed, occurrence of connection failure such as a short circuit or an opening can be presented in the electrical connection structures between the wiring layers 113, 114 in the wiring substrate 110 and the electrodes 124b, 124c in the light source 120.

Further, the step of forming the first wiring member 151 and the second wiring member 152 includes disposing the first conductive paste 151F such that the first conductive paste 151 F fills the first through-hole 116a and is brought into contact with the first wiring layer 113, and disposing the second conductive paste 152F such that the second conductive paste 152F fills the second through-hole 116b and is brought into contact with the second wiring layer 114, and curing the first conductive paste 151F and the second conductive paste 152F. Thus, the conductive pastes 151F, 152F are disposed in accordance with the distances between the respective through-holes 116a, 116b and the respective wiring layers 113, 114 of the wiring substrate 110. Therefore, even if the relative locations of the two through-holes 116a, 116b and the two wiring layers 113, 114 change due to deformation of the insulating layer 116, the two wiring layers 113, 114 and the two electrodes 124b, 124c can be connected in a one-to-one manner. Accordingly, the occurrence of connection failure can be suppressed in the electrical connection structures between the wiring layers 113, 114 in the wiring substrate 110 and the electrodes 124b, 124c in the light source 120.

Further, the method of manufacturing the planar light source 100 in the present embodiment may further include, after the step of disposing the light guide member 130 and the light source 120 and before the step of forming the first wiring member 151 and the second wiring member 152, a step of disposing a light-transmissive resin member (first resin member 133Fa) in the gap between the light guide member 130 and the light source 120 in the light source arrangement portion 131. Therefore, with the resin member (first resin member 133Fa), leakage of the conductive pastes 151F, 152F in the light source arrangement portion 131 can be reduced.

Further, the light source 120 further includes the first terminal 122 disposed below the first electrode 124b, and the second terminal 123 disposed below the second electrode 124c, and the light source 120 is disposed such that the first terminal 122 covers the first through-hole 116a, and the second terminal 123 covers the second through-hole 116b in a top plan view. Therefore, leakage of the conductive pastes 151F, 152F from the openings of the through-holes 116a, 116b on the light source 120 side can be reduced.

Second Embodiment

Figure 16:
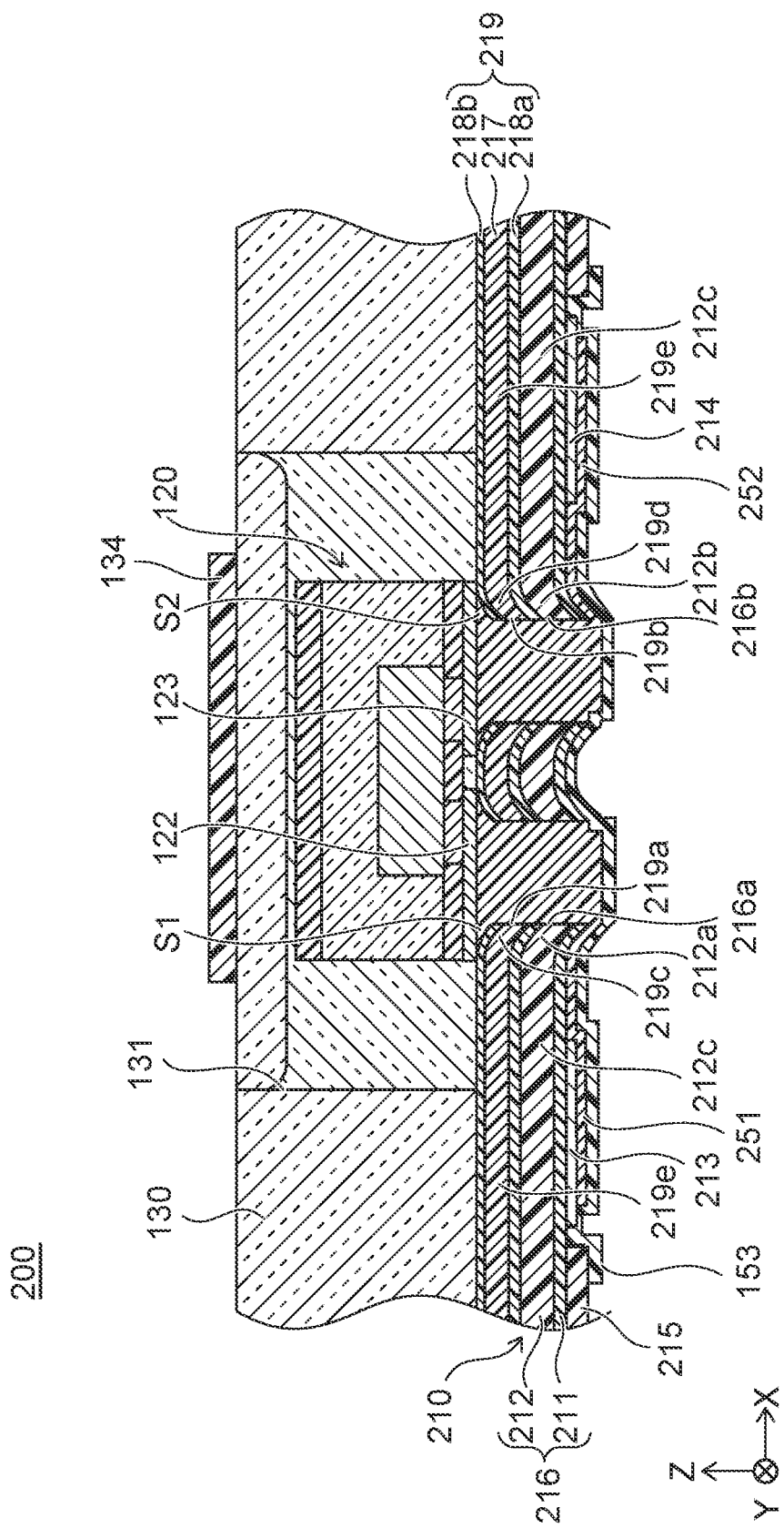
FIG. 16 is an enlarged schematic cross-sectional view illustrating a portion of a planar light source according to a second embodiment.

Next, a second embodiment will be described. FIG. 16 is an enlarged schematic cross-sectional view illustrating a portion of a planar light source according to the present embodiment. A planar light source 200 according to the present embodiment differs from the planar light source 100 according to the first embodiment in shapes of a peripheral portion 212a of a first through-hole 216a and a peripheral portion 212b of a second through-hole 216b of an insulating layer 216, and shapes of a peripheral portion 219c of a third through-hole 219a and a peripheral portion 219d of a fourth through-hole 219b of a sheet layered body 219. A detailed description will be given below. In the following description, in general, only differences from the first embodiment will be described. The second embodiment is similar to the first embodiment, except for configurations described below. The same applies to other embodiments described below.

A wiring substrate 210 includes a base layer 211, a first covering layer 212 disposed on the base layer 211, a first wiring layer 213 and a second wiring layer 214 disposed below the base layer 211, and a second covering layer 215 disposed below the base layer 211. The base layer 211 and the first covering layer 212 are equivalent to the insulating layer 216.

The insulating layer 216 includes the first peripheral portion 212a surrounding the first through-hole 216a, the second peripheral portion 212b surrounding the second through-hole 216b, and a flat portion 212c located around the first peripheral portion 212a and the second peripheral portion 212b and generally parallel with the X direction and the Y direction.

An upper surface and a lower surface of the first peripheral portion 212a are curved downward. Similarly, an upper surface and a lower surface of the second peripheral portion 212b are curved downward. With the upper surface of the first peripheral portion 212a and the upper surface of the second peripheral portion 212b curved downward, the conductive pastes 151F, 152F filled in the third through-hole 219a and the fourth through-hole 219b are wider in a cross-sectional view, which allows for increasing the connection areas of the light-emitting element and the conductive pastes 151F, 152F.

The sheet layered body 219 includes a light reflective sheet 217 and two adhesive sheets 218a, 218b.

The sheet layered body 219 includes the first peripheral portion 219c surrounding the third through-hole 219a, the second peripheral portion 219d surrounding the fourth through-hole 219b, and a flat portions 219e located around the first peripheral portion 219c and the second peripheral portion 219d and generally parallel with the X direction and the Y direction.

An upper surface and a lower surface of the first peripheral portion 219c are curved downward toward a center of the third through-hole 219a. Similarly, an upper surface and a lower surface of the second peripheral portion 219d are curved downward toward a center of the fourth through-hole 219b. In other words, the first peripheral portion 219c and the second peripheral portion 219d are sank to the insulating layer 216.

The first peripheral portion 219c is separated from the first terminal 122. Similarly, the second peripheral portion 219d is separated from the second terminal 123. The flat portion 219e is in contact with an outer peripheral portion of the lower surface of the first terminal 122 and an outer peripheral portion of the lower surface of the second terminal 123 of the light source 120. Therefore, a first gap 51 is provided between the first peripheral portion 219c and the first terminal 122, and a second gap S2 is provided between the second peripheral portion 219d and the second terminal 123.

A portion of a first wiring member 251 is provided in the first gap 51 and, for example, fills the first gap 51. Similarly, a portion of a second wiring member 252 is provided in the second gap S2 and, for example, fills the second gap S2. This allows for increasing a contact area between the first wiring member 251 and the first terminal 122 and a contact area between the second wiring member 252 and the second terminal 123. Thus, a connection between the first wiring member 251 and the first terminal 122 and a connection between the second wiring member 252 and the second terminal 123 can be strengthened.

Figure 17:
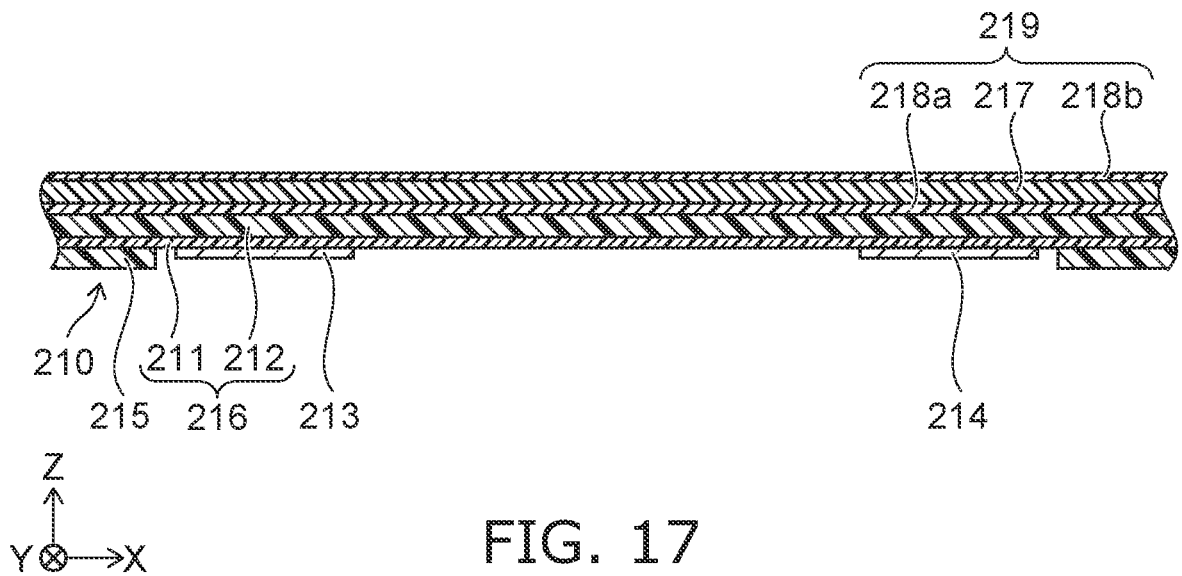
FIG. 17 is a schematic cross-sectional view illustrating a method of manufacturing the planar light source.
Figure 18:
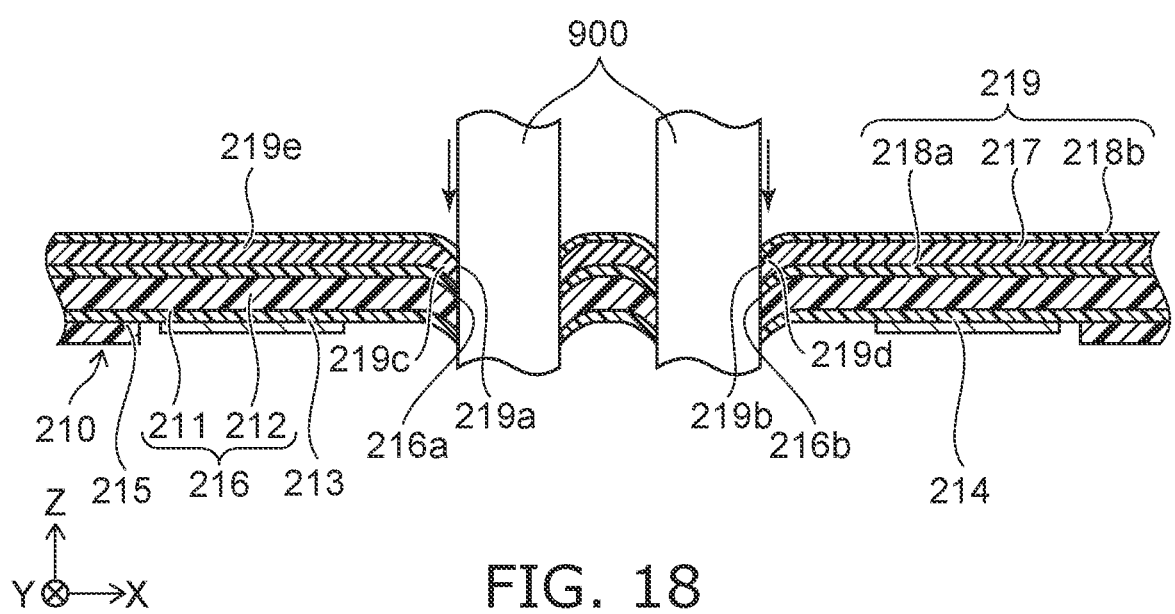
FIG. 18 is a schematic cross-sectional view illustrating the method of manufacturing the planar light source.
Figure 19:
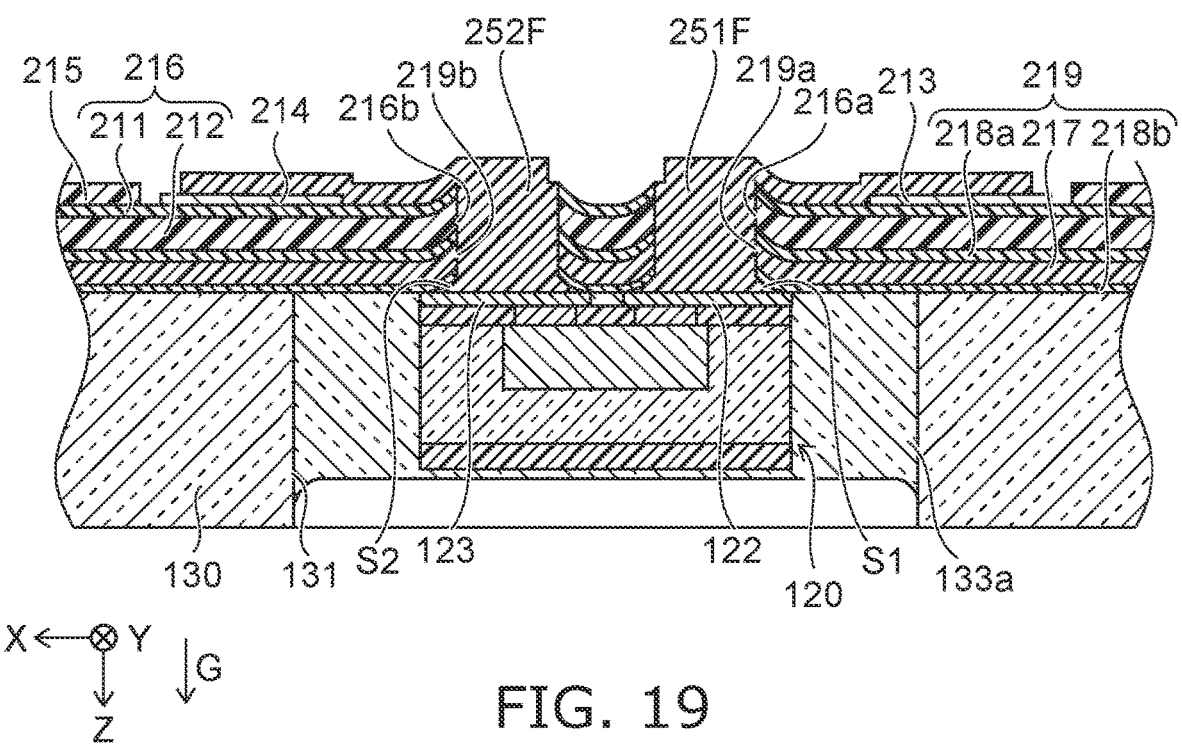
FIG. 19 is a schematic cross-sectional view illustrating the method of manufacturing the planar light source.
Figure 20:
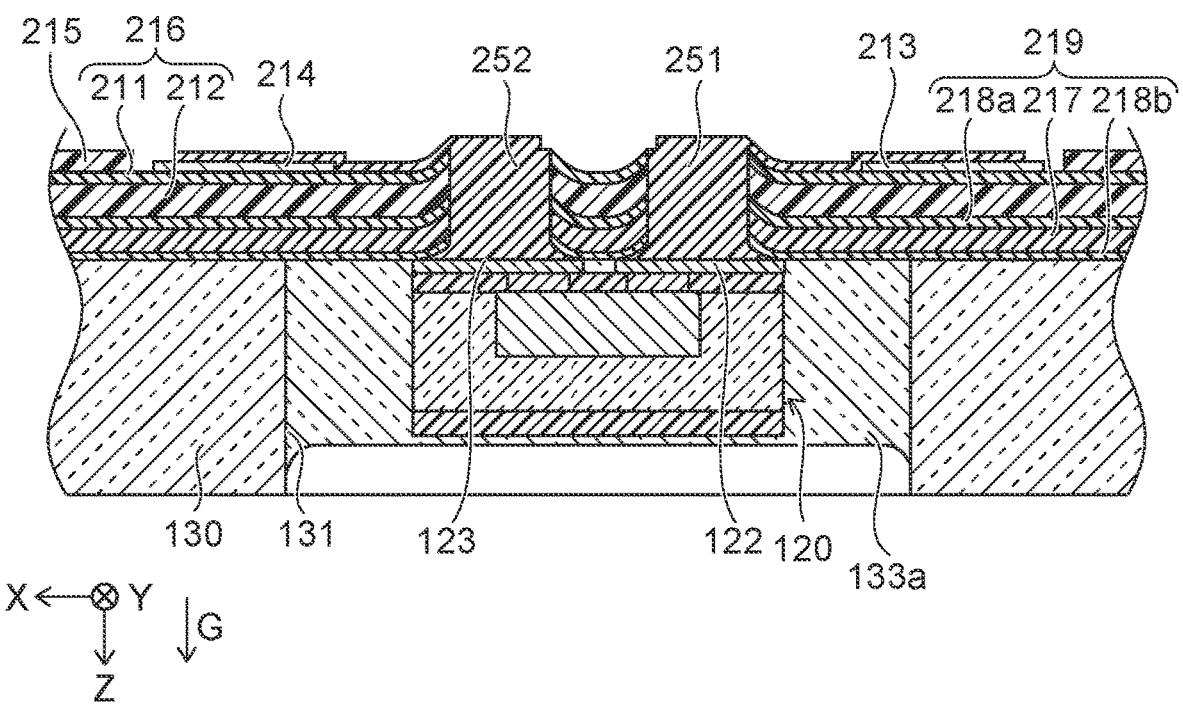
FIG. 20 is a schematic cross-sectional view illustrating the method of manufacturing the planar light source.

Next, a method of manufacturing the planar light source 200 according to the present embodiment will be described. FIG. 17 is a schematic cross-sectional view illustrating the method of manufacturing the planar light source. FIG. 18 is a schematic cross-sectional view illustrating the method of manufacturing the planar light source. FIG. 19 is a schematic cross-sectional view illustrating the method of manufacturing the planar light source. FIG. 20 is a schematic cross-sectional view illustrating the method of manufacturing the planar light source.

As illustrated in FIG. 17, the sheet layered body 219 is disposed on the wiring substrate 210. Subsequently, as illustrated in FIG. 18, a drill 900 is moved from an upper surface side of the sheet layered body 219 toward a lower surface side of the insulating layer 216, and the drill 900 is caused to penetrate the sheet layered body 219 and the insulating layer 216. Thus, the first through-hole 216a and the second through-hole 216b are formed in the wiring substrate 210, and the third through-hole 219a and the fourth through-hole 219b are formed in the sheet layered body 219. In this operation, depending on machining conditions or hardnesses of the sheet layered body 119 and the insulating layer 216, a portion of the sheet layered body 219 in contact with the drill 900 is pressed into the insulating layer 216 due to the movement of the drill 900 in the downward direction. Accordingly, the first peripheral portion 219c and the second peripheral portion 219d pressed into the insulating layer 216 are formed on the sheet layered body 219.

Subsequently, the light guide member 130 having the light source arrangement portion 131 is disposed on the wiring substrate 210 and the sheet layered body 219. Subsequently, the demarcation groove 132 is formed in the light guide member 130. Subsequently, the light source 120 is disposed in the light source arrangement portion 131. The light source 120 is disposed such that an outer peripheral portion of the first terminal 122 and an outer peripheral portion of the second terminal 123 is brought into contact with the flat portion 219e of the sheet layered body 219. Subsequently, the first resin member 133Fa is disposed in the light source arrangement portion 131 and cured.

Subsequently, as illustrated in FIG. 19, a first conductive paste 251F is disposed to fill the first through-hole 216a, the third through-hole 219a, and the first gap 51, and to be in contact with the lower surface of the insulating layer 216 and the first wiring layer 213. Further, a second conductive paste 252F is disposed to fill the second through-hole 216b, the fourth through-hole 219b, and the second gap S2, and to be in contact with the lower surface of the insulating layer 216 and the second wiring layer 214.

Subsequently, as illustrated in FIG. 20, the first conductive paste 251F and the second conductive pastes 252F are cured. The cured product of the first conductive paste 251F is equivalent to the first wiring member 251, and the cured product of the second conductive paste 252F is equivalent to the second wiring member 252.

The subsequent steps are similar to those in the method of manufacturing the planar light source 100 according to the first embodiment, and thus description thereof will be omitted.

Third Embodiment

Figure 21:
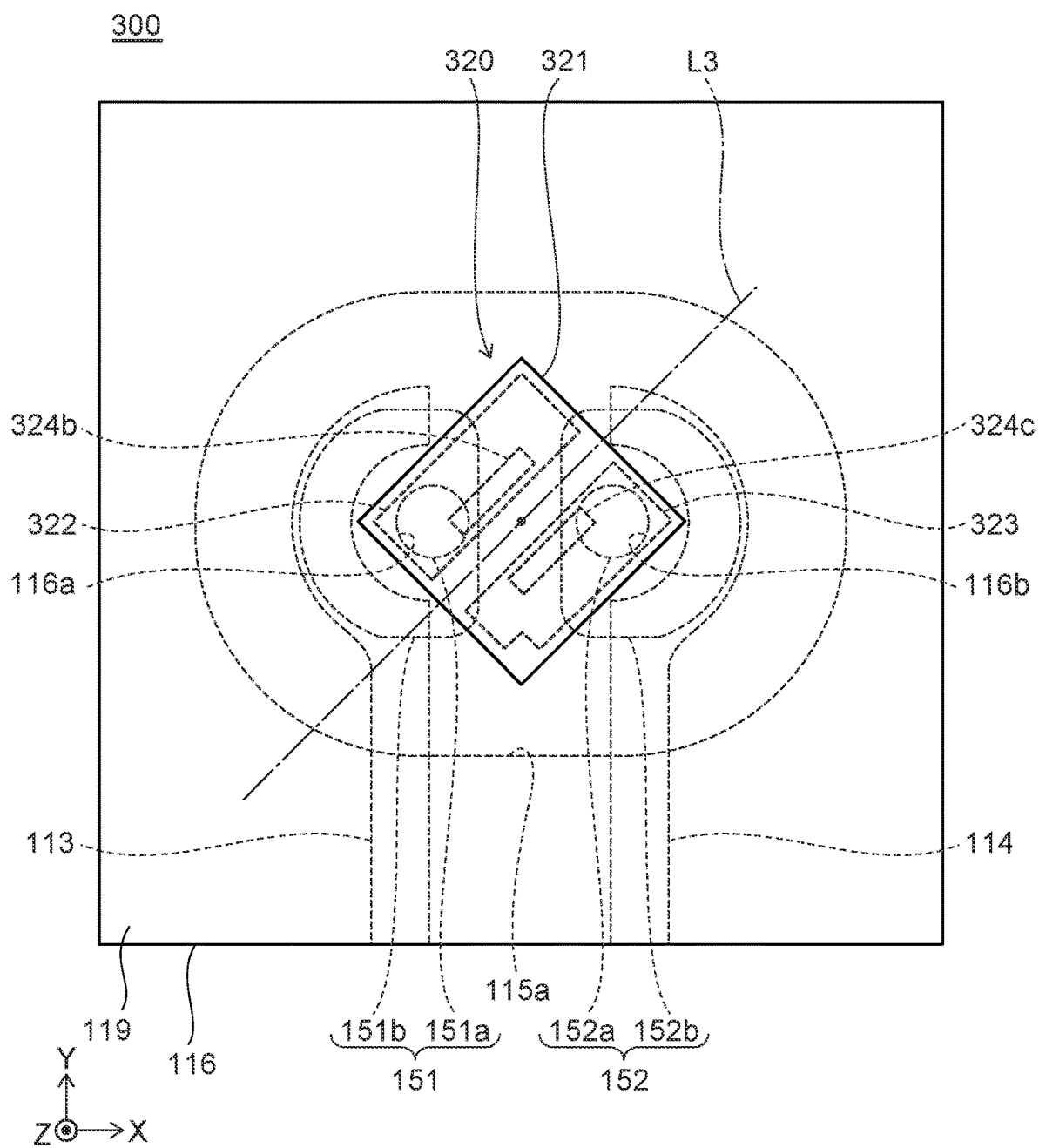
FIG. 21 is an enlarged schematic top plan view illustrating a portion of a wiring substrate, a portion of a sheet layered body, and a light source of a planar light source according to a third embodiment.

Next, a planar light source according to a third embodiment will be described. FIG. 21 is an enlarged schematic top plan view illustrating a portion of a wiring substrate, a portion of a sheet layered body, and a light source of a planar light source according to the present embodiment. A planar light source 300 according to the present embodiment differs from the planar light source 100 of the first embodiment in shapes of two electrodes 324b, 324c and shapes of two terminals 322, 323 of a light source 320. A detailed description will be given below.

The light source 320 includes a main body portion 321, the first terminal 322, and the second terminal 323. In a top plan view, the first electrode 324b has a rectangular shape including two long sides parallel with each other and two short sides parallel with each other. In a top plan view, each long side of the first electrode 324b is parallel with two of four sides of the main body portion 321 that are parallel with each other. In a top plan view, each short side of the first electrode 324b is orthogonal to the long sides of the first electrode 324b.

The shape of the second electrode 324c in a top plan view is symmetrical to that of the first electrode 324b with respect to an axis L3 passing through a center of the main body portion 321 and parallel with the two long sides of the first electrode 324b.

The shape of the first terminal 322 in a top plan view is a rectangle including two long sides parallel with each other and two short sides parallel with each other. In a top plan view, each long side of the first terminal 322 is generally parallel with the two long sides of the first electrode 324b. In a top plan view, each short side of the first terminal 322 is orthogonal to the long sides of the first terminal 322.

In a top plan view, the second terminal 323 has a rectangular shape with a recess, the rectangular shape being substantially symmetrical to a rectangular shape of the first terminal 322 with respect to the axis L3.

An area of the first terminal 322 in a top plan view is greater than an area of the first electrode 324b, and an area of the second terminal 323 in a top plan view is greater than an area of the second electrode 324c.

In a top plan view, the first terminal 322 covers the first through-hole 116a, and the second terminal 323 covers the second through-hole 116b.

As described above, the first electrode 324b and the shape of the second electrode 324c in a top plan view may have a rectangular shape. Also, the first terminal 322 and the second terminal 323 may have a rectangular shape in a top plan view.

Fourth Embodiment

Figure 22:
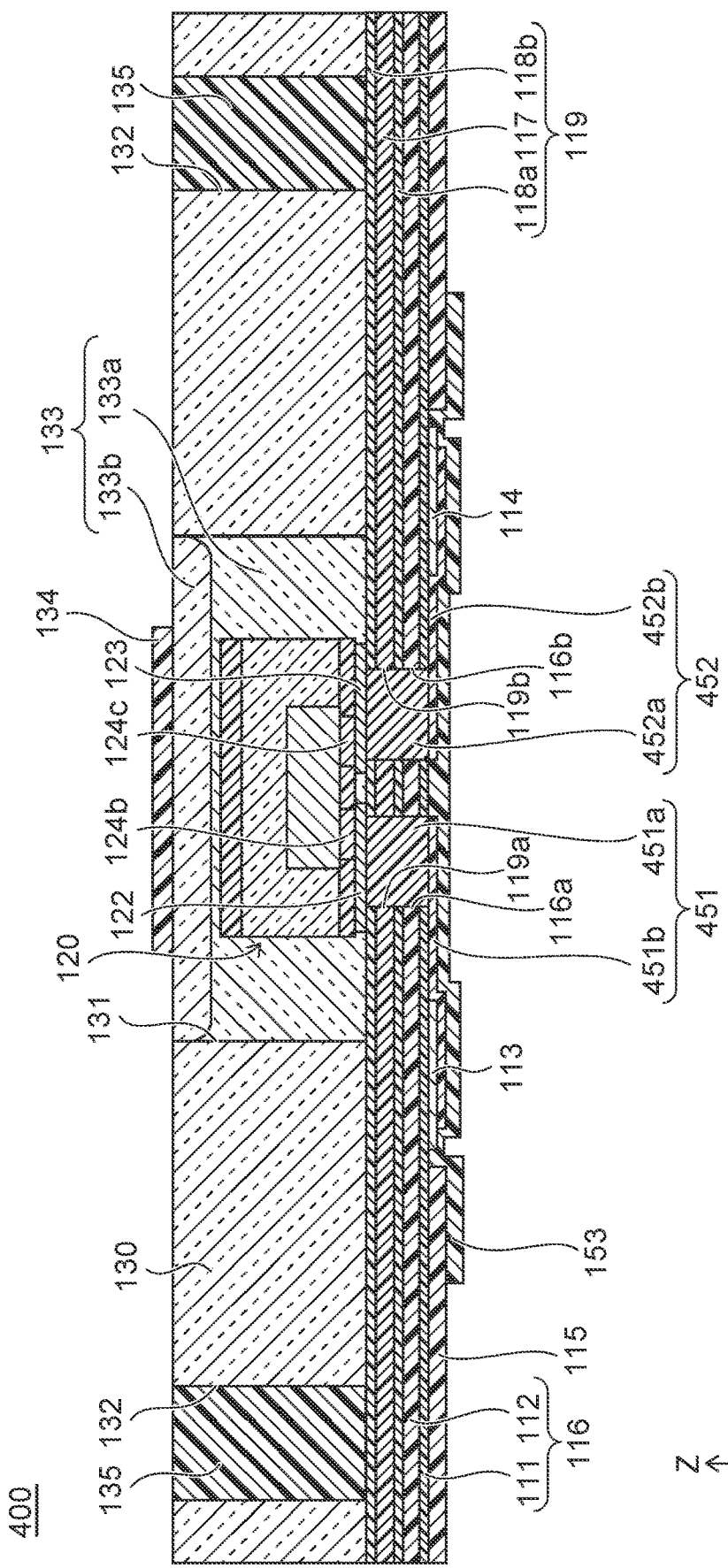
FIG. 22 is a schematic cross-sectional view illustrating a planar light source according to a fourth embodiment.

Next, a fourth embodiment will be described. FIG. 22 is a schematic cross-sectional view illustrating a portion of a planar light source according to the present embodiment. A planar light source 400 according to the present embodiment differs from the planar light source 100 according to the first embodiment in the configuration of first wiring members 451 and second wiring members 452. A detailed description will be given below.

Each first wiring member 451 includes a first portion 451a that fills the first through-hole 116a and the third through-hole 119a and is in contact with the first terminal 122, and a second portion 451b having a thin film shape, continuous with the first portion 451a, and in contact with a lower surface of the insulating layer 116 and the first wiring layer 113.

Each second wiring member 452 includes a third portion 452a that fills the second through-hole 116b and the fourth through-hole 119b and is in contact with the second terminal 123, and a fourth portion 452b having a thin film shape, continuous with the third portion 452a, and in contact with the lower surface of the insulating layer 116 and the second wiring layer 114.

The resin material constituting the first portion 451a and the resin material constituting the third portion 452a are the same, and the metal particles constituting the first portion 451a and the metal particles constituting the third portion 452a are the same. The resin material constituting the second portion 451b and the resin material constituting the fourth portion 452b are the same, and the metal particles constituting the second portion 451b and the metal particles constituting the fourth portion 452b are the same.

On the other hand, the resin material constituting the first portion 451a differs from the resin material constituting the second portion 451b. Further, a material of the metal particles constituting the first portion 451a differ from a material of the metal particles constituting the second portion 451b. The resin material and/or the material of the metal particles of the first portion 451a and the second portion 451b may be the same. With the material constituting the first portion 451a of the first wiring member 451 and the material constituting the second portion 451b of the first wiring member 451 that are different from each other, the first portion 451a and the second portion 451b can have different mechanical properties from each other, such as flexibility or electrical properties such as conductivity. The same applies to the second wiring member 452.

Figure 23:
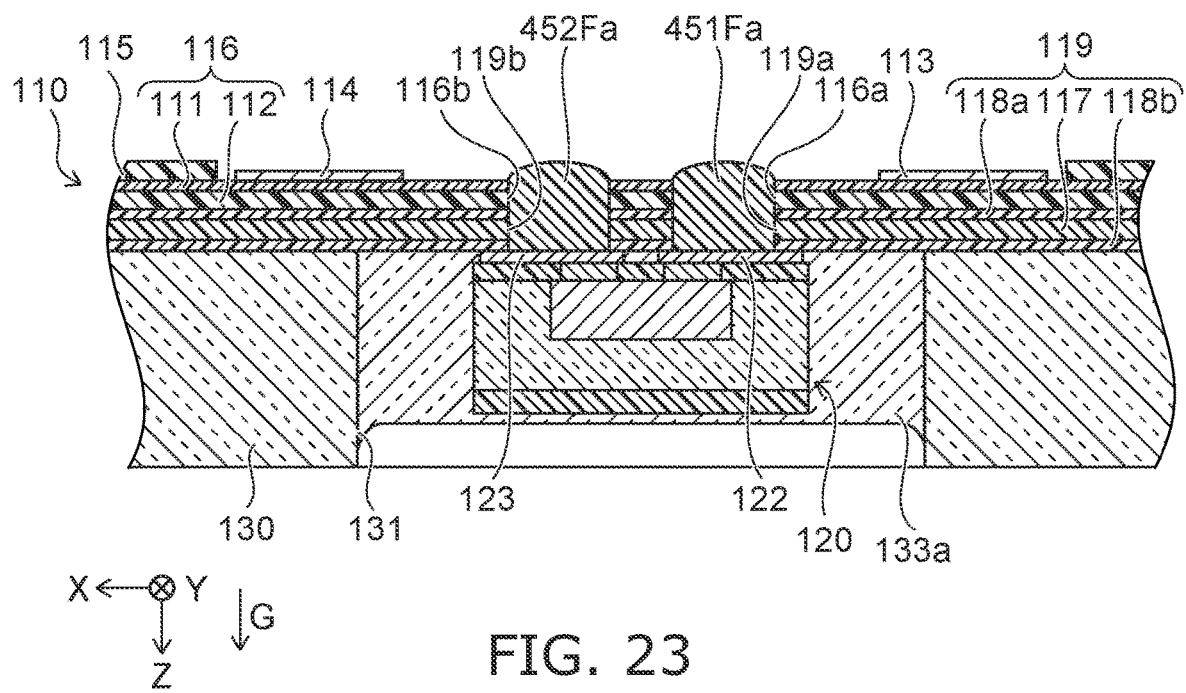
FIG. 23 is a schematic cross-sectional view illustrating a method of manufacturing the planar light source.
Figure 24:
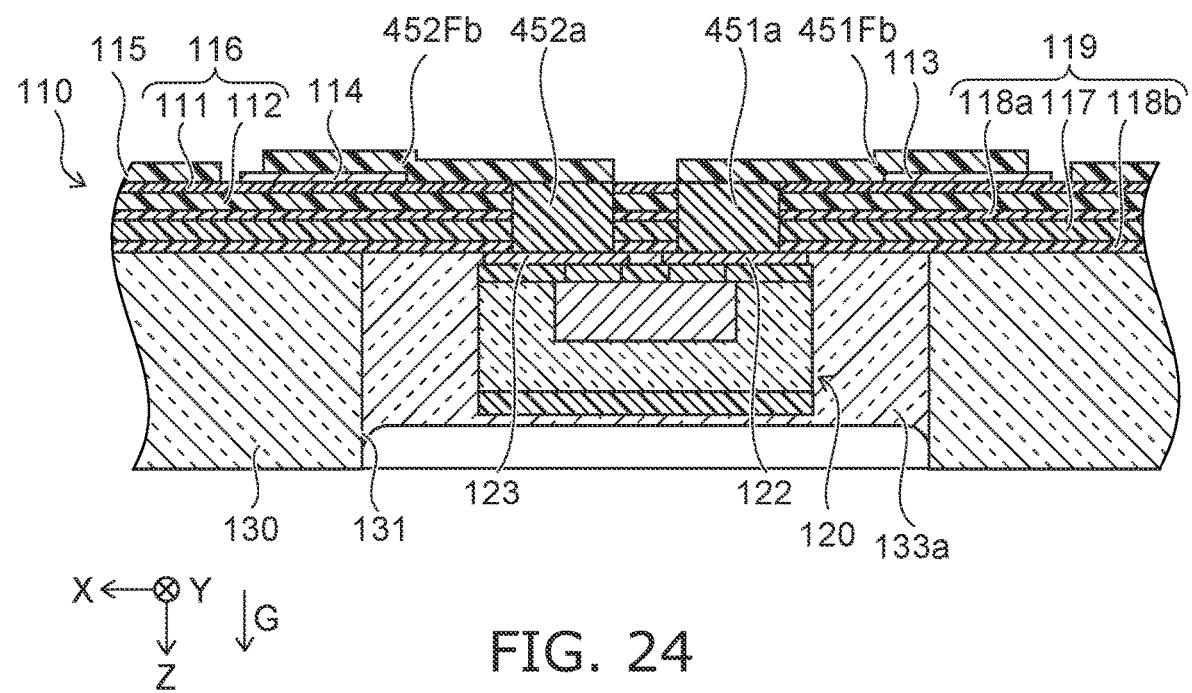
FIG. 24 is a schematic cross-sectional view illustrating the method of manufacturing the planar light source.
Figure 25:
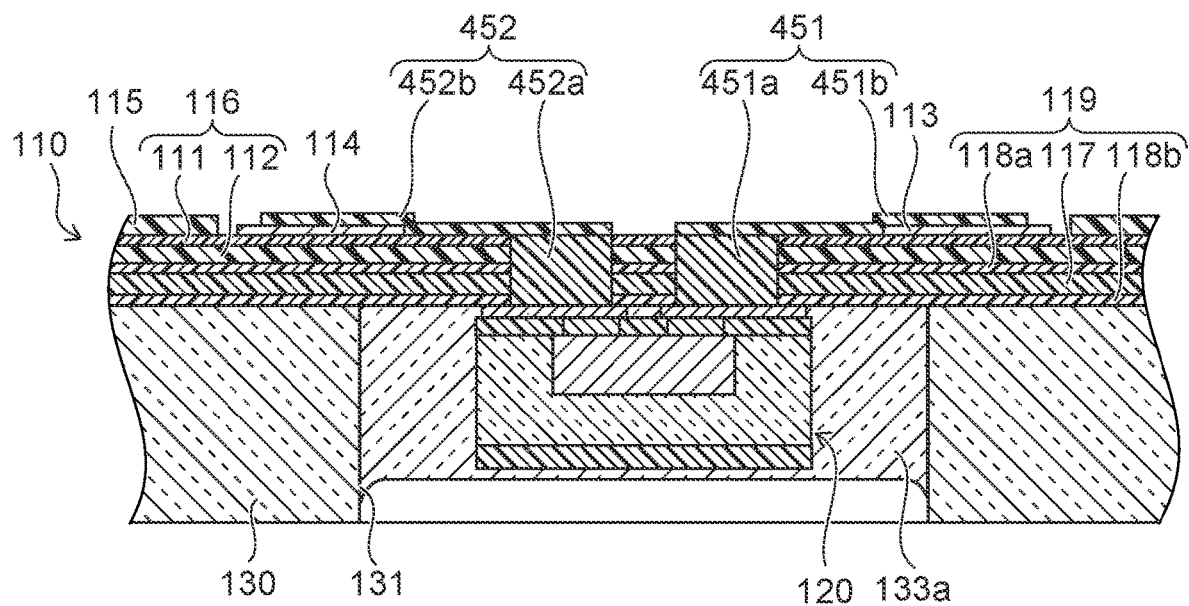
FIG. 25 is a schematic cross-sectional view illustrating the method of manufacturing the planar light source.

Next, a method of manufacturing the planar light source 400 according to the present embodiment will be described. FIG. 23 is a schematic cross-sectional view illustrating the method of manufacturing the planar light source. FIG. 24 is a schematic cross-sectional view illustrating the method of manufacturing the planar light source. FIG. 25 is a schematic cross-sectional view illustrating the method of manufacturing the planar light source.

After the first resin member 133Fa is disposed in the light source arrangement portion 131 and cured, as illustrated in FIG. 23, the first through-hole 116a and the third through-hole 119a are filled with a first conductive paste 451Fa, and the second through-hole 116b and the fourth through-hole 119b are filled with a second conductive paste 452Fa. The conductive pastes 451Fa, 452Fa are composed of the same material and, similarly to the conductive pastes 151F, 152F in the first embodiment, include an uncured resin material and one or more types of metal particles dispersed in the resin material. The conductive pastes 451Fa, 452Fa may be disposed to protrude from the respective through-holes 116a, 116b in anticipation of shrinkage when the conductive pastes 451Fa, 452Fa are cured.

Subsequently, as illustrated in FIG. 24, the first conductive paste 451Fa and the second conductive paste 452Fa are cured. The cured product of the first conductive paste 451Fa is equivalent to the first portion 451a of the first wiring member 451, and the cured product of the second conductive paste 452Fa is equivalent to the third portion 452a of the second wiring member 452.

Subsequently, a third conductive paste 451Fb is disposed to be in contact with the insulating layer 116, the first portion 451a which is the cured product of the first conductive paste 451Fa, and the first wiring layer 113, and a fourth conductive paste 452Fb is disposed to be contact with the insulating layer 116, the third portion 452a which is the cured product of the second conductive paste 452Fa, and the second wiring layer 114.

Subsequently, as illustrated in FIG. 25, the third conductive paste 451Fb and the fourth conductive paste 452Fb are cured. The cured product of the third conductive paste 451Fb is equivalent to the second portion 451b of the first wiring member 451, and the cured product of the fourth conductive paste 452Fb is equivalent to the fourth portion 452b of the second wiring member 452.

The subsequent steps are similar to those of the method of manufacturing the planar light source 100 according to the first embodiment, and thus description thereof will be omitted.

As described above, in the method of manufacturing the planar light source 400 according to the present embodiment, the step of forming the first wiring member 451 and the second wiring member 452 includes filling the first through-hole 116a with the first conductive paste 451Fa and filling the second through-hole 116b with the second conductive paste 452Fa, curing the first conductive paste 451Fa and the second conductive paste 452Fa, disposing the third conductive paste 451Fb such that the third conductive paste 451 Fb is in contact with the cured product of the first conductive paste 451Fa and the first wiring layer 113, and disposing the fourth conductive paste 452Fb such that the fourth conductive paste 452Fb is in contact with the cured product of the second conductive paste 452Fa and the second wiring layer 114, and curing the third conductive paste 451Fb and the fourth conductive paste 452Fb. Thus, the first portion 451a and the second portion 451b of the first wiring member 451 need not be formed simultaneously. Further, the third portion 452a and the fourth portion 452b of the second wiring member 452 need not be formed simultaneously. According to such a method, different materials can be used for a material of the first conductive paste 451Fa and the second conductive paste 452Fa and a material of the third conductive paste 451Fb and the fourth conductive paste 452Fb.

The third conductive paste and the fourth conductive paste may be disposed before the first conductive paste and second conductive paste are cured. That is, the step of forming the first wiring member and the second wiring member may include filling the first through-hole with the first conductive paste and filling the second through-hole with the second conductive paste, disposing the third conductive paste such that the third conductive paste is in contact with the first conductive paste and the first wiring layer and disposing the fourth conductive paste such that the fourth conductive paste is in contact with the second conductive paste and the second wiring layer, and curing the first conductive paste, the second conductive paste, the third conductive paste, and the fourth conductive paste.

Fifth Embodiment

Figure 26:
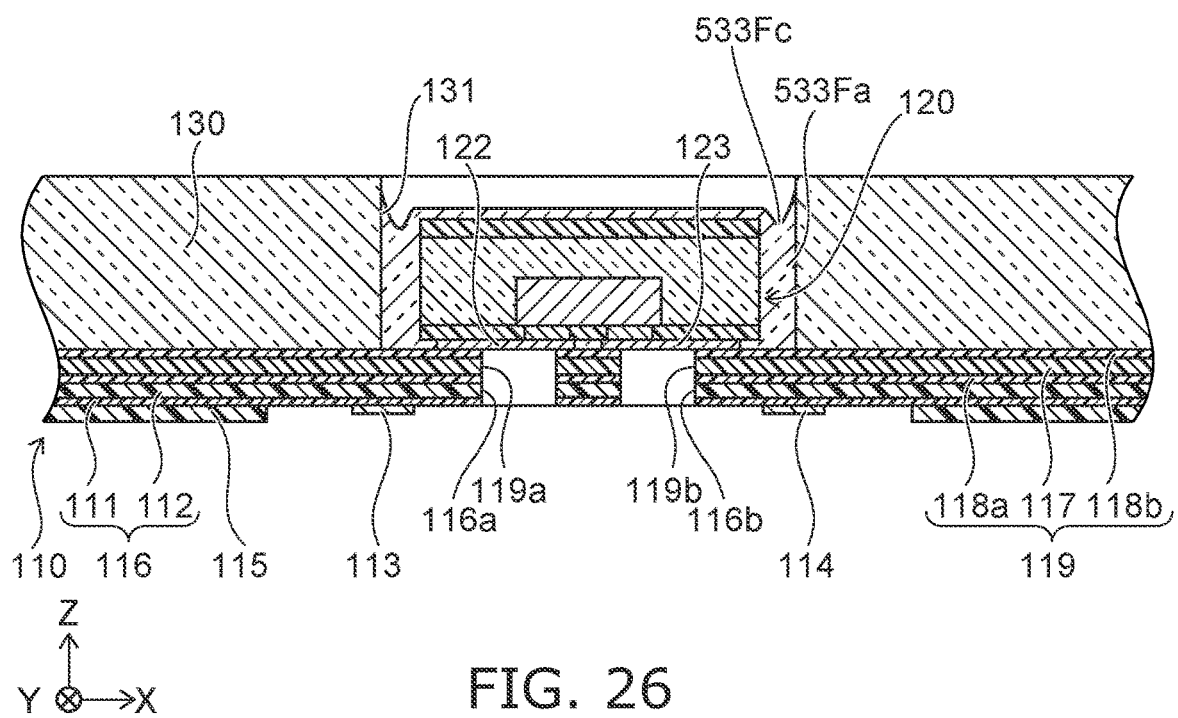
FIG. 26 is a schematic cross-sectional view illustrating a method of manufacturing a planar light source according to a fifth embodiment.

Next, a fifth embodiment will be described. FIG. 26 is a schematic cross-sectional view illustrating a method of manufacturing a planar light source according to a fifth embodiment. The method of manufacturing the planar light source according to the present embodiment differs from the method of manufacturing the planar light source 100 of the first embodiment in a shape of a cured product of a first resin member 533Fa that allows for reinforcing the temporary fixing of the light source 120 to the wiring substrate 110. A detailed description will be given below.

After the sheet layered body 119, the light guide member 130, and the light source 120 are disposed on the wiring substrate 110, the light-transmissive first resin member 533Fa is disposed in the gap between the lateral surface of the light source arrangement portion 131 and the light source 120, reinforcing the temporary fixing of the light source 120 to the wiring substrate 110 by the adhesive sheet 118b and cured.

In the present embodiment, the light-transmissive first resin member 533Fa seals the light source 120, and is disposed such that an upper surface of the light-transmissive first resin member 533Fa is located below the upper surface of the light guide member 130 while. The cured product of the first resin member 533Fa is equivalent to the first layer of the light-transmissive member. Further, on the upper surface of the first resin member 533Fa, a region 533Fc located between the lateral surface of the light source arrangement portion 131 and the light source 120 is recessed downward. A portion of the region 533Fc is located below the upper surface of the light source 120.

Subsequently, the conductive pastes 151F, 152F are disposed in the manner as in the first embodiment. At this time, the gap between lateral surfaces of the light source arrangement portion 131 and the light source 120 is blocked by the first resin member 533Fa. With this structure, leakage of the conductive pastes 151F, 152F into the light source arrangement portion 131 can be suppressed. The subsequent steps are similar to those of the planar light source 100 according to the first embodiment, and therefore description thereof will be omitted.

Sixth Embodiment

Figure 27:
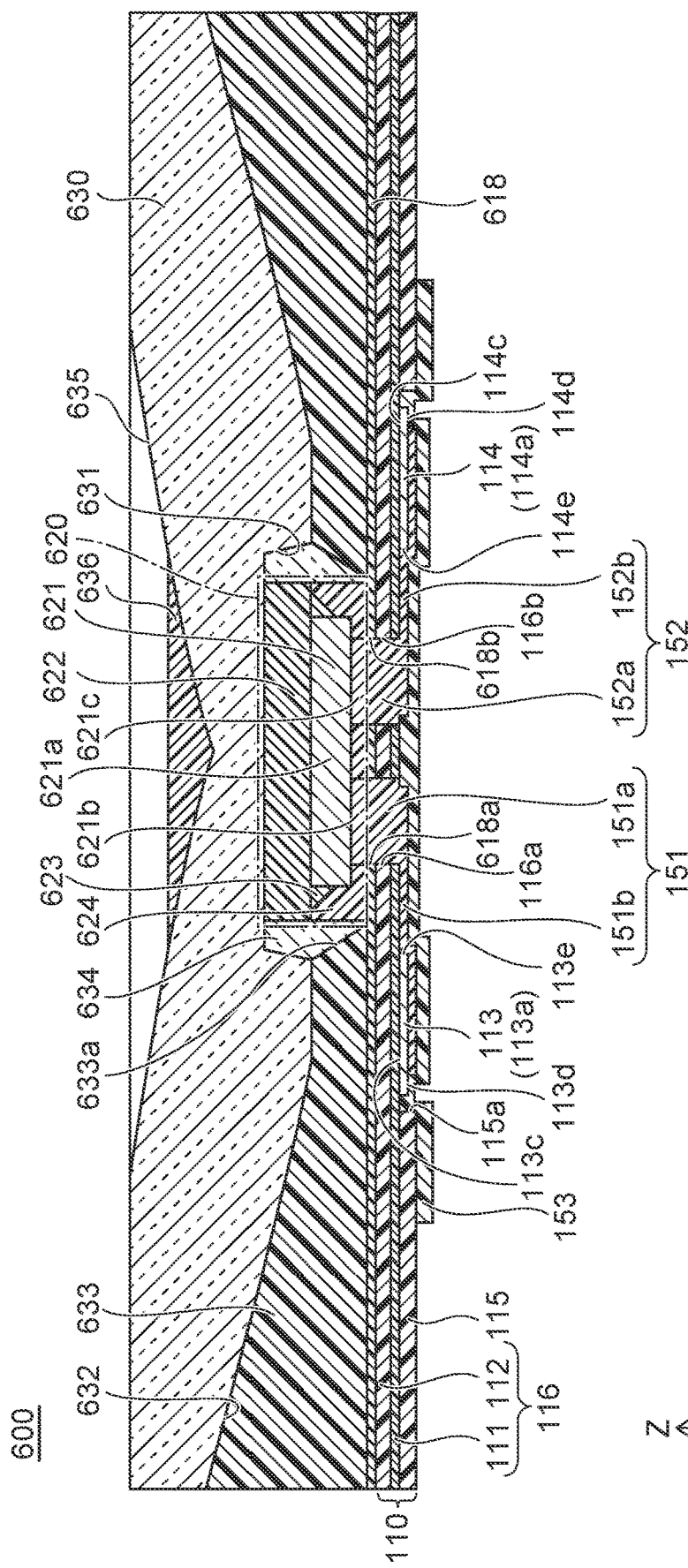
FIG. 27 is a schematic cross-sectional view illustrating a planar light source according to a sixth embodiment.

Next, a sixth embodiment will be described. FIG. 27 is a schematic cross-sectional view illustrating a portion of a planar light source according to the present embodiment. A planar light source 600 according to the present embodiment differs from the planar light source 100 according to the first embodiment in the configuration of light sources 620 and a light guide member 630.

Each light source 620 includes a light-emitting element 621, a wavelength conversion member 622, a light-transmissive member 623, and a covering layer 624.

The light-emitting element 621 includes a light-emitting portion 621a, and a first electrode 621b and a second electrode 621c disposed below the light-emitting portion 621a and separated from each other. The wavelength conversion member 622 is disposed on the light-emitting element 621.

The light-transmissive member 623 is disposed below the wavelength conversion member 622 to surround the light-emitting portion 621a. The covering layer 624 is disposed at an outer periphery of the light-transmissive member 623 and below the light-emitting portion 621a. An outer surface of the light-transmissive member 623 may be an inclined surface.

A light guide member 630 includes a light source arrangement portion 631 in which the light source 620 is disposed. The light source arrangement portion 631 in the present embodiment is a recess defined in a lower surface of the light guide member 630.

Further, a demarcation groove 632 is formed in the light guide member 630, surrounding each of the light sources 620. The demarcation groove 632 in the present embodiment is a recess defined in the lower surface of the light guide member 630.

A demarcation member 633 is disposed on the lower surface of the light guide member 630 and in the demarcation groove 632. A through-hole 633a that communicates with the light source arrangement portion 631 of the light guide member 630 is defined in the demarcation member 633. A light-transmissive member 634 is provided in the light source arrangement portion 631 and the through-hole 633a. The demarcation member 633 is adhered to the wiring substrate 110 by an adhesive sheet 618.

A third through-hole 618a and a fourth through-hole 618b are defined in the adhesive sheet 618. The third through-hole 618a is located directly above the first through-hole 116a. The fourth through-hole 618b is located directly above the second through-hole 116b.

Further, the upper surface of the light guide member 630 includes a plurality of recessed portions 635. Each recessed portion 635 is located directly above the corresponding light source 620. A light adjustment member 636 is provided in each recessed portion 635.

Figure 28:
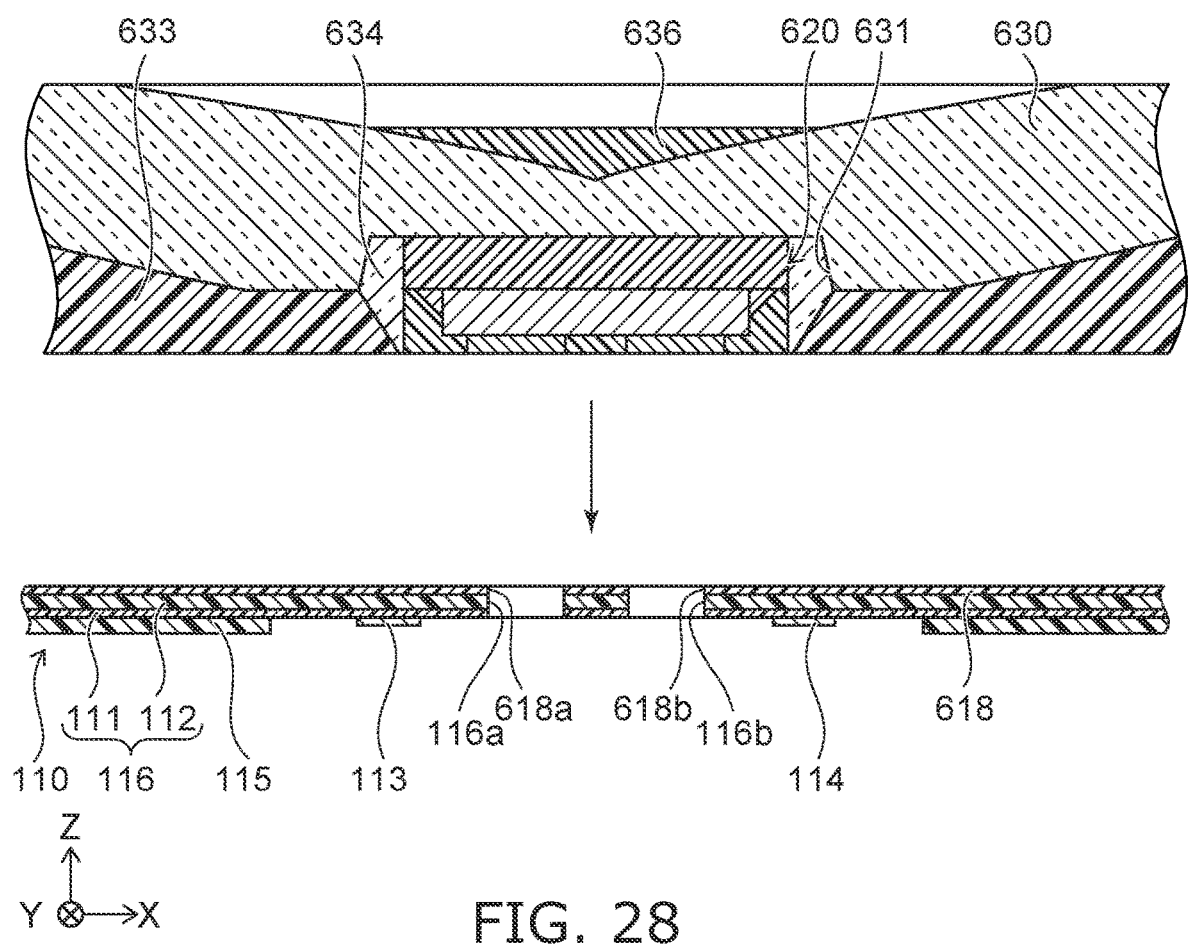
FIG. 28 is a schematic cross-sectional view illustrating a method of manufacturing the planar light source.
Figure 29:
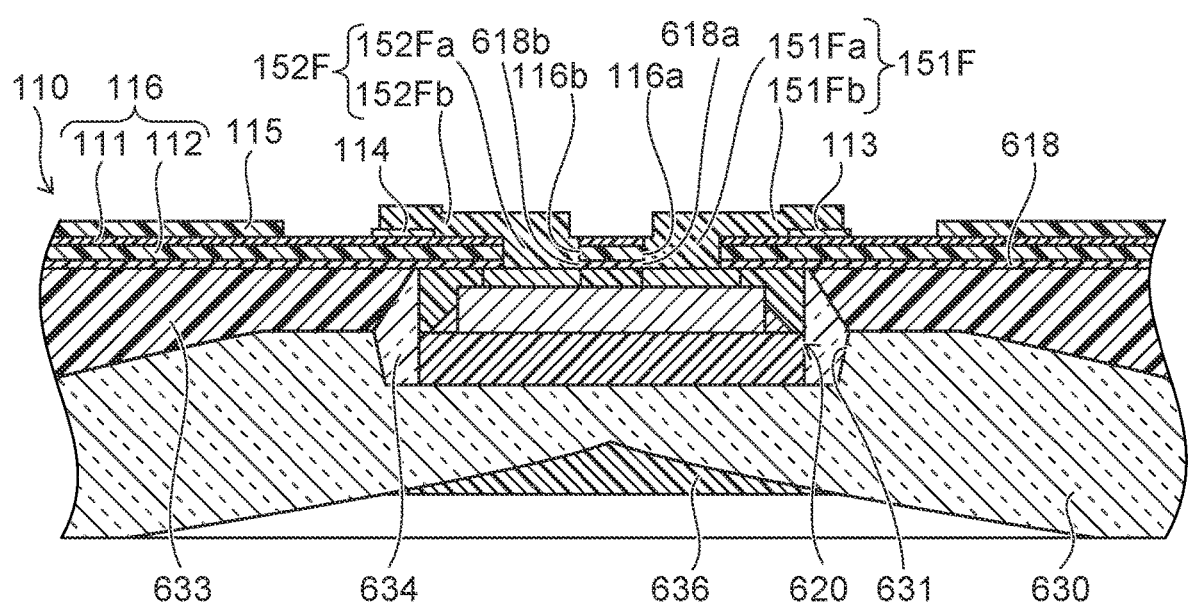
FIG. 29 is a schematic cross-sectional view illustrating the method of manufacturing the planar light source.
Figure 29:
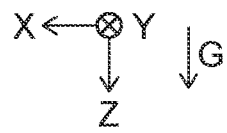

Next, a method of manufacturing the planar light source 600 according to the present embodiment will be described. FIG. 28 is a schematic cross-sectional view illustrating the method of manufacturing the planar light source. FIG. 29 is a schematic cross-sectional view illustrating the method of manufacturing the planar light source. As illustrated in FIG. 28, the wiring substrate 110 is provided.

Subsequently, the light guide member 630 and the light source 620 are disposed above the wiring substrate 110. In the present embodiment, the light source 620, the light guide member 630, the demarcation member 633, the light-transmissive member 634, and the light adjustment member 636 have been integrated as a light-emitting module before being disposed above the wiring substrate 110, and are adhered to the wiring substrate 110 by the adhesive sheet 618. The light adjustment member 636 may be provided on the light guide member 630 after the light source 620 and the light guide member 630 are disposed above the wiring substrate 110.

Subsequently, as illustrated in FIG. 29, the first conductive paste 151F is disposed to fill the first through-hole 116a and the third through-hole 618a and to be contact with the insulating layer 116 and the first wiring layer 113. Further, the second conductive paste 152F is disposed to fill the second through-hole 116b and the fourth through-hole 618b and to be contact with the insulating layer 116 and the second wiring layer 114.

The subsequent steps are similar to those in the method of manufacturing the planar light source 100 according to the first embodiment, and thus description thereof will be omitted.

As described above, the light source arrangement portion 631 may be a recess defined in the lower surface of the light guide member 630. Further, when the planar light source 600 is manufactured, the light source 620 and the light guide member 630 may be integrated and then disposed above the wiring substrate 110.

While an example in which the light source 620 does not include the first terminal and the second terminal is described in the present embodiment, the light source 620 may further include the first terminal and the second terminal.

Further, a case in which the first through-hole 116a and the second through-hole 116b of the wiring substrate 110 are located below the light source 620 is described in the present embodiment, but other configurations may be alternatively employed. That is, the first through-hole 116a and the second through-hole 116b of the wiring substrate 110 need not be located below the light source 620. When the first through-hole 116a and the second through-hole 116b of the wiring substrate 110 are not located below the light source 620, a conductive layer electrically connected to each of the electrodes 621a, 621b of the light source may be disposed on the upper surface of the wiring substrate 110 or a lower surface of the demarcation member 633, and the conductive layer may be connected to the first wiring member 151 and the second wiring member 152.

Seventh Embodiment

Figure 30:
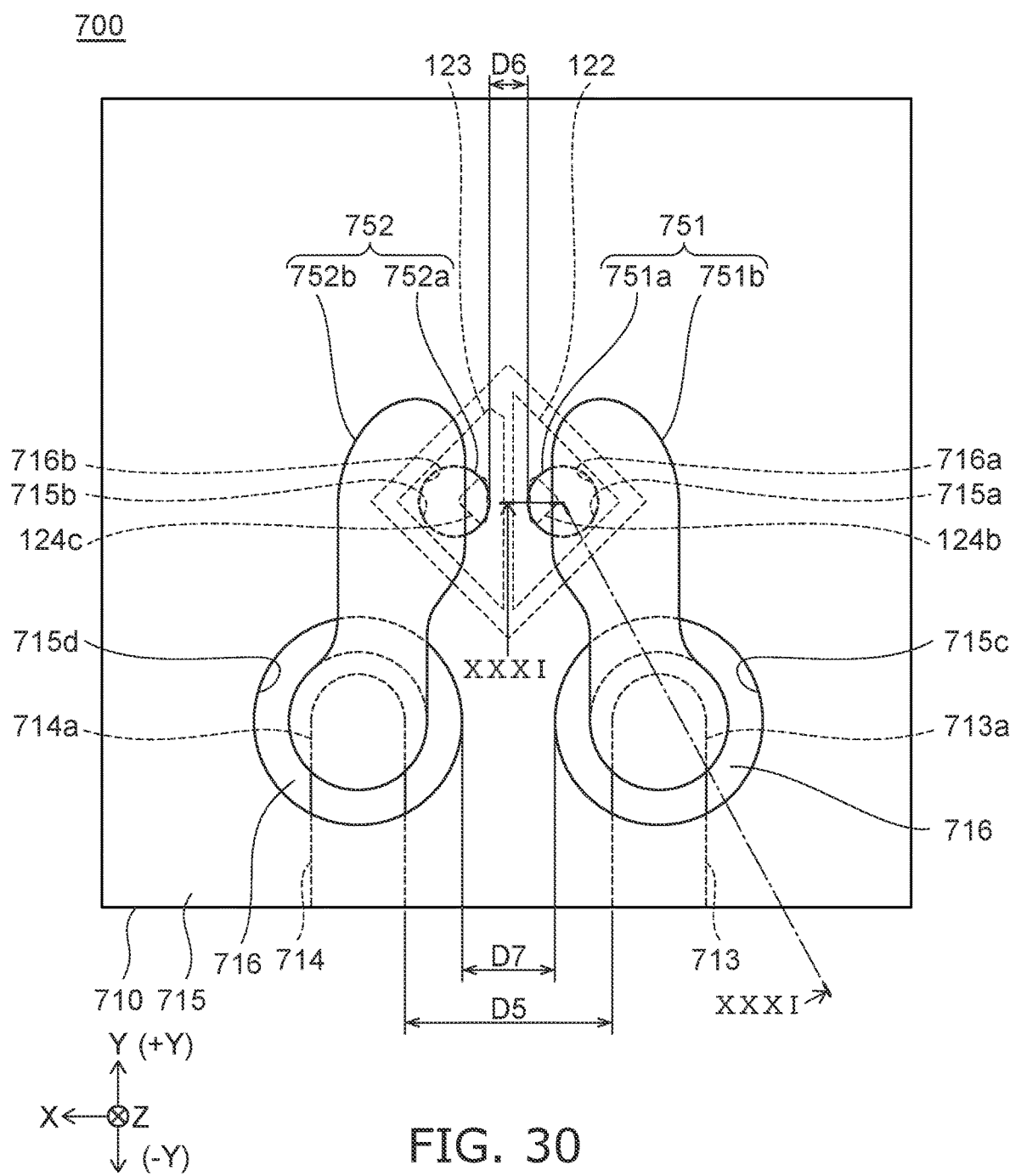
FIG. 30 is an enlarged schematic bottom plan view illustrating a light source and a portion of a wiring substrate of a planar light source according to a seventh embodiment.
Figure 31A:
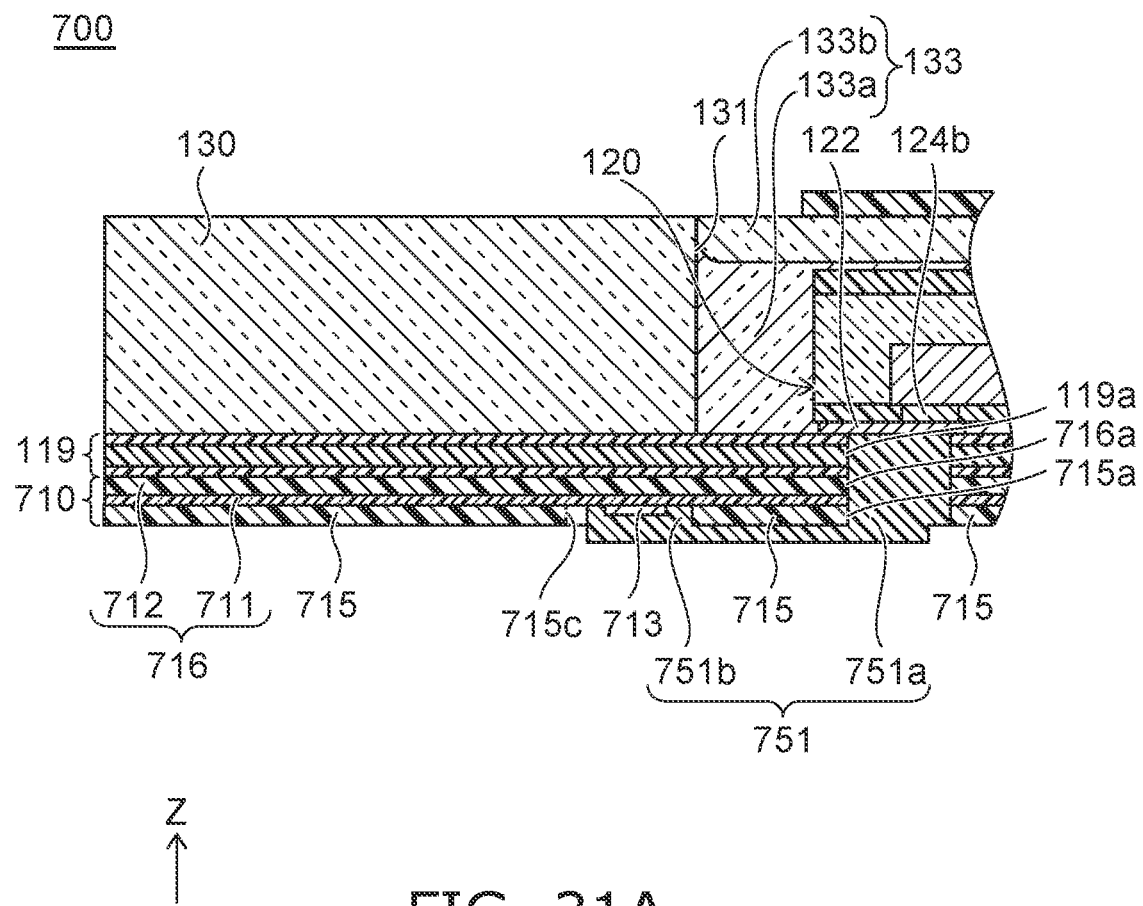
FIG. 31A is a schematic cross-sectional view taken along line XXXI-XXXI in FIG. 30.

Next, a seventh embodiment will be described. FIG. 30 is an enlarged schematic bottom plan view illustrating a light source and a portion of a wiring substrate of a planar light source according to the present embodiment. FIG. 31A is a schematic cross-sectional view taken along line XXXI-XXXI in FIG. 30. A planar light source 700 according to the present embodiment differs from the planar light source 100 according to the first embodiment in the configuration of a wiring substrate 710.

As illustrated in FIG. 30 and FIG. 31A, the wiring substrate 710 includes a base layer 711, a first covering layer 712 disposed on the base layer 711, a first wiring layer 713 and a second wiring layer 714 disposed below the base layer 711, and a second covering layer 715 disposed below the base layer 711. The base layer 711 and the first covering layer 712 are equivalent to an insulating layer 716.

The insulating layer 716 is defines a first through-hole 716a and a second through-hole 716b separated from each other. Each of the through-holes 716a, 716b extends through the insulating layer 716 in the Z direction.

As illustrated in FIG. 30, the first wiring layer 713 and the second wiring layer 714 are not arranged at two opposite side to each other with respect to the first through-hole 716a and the second through-hole 716b, and are separated from the first through-hole 716a and the second through-hole 716b in the Y direction. Each of the wiring layers 713, 714 extends in the Y direction in the present embodiment. A distance D5 between a tip portion 713a of the first wiring layer 713 and a tip portion 714a of the second wiring layer 714 is longer than a distance D6 between the first through-hole 716a and the second through-hole 716b. The distance between the tip portion of the first wiring layer and the tip portion of the second wiring layer and the distance between the first through-hole and the second through-hole may be in other size relationship than that described above.

The second covering layer 715 covers a region of a lower surface of the insulating layer 716 around the first through-hole 716a and the second through-hole 716b such that the first through-hole 716a and the second through-hole 716b are exposed. Further, the second covering layer 715 exposes portions of the first wiring layer 713 and the second wiring layer 714.

More specifically, the second covering layer 715 defines a first opening 715a exposing the first through-hole 716a and a second opening 715b exposing the second through-hole 716b. The first opening 715a is located directly below the first through-hole 716a. The second opening 715b is located directly below the second through-hole 716b. A shape of the first opening 715a and the second opening 715b in a top plan view is, for example, substantially the same as that of the first through-hole 716a and the second through-hole 716b, and has, for example, a circular or polygonal shape such as a triangular shape. The first opening and the second opening may have other appropriate shape in a top plan view. As illustrated in FIG. 30 and FIG. 31A, an opening diameter of the first opening 715a is the same as an opening diameter of the first through-hole 716a. Similarly, as illustrated in FIG. 30 and FIG. 31A, an opening diameter of the second opening 715b is the same as an opening diameter of the second through-hole 716b.

Further, the second covering layer 715 defines a third opening 715c exposing the tip portion 713a of the first wiring layer 713 and a fourth opening 715d exposing a tip portion 713b of the second wiring layer 714. Each of the openings 715c, 715d has a circular shape in a top plan view. The third opening and the fourth opening may have a semicircular or polygonal shape such as a rectangular shape in a top plan view. Further, portions of the first wiring layer and the second wiring layer may be exposed through a single opening.

The third opening 715c and the fourth opening 715d are separated from the first opening 715a and the second opening 715b. A distance D7 between the third opening 715c and the fourth opening 715d is longer than the distance D6 between the first through-hole 716a and the second through-hole 716b. The distance between the third opening and the fourth opening and the distance between the first through-hole and the second through-hole may be in other size relationship.

As illustrated in FIG. 31A, a first wiring member 751 includes a first portion 751a that fills the first through-hole 716a, the third through-hole 119a, and the first opening 715a, and a second portion 751b extending on a lower surface of the second covering layer 715 and in contact with a portion of the first wiring layer 713 exposed from the second covering layer 715.

The first portion 751a is in contact with the first terminal 122 and electrically connected to the first electrode 124b via the first terminal 122. The second portion 751b is in contact with the tip portion 713a of the first wiring layer 713 in the present embodiment.

A second wiring member 752 includes a third portion 752a that fills the second through-hole 716b, the fourth through-hole 119b, and the second opening 715b, and a fourth portion 752b extending on the lower surface of the second covering layer 715 and in contact with a portion of the second wiring layer 714 exposed from the second covering layer 715.

The third portion 752a is in contact with the second terminal 123 and electrically connected to the second electrode 124c via the second terminal 123. The fourth portion 752b is in contact with the tip portion 714a of the second wiring layer 714 in the present embodiment.

The planar light source 700 may further include a covering layer that covers portions of the first wiring member 751, the second wiring member 752, the first wiring layer 713, and the second wiring layer 714 exposed from the second covering layer 715.

While the third opening 715c and the fourth opening 715d are located at the −Y direction side with respect to the first opening 715a and the second opening 715b in the present embodiment as illustrated in FIG. 30, the third opening 715c and the fourth opening 715d may be located in other positions. For example, the third opening 715c and the fourth opening 715d may be located at the +Y direction side with respect to the first opening 715a and the second opening 715b. Alternatively, the third opening 715c may be located at the −Y direction side with respect to the first opening 715a and the second opening 715b, and the fourth opening 715d may be located at the +Y direction side with respect to the first opening 715a and the second opening 715b. Conversely, the fourth opening 715d may be located at the −Y direction side with respect to the first opening 715a and the second opening 715b, and the third opening 715c may be located at the +Y direction side with respect to the first opening 715a and the second opening 715b. Further, the third opening 715c and the fourth opening 715d may be located on a virtual line passing through the first opening 715a and the second opening 715b such that the first opening 715a and the second opening 715b is located between the third opening 715c and the fourth opening 715d.

Figure 31B:
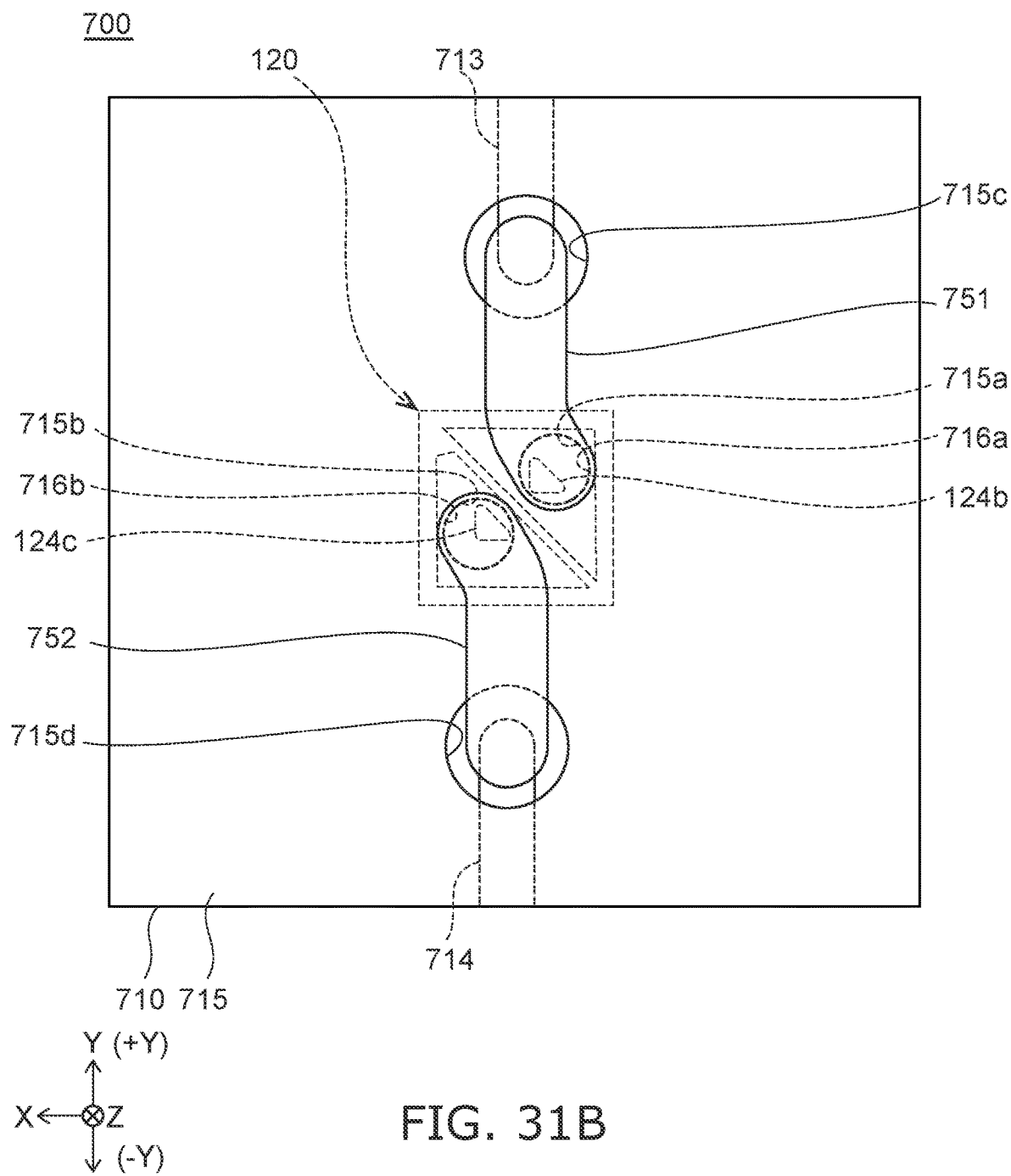
FIG. 31B is a schematic bottom plan view illustrating other examples of the light source and the wiring substrate.

FIG. 31B is a schematic bottom plan view illustrating another example of the light source and the wiring substrate. As illustrated in FIG. 31B, the light source 120 may be disposed with the two electrodes 124b, 124c aligned in a direction intersecting the X direction and the Y direction. In this case, the third opening 715c may be located at the +Y direction side with respect to the first opening 715a and the second opening 715b, and the fourth opening 715d may be located at the −Y direction side with respect to the first opening 715a and the second opening 715b. Note that the third opening may be located at the −Y direction side with respect to the first opening and the second opening, and the fourth opening may be located at the +Y direction side with respect to the first opening and the second opening.

Figure 32A:
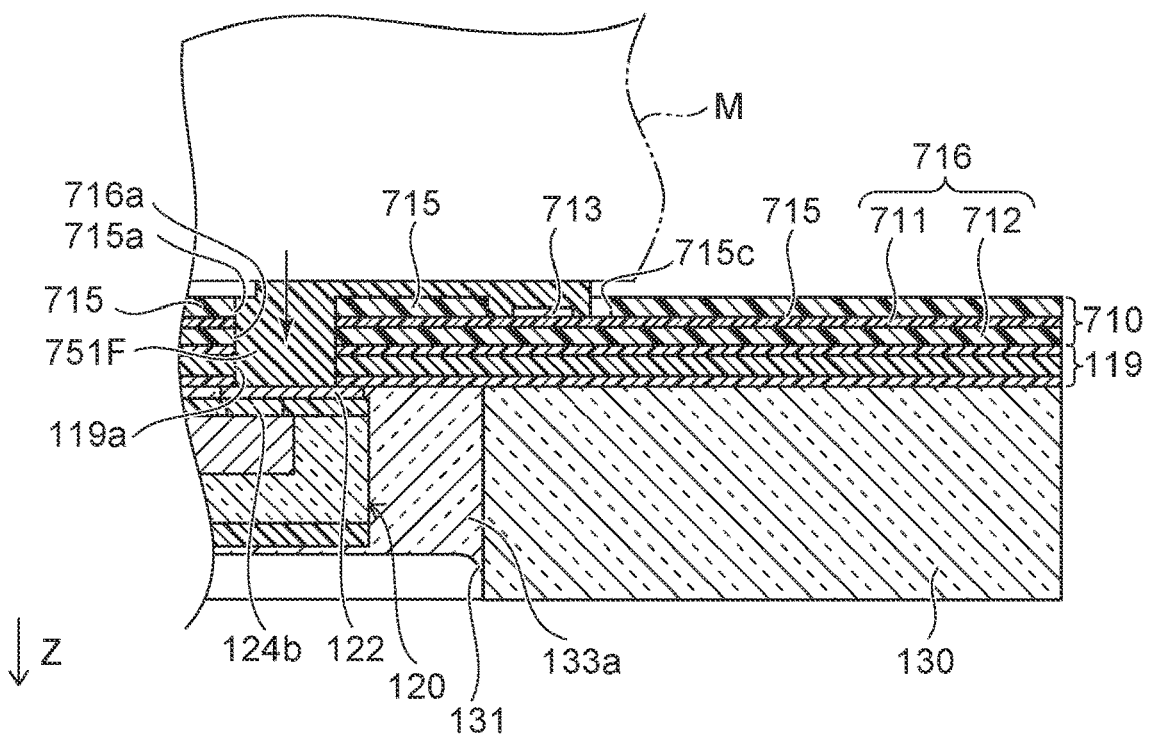
FIG. 32A is a schematic cross-sectional view illustrating a method of manufacturing the planar light source.
Figure 32B:
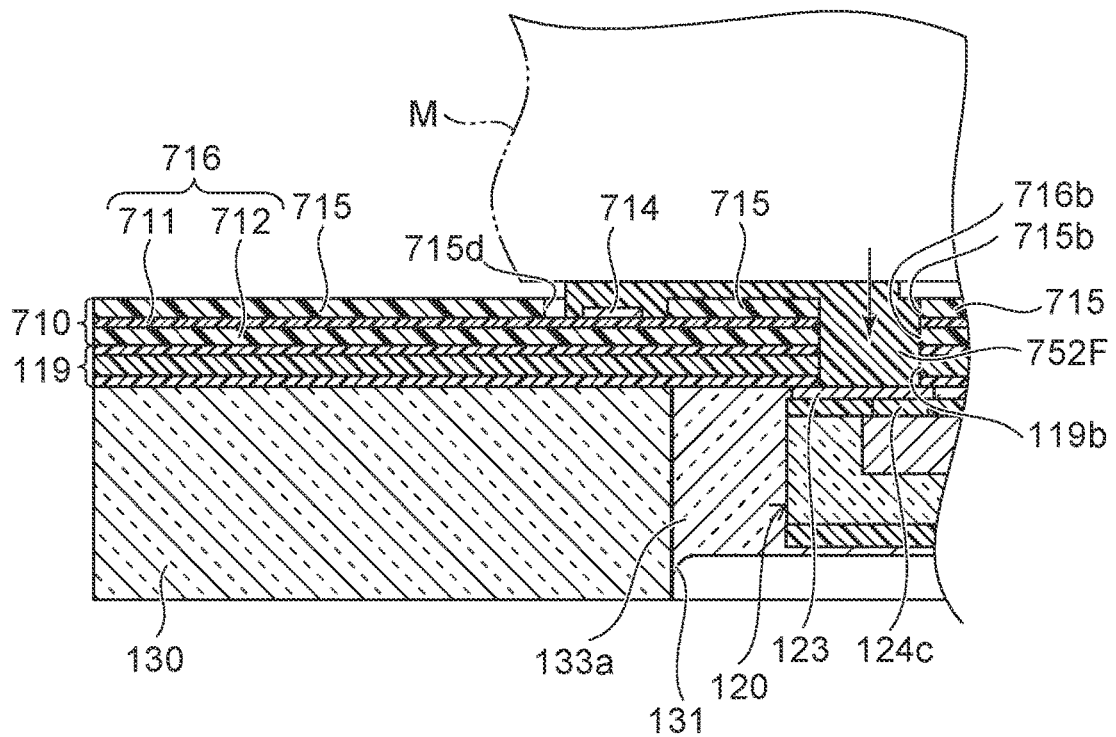
FIG. 32B is a schematic cross-sectional view illustrating the method of manufacturing the planar light source.

Next, a method of manufacturing the planar light source 700 according to the present embodiment will be described. FIG. 32A is a schematic cross-sectional view illustrating the method of manufacturing the planar light source. FIG. 32B is a schematic cross-sectional view illustrating the method of manufacturing the planar light source.

First, the wiring substrate 710 is provided. In the wiring substrate 710 provided in the example herein, the second covering layer 715 covers peripheries of the first through-hole 716a and the second through-hole 716b on the lower surface of the insulating layer 716, exposing the first through-hole 716a and the second through-hole 716b, and exposes a portion of the first wiring layer 713 and a portion of the second wiring layer 714.

Subsequently, as in the first embodiment, the light guide member 130 and the light source 120 are disposed above the wiring substrate 710.

Subsequently, the first wiring member 751 and the second wiring member 752 are formed. Specifically, as illustrated in FIG. 32A, a first conductive paste 751F is disposed to fill the first through-hole 716a, the third through-hole 119a, and the first opening 715a, and to be in contact with the first wiring layer 713 by way of the lower surface of the second covering layer 715. Similarly, as illustrated in FIG. 32B, a second conductive paste 752F is disposed to fill the second through-hole 716b, the fourth through-hole 119b, and the second opening 715b, to extend on the lower surface of the second covering layer 715, and to be contact with the second wiring layer 714. The first conductive paste 751F and the second conductive paste 752F may be disposed simultaneously or disposed separately.

The conductive pastes 751F, 752F are disposed on the wiring substrate 710 by printing using a squeegee or a pressing device, for example. As described above, the second covering layer 715 surrounds the first through-hole 716a on the lower surface of the insulating layer 716. Therefore, the first conductive paste 751F is easily pressed into the first through-hole 716a, the third through-hole 119a, and the first opening 715a by a pressing device M such as a printing machine. The same applies to the second conductive paste 752F. The pressing device M can include a roller in an interior thereof. By rotation of this roller, the conductive paste filled in the pressing device M is supplied in a pressed state. This allows for facilitating pressing the first conductive paste 751F into the first through-hole 716a, the third through-hole 119a, and the first opening 715a. Further, the same applies to the second conductive paste 752F.

The subsequent steps are similar to those in the method of manufacturing the planar light source 100 according to the first embodiment, and thus description thereof will be omitted. The cured product of the first conductive paste 751F is equivalent to the first wiring member 751. The cured product of the second conductive paste 752F is equivalent to the second wiring member 752. Alternatively, after disposing the first conductive paste that becomes the first portion 751a when cured and the second conductive paste that becomes the third portion 752a when cured, the third conductive paste that becomes the second portion 751b when cured and the fourth conductive paste that becomes the fourth portion 752b when cured may be disposed.

The first through-hole 716a, the third through-hole 119a, and the first opening 715a may entirely overlap each other, or may overlap each other partially offset from one another. Similarly, the second through-hole 716b, the fourth through-hole 719b, and the second opening 715b may entirely overlap each other, or may overlap each other partially offset from one another.

As described above, in the planar light source 700 according to the present embodiment, the wiring substrate 710 includes the second covering layer 715 covering the peripheries of the first through-hole 716a and the second through-hole 716b on the lower surface of the insulating layer 716 such that the first through-hole 716a and the second through-hole 716b are exposed, and exposing portions of the first wiring layer 713 and the second wiring layer 714. Also, the second portion 751b of the first wiring member 751 is continuous with the first portion 751a, extends on the lower surface of the second covering layer 715, and is in contact with a portion of the first wiring layer 713 exposed from the second covering layer 715. Further, the fourth portion 752b of the second wiring member 752 is continuous with the third portion 752a, extends on the lower surface of the second covering layer 715, and is in contact with a portion of the second wiring layer 714 exposed from the second covering layer 715.

Thus, the second covering layer 715 surrounds the first through-hole 716a and the second through-hole 716b on the lower surface of the insulating layer 716 in a plan view. When the first opening 715a and the second opening 715b of the second covering layer 715 have substantially the same opening diameters as those of the first through-hole and the second through-hole, the force of pressing the conductive paste when the conductive paste is printed increases, which allows for facilitating disposing of the first portion 751a of the first wiring member 751 deep into the first through-hole 716a (that is, to the light source side of the first through-hole). Similarly, the third portion 752a of the second wiring member 752 can be easily disposed deep into the second through-hole 716b (that is, to the light source side of the second through-hole). Therefore, the occurrence of connection failure can be prevented in the electrical connection structures between the wiring layers 713, 714 in the wiring substrate 710 and the electrodes 124b, 124c in the light source 120.

Further, the second covering layer 715 defines the third opening 715c separated from the first through-hole 716a and exposing a portion of the first wiring layer 713, and the fourth opening 715d separated from the second through-hole 716b and exposing a portion of the second wiring layer 714. That is, the second covering layer 715 separately exposes the first wiring layer 713 and the second wiring layer 714. Therefore, electrical connection of the first wiring layer 713 and the second wiring layer 714 can be prevented.

Further, the distance D7 between the third opening 715c and the fourth opening 715d is longer than the distance D6 between the first through-hole 716a and the second through-hole 716b. This allows for preventing short-circuiting between the first wiring layer 713 and the second wiring layer 714.

Eighth Embodiment

Figure 33:
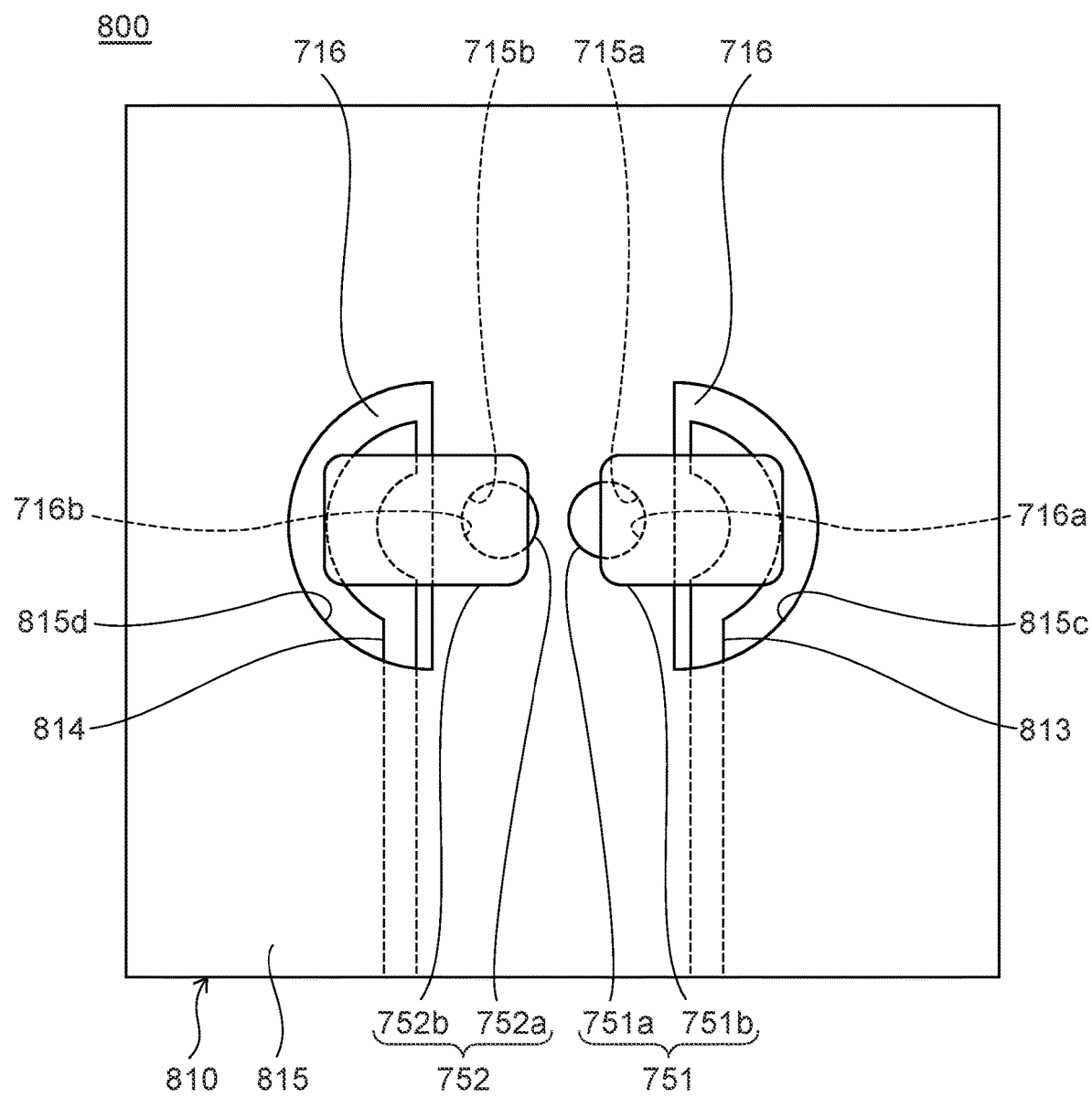
FIG. 33 is an enlarged schematic bottom plan view illustrating a portion of a wiring substrate of a planar light source according to an eighth embodiment.

Next, an eighth embodiment will be described. FIG. 33 is an enlarged schematic bottom plan view illustrating a portion of a wiring substrate of a planar light source according to the present embodiment. A planar light source 800 according to the present embodiment differs from the planar light source 700 according to the seventh embodiment in the configuration of a first wiring layer 813, a second wiring layer 814, and a second covering layer 815 in the wiring substrate 810. In the description below, in general, only differences from the seventh embodiment will be described. The eighth embodiment is similar to the seventh embodiment, except for the configurations described below.

The first wiring layer 813 and the second wiring layer 814 are arranged at two opposite side to each other with respect to the first through-hole 716a and the second through-hole 716b. A shape of the first wiring layer 813 and the second wiring layer 814 is generally the same as the shape of the first wiring layer 113 and the second wiring layer 114 in the first embodiment.

In the second covering layer 815, a third opening 815a and a fourth opening 815b are arranged at two opposite side to each other with respect to the first opening 715a and the second opening 715b. The third opening 815a and the fourth opening 815b have a semi-circular shape in a top plan view. The third opening and the fourth opening may have other shapes.

Thus, the third opening 815a and the fourth opening 815b may be arranged at two opposite side to each other with respect to the first opening 715a and the second opening 715b. Thus, even if the through-holes 716a, 716b have been shifted in position with respect to the wiring layers 813, 814 when the wiring members 751, 752 are formed, occurrence of connection failure can be prevented in the electrical connection structures between the wiring layers 813, 814 in the wiring substrate 810 and the electrodes 124b, 124c in the light source 120.

Ninth Embodiment

Figure 34:
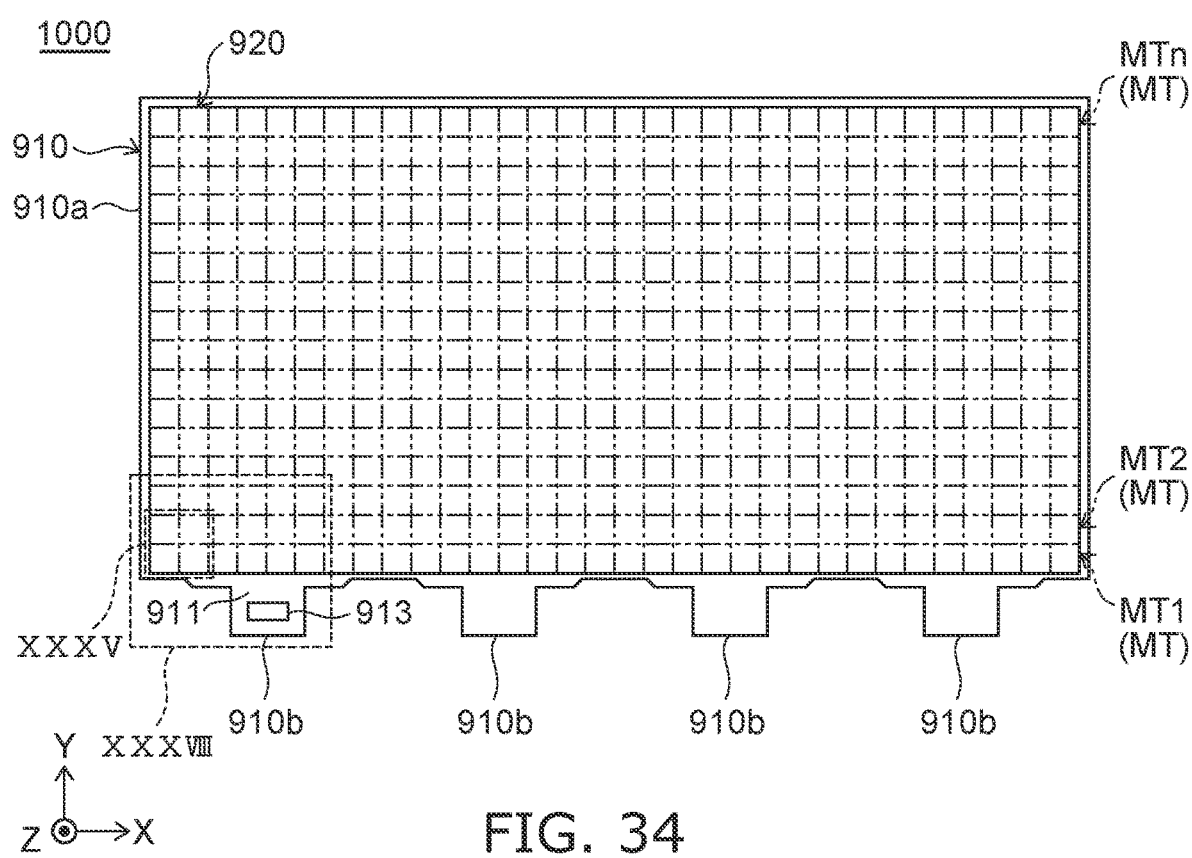
FIG. 34 is a schematic top plan view illustrating a planar light source according to a ninth embodiment.

Next, a ninth embodiment will be described. FIG. 34 is a schematic top plan view illustrating a planar light source according to the present embodiment. A planar light source 1000 according to the present embodiment includes a wiring substrate 910 and a light-emitting module 920 disposed above the wiring substrate 910.

In the present embodiment, the wiring substrate 910 includes a main body portion 910a having a substantially rectangular shape in a top plan view, and a plurality of protruding portions 910b connected to an end portion of the main body portion 910a in the Y direction and protruding in the Y direction. The light-emitting module 920 is disposed above the main body portion 910a. The wiring substrate may have other shape than that described above, and may have a polygonal shape or a quadrangular shape (for example, a substantially trapezoidal shape) other than a rectangular shape. Further, the number of protruding portions 910b in the wiring substrate 910 is not limited to four as illustrated in FIG. 34, and may be less than four or greater than four.

Figure 35:
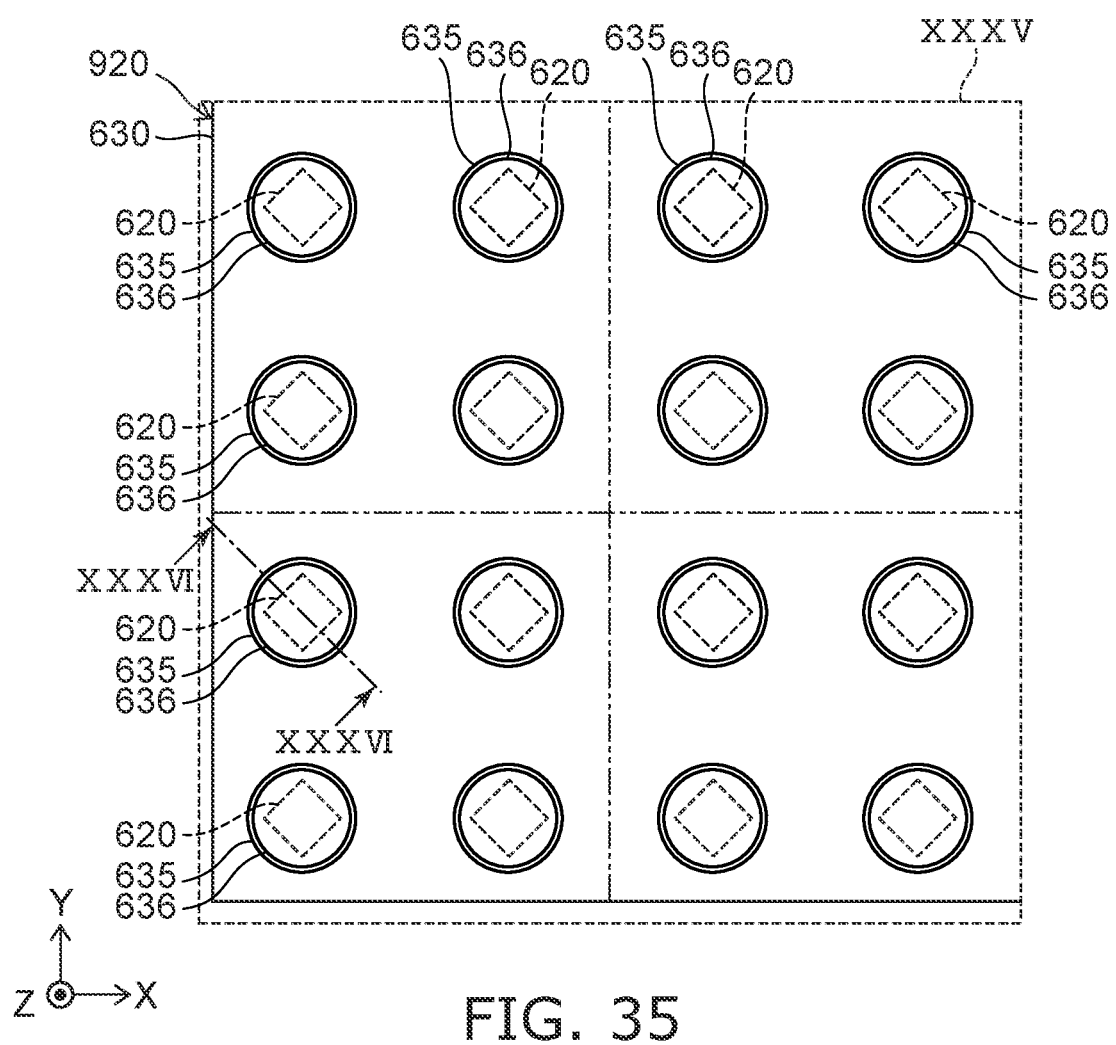
FIG. 35 is an enlarged schematic top plan view illustrating a region surrounded by a dashed line XXXV in FIG. 34 in a light-emitting module according to the ninth embodiment.
Figure 36:
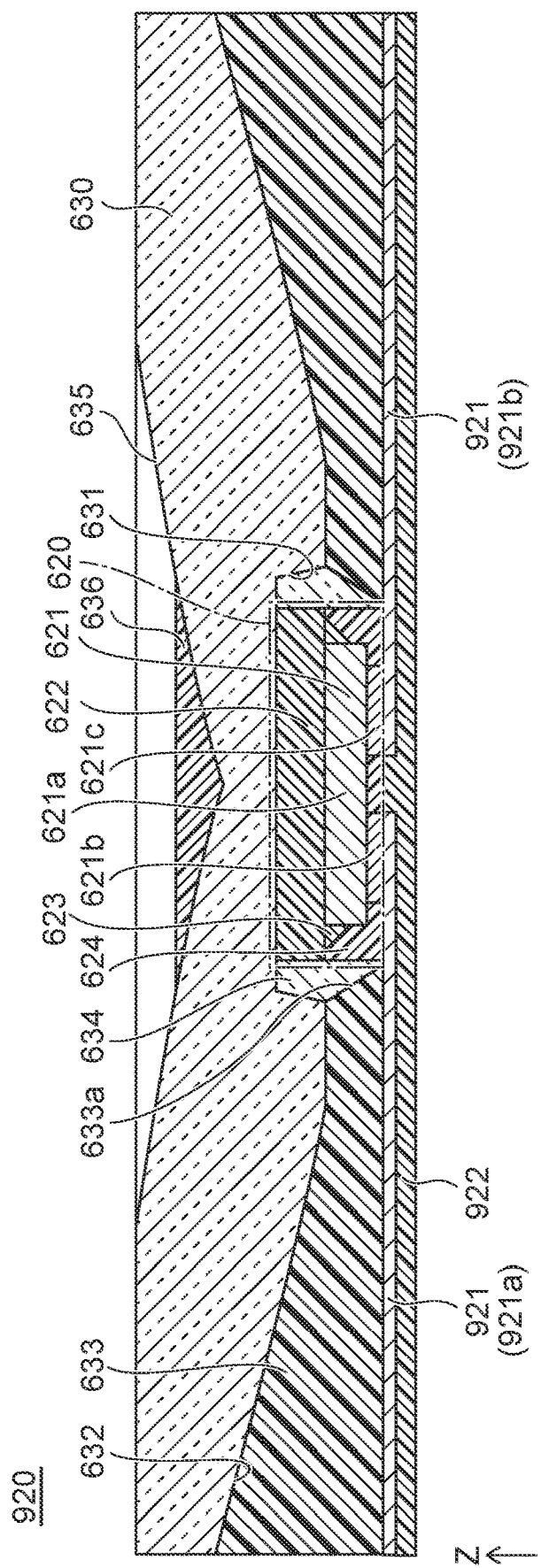
FIG. 36 is a schematic cross-sectional view taken along line XXXVI-XXXVI in FIG. 35.

FIG. 35 is an enlarged schematic top plan view illustrating a region surrounded by a dashed line XXXV in FIG. 34 in the light-emitting module according to the present embodiment. FIG. 36 is a schematic cross-sectional view taken along line XXXVI-XXXVI in FIG. 35. Similar to the sixth embodiment, the light-emitting module 920 includes the plurality of light sources 620, the light guide member 630 including the plurality of recessed portions 635, the demarcation member 633, the light-transmissive member 634, and the light adjustment member 636. The light-emitting module 920 further includes a plurality of wiring layers 921 disposed at different locations in a top view below the demarcation member 633, and a covering layer 922 disposed below the plurality of wiring layers 921.

As illustrated in FIG. 35, the plurality of light sources 620 are arrayed in the X direction and the Y direction. A material similar to that of the wiring layers 113, 114 of the first embodiment can be used for the wiring layer 921. As illustrated in FIG. 36, each wiring layer 921 is electrically connected to a corresponding one of the plurality of light sources 620. An insulating resin can be used for the covering layer 922. The covering layer 922 covers at least a portion of each wiring layer 921.

Figure 37:
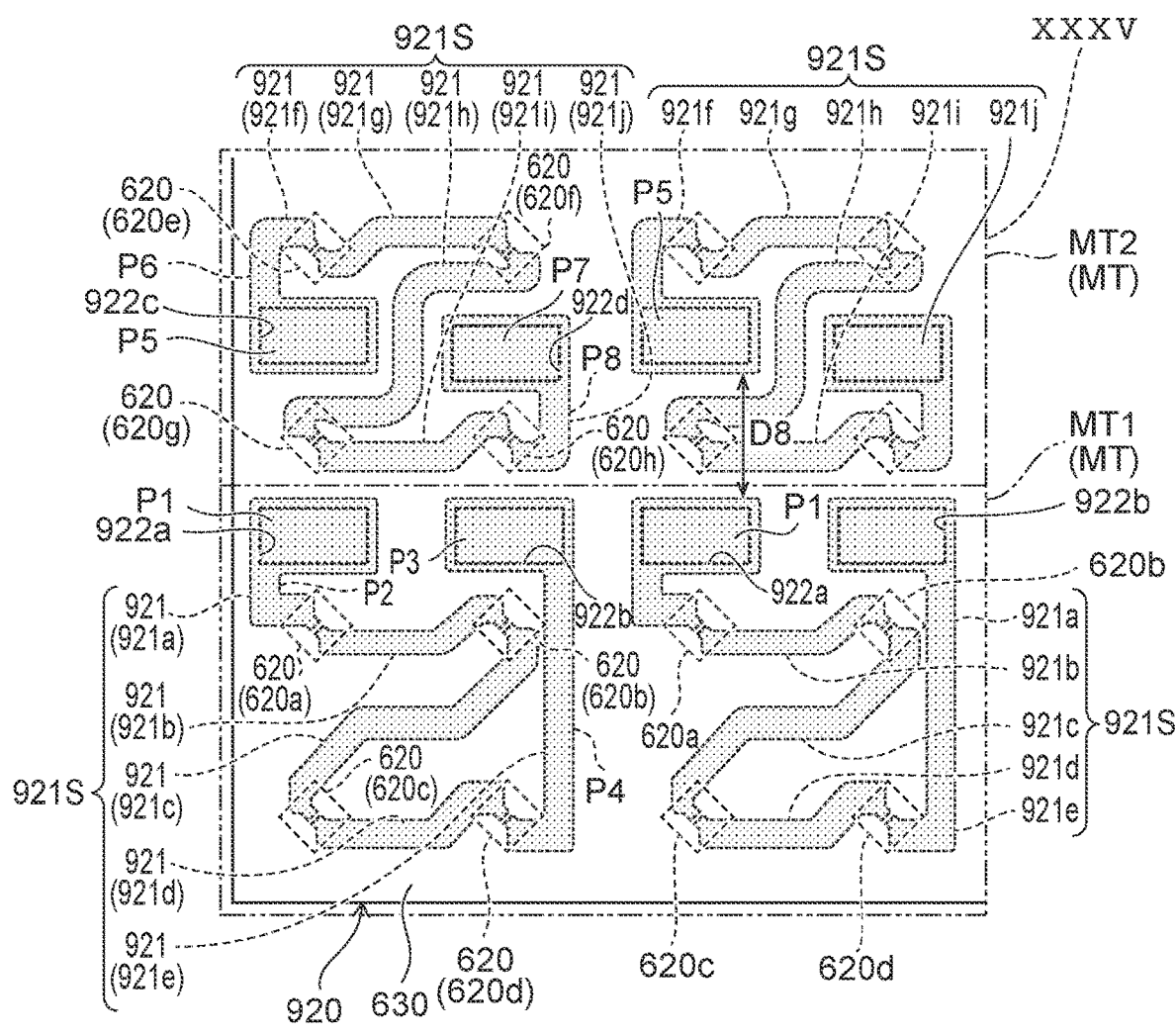
FIG. 37 is an enlarged schematic top plan view illustrating the region surrounded by XXXV in FIG. 34 in the light-emitting module according to the ninth embodiment, passing through the wiring pattern.

A wiring pattern of the plurality of wiring layers 921 in the light-emitting module 920 will be described below. FIG. 37 is an enlarged schematic top plan view illustrating a region surrounded by XXXV in FIG. 34 in the light-emitting module according to the present embodiment, passing through the wiring pattern. In FIG. 37, the region where the wiring layer 921 is provided is indicated by dots for the sake of clarity. Further, in FIG. 37, illustrations of the recessed portions 635 and the light adjustment member 636 provided in the light guide member 630 are omitted for ease of understanding of the wiring pattern. Each set of five wiring layers 921 of the plurality of wiring layers 921 form a wiring layer group 921S. In each wiring layer group 921S in the present embodiment, four light sources 620 are connected in series. These four light sources 620 form two columns aligned in the X direction and two rows aligned in the Y direction so that a matrix is formed. That is, each of the wiring layer groups 921S is equivalent to a current path connecting the four light sources 620 in series. Each wiring layer group may be connected to other number of light sources than that described above.

The plurality of wiring layer groups 921S are arrayed in the X direction and the Y direction. In the description below, a plurality of wiring layer groups 921S arrayed in the X direction are referred to as a "row MT". That is, in the present embodiment, a plurality of rows MT are aligned in the Y direction. In the description below, as illustrated in FIG. 34, a row MT of the plurality of rows MT that is closest to the protruding portions 910b of the wiring substrate 910 will also be referred to as a "first row MT1." Further, a row MT of the plurality of rows MT that is adjacent to the first row MT1 in the Y direction will also be referred to as "second row MT2." Further, a row MT of the plurality of rows MT that is farthest from the protruding portions 910b of the wiring substrate 910 will also be referred to as a "final row MTn."

The wiring pattern of the wiring layer group 921S in the first row MT1 will be described below. Hereinafter, as illustrated in FIG. 37, the five wiring layers 921 constituting the wiring layer group 921S in the first row MT1 will also be referred to as a "first wiring layer 921a," a "second wiring layer 921b," a "third wiring layer 921c," a "fourth wiring layer 921d," and a "fifth wiring layer 921e." Further, one light source 620 of the four light sources 620 to which the wiring layer group 921S connects in series will also be referred to as a "first light source 620a," the light source 620 adjacent to the first light source 620a in the X direction will also be referred to as a "second light source 620b," the light source 620 adjacent to the first light source 620a in the Y direction will also be referred to as a "third light source 620c," and the light source 620 adjacent to the second light source 620b in the Y direction and adjacent to the third light source 620c in the X direction will also be referred as a "fourth light source 620d."

The first wiring layer 921a includes a pad portion P1 with at least a portion exposed from an opening 922a of the covering layer 922, and an extending portion P2 continuous with the pad portion P1 at one end and electrically connected to the first electrode 621b of the first light source 620 at the other end (refer to FIG. 36). The pad portion P1 in the present embodiment has a substantially rectangular shape. The pad portion may have a polygonal shape other than a quadrangle shape, a circular shape, an elliptic shape, or the like. This is similar in shape of the pad portions P3, P5, P7 to be described below. The extending portion P2 is covered by the covering layer 922.

The second wiring layer 921b is electrically connected to the second electrode 621c of the first light source 620a at one end (refer to FIG. 36) and electrically connected to the first electrode 621b of the second light source 620b at the other end.

One end portion of the third wiring layer 921c is electrically connected to the second electrode 621c of the second light source 620b, and another end portion of the third wiring layer 921c is electrically connected to the first electrode 621b of the third light source 620c at the other end.

The fourth wiring layer 921d is electrically connected to the second electrode 621c of the third light source 620c at one end portion of the fourth wiring layer 921d and is electrically connected to the first electrode 621b of the fourth light source 620d at another end portion of the fourth wiring layer 921d.

The second wiring layer 921b, the third wiring layer 921c, and the fourth wiring layer 921d are covered by the covering layer 922.

The fifth wiring layer 921e includes the pad portion P3 at least partially exposed from an opening 922b of the covering layer 922, and an extending portion P4 continuous with the pad portion P3 at one end portion of the extending portion P4 and electrically connected to the second electrode 621c of the fourth light source 620d at another end portion of the extending portion P4. The pad portion P3 is adjacent to the pad portion P1 of the first wiring layer 921a in the X direction. The extending portion P4 is covered by the covering layer 922.

In the Y direction, the pad portions P1, P3 are located farther from the protruding portions 910b than the four light sources 620a, 620b, 620c, 620d. Further, in a bottom plan view, the pad portions P1, P3 are located between a matrix of the four light sources 620 to which the wiring layer group 921S in the first row MT1 is connected in series and a matrix of the four light sources 620 to which the wiring layer group 921S in the second row MT2 connects in series. Accordingly, the pad portions P1, P3 of the wiring layer group 921S in the first row MT1 can be separated from an outer edge of the main body portion 121 of the wiring substrate on the protruding portions 910b side in the Y direction. In this case, a distance from the pad portions P1, P3 of the wiring layer group 921S in the first row MT1 to the outer edge of the main body portion 121 of the wiring substrate at the protruding portions 910b side in the Y direction according to the present embodiment can be longer than a distance from the pad portions P1, P3 to the outer edge of the main body portion 121 of the wiring substrate on the protruding portions 910b side in the Y direction in a case in which the pad portion P1 is located between the light source 620a and the light source 620c, and the pad portion P3 is located between the light source 620b and the light source 620d.

Next, the wiring pattern of the wiring layer group 921S in the second row MT2 will be described. Similar to the wiring layer group 921S in the first row MT1, the wiring layer group 921S in the second row MT2 includes a first wiring layer 921f, a second wiring layer 921g, a third wiring layer 921h, a fourth wiring layer 921i, and a fifth wiring layer 921j. Further, similar to the wiring layer group 921S in the first row MT1, the wiring layer group 921S in the second row MT2 connects a first light source 620e, a second light source 620f, a third light source 620g, and a fourth light source 620h in series. In the description below, only differences in the second row MT2 from the first row MT1 will be described.

The pad portion P5 of the first wiring layer 921f is located between the first light source 620e and the third light source 620g in a bottom plan view. Further, the pad portion P7 of the fifth wiring layer 921j is located between the second light source 620f and the fourth light source 620h in a bottom plan view. Further, the pad portion P5 of the first wiring layer 921f and the pad portion P7 of the fifth wiring layer 921j are arranged at two opposite side to each other with respect to the third wiring layer 921h in the X direction in a bottom plan view.

Accordingly, compared to a case in which the wiring pattern of the wiring layer group 921S in the first row MT1 is the same as the wiring pattern of the wiring layer group 921S in the second row MT2, a distance D8 between the pad portion P1 of the wiring layer group 921S in the first row MT1 and the pad portion P5 of the wiring layer group 921S in the second row MT2 can be shortened.

Further, an extending portion P6 of the first wiring layer 921f is connected to the pad portion P5 and electrically connected to the first light source 620e farther from the protruding portions 910b than the pad portion P5. Further, the extending portion P8 of the fifth wiring layer 921j is connected to the pad portion P7 and electrically connected to the fourth light source 620h closer to the protruding portions 910b than the pad portion P7. A length of the extending portion P8 in the Y direction is shorter than a length of the extending portion P4 in the Y direction in the first row MT1.

However, the wiring pattern of the wiring layer group 921S in the second row MT2 may be the same as the wiring pattern of the wiring layer group 921S in the first row MT1. The wiring patterns of the wiring layer groups 921S in the rows MT from the second row MT2 to the final row MTn may be the same as the wiring pattern of the wiring layer group 921S in the first row MT1, or may be the same as the wiring pattern of the wiring layer group 921S in the second row MT2.

In the present embodiment, the pad portions P1, P5 function as anodes and the pad portions P3, P7 function as cathodes.

Figure 38:
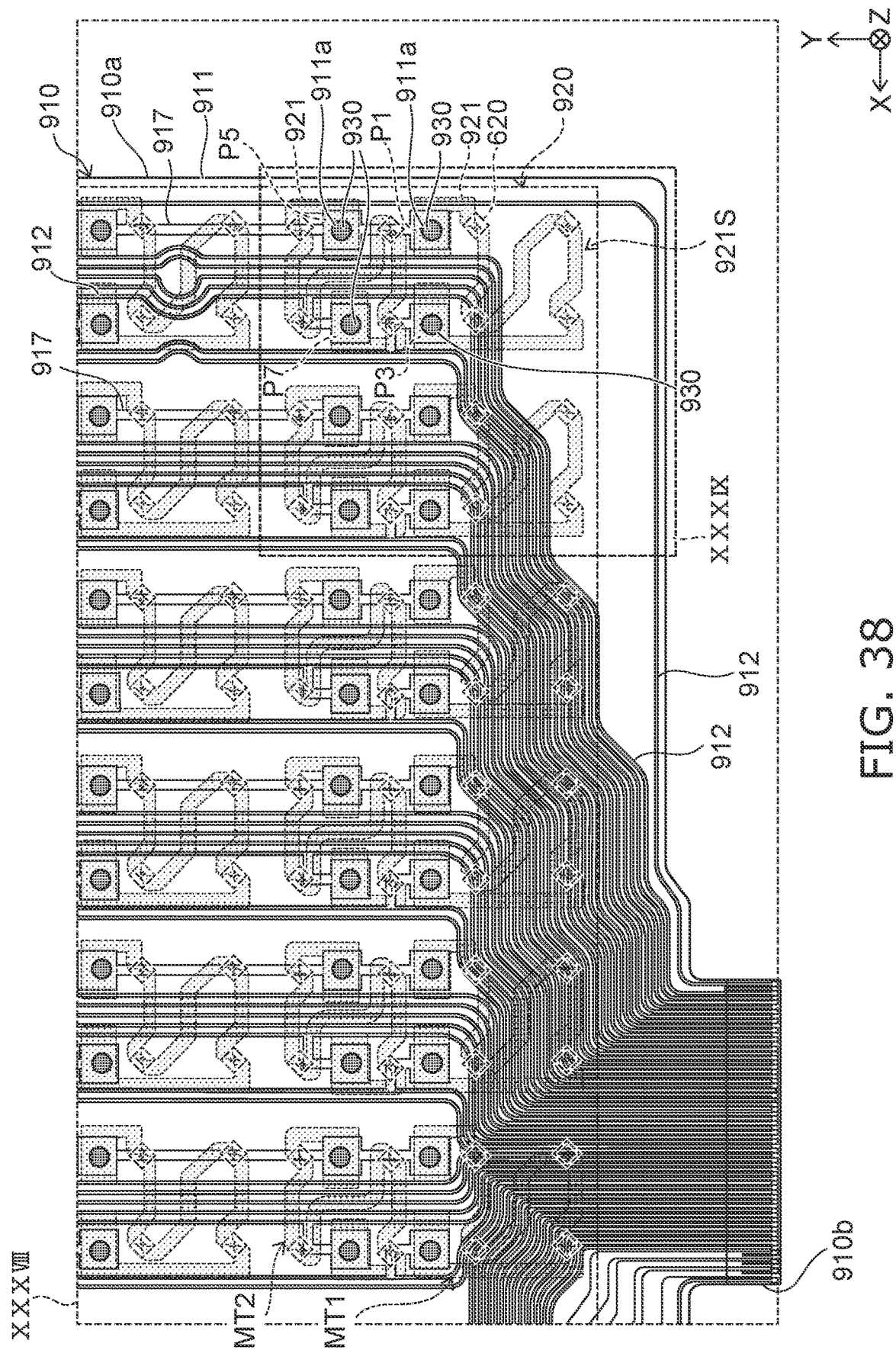
FIG. 38 is an enlarged schematic bottom plan view illustrating a portion surrounded by a dashed line XXXVIII in FIG. 34.
Figure 39:
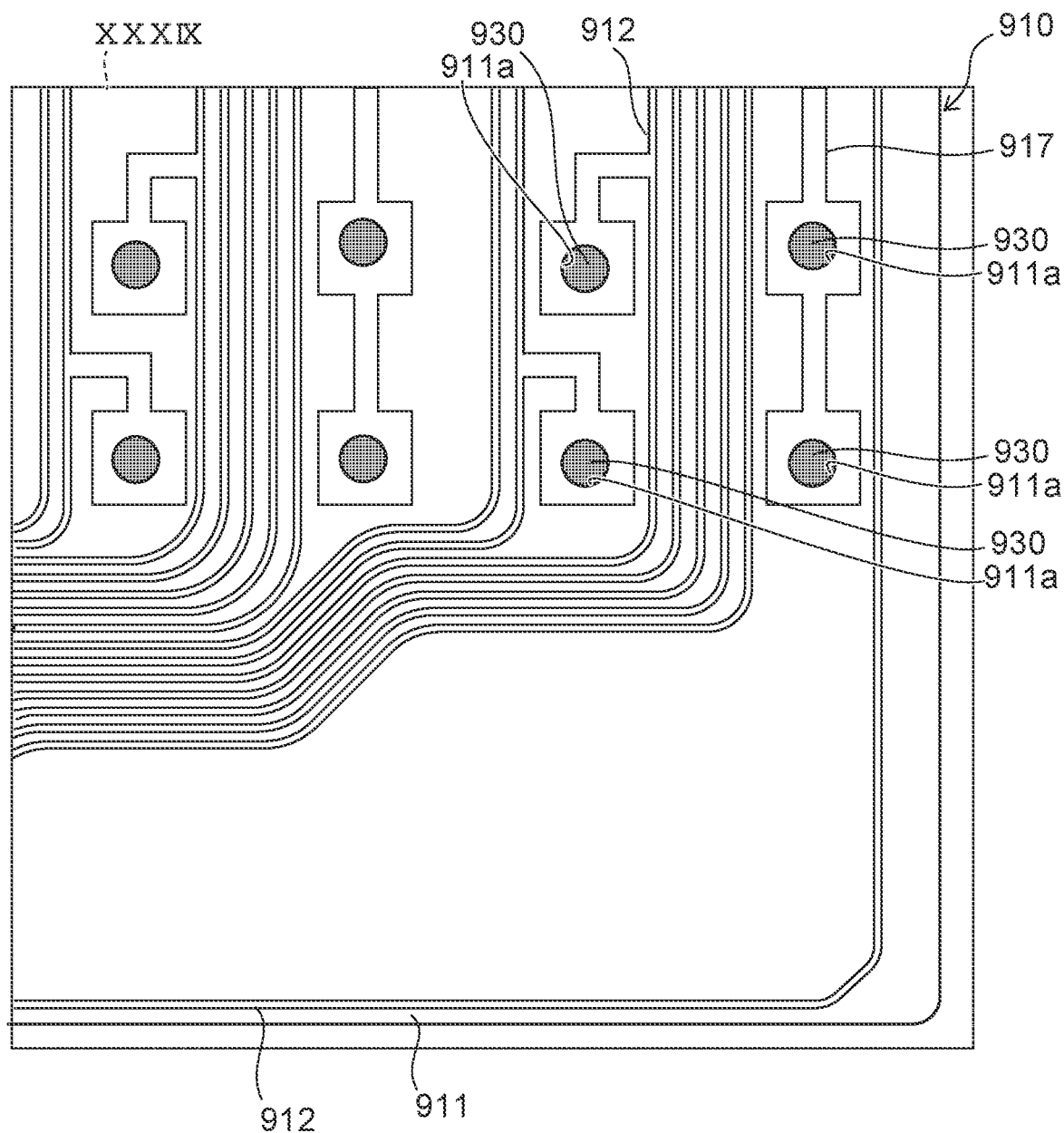
FIG. 39 is an enlarged schematic bottom plan view illustrating a portion surrounded by a dashed line XXXIX in FIG. 38 in the wiring substrate according to the ninth embodiment.
Figure 40:
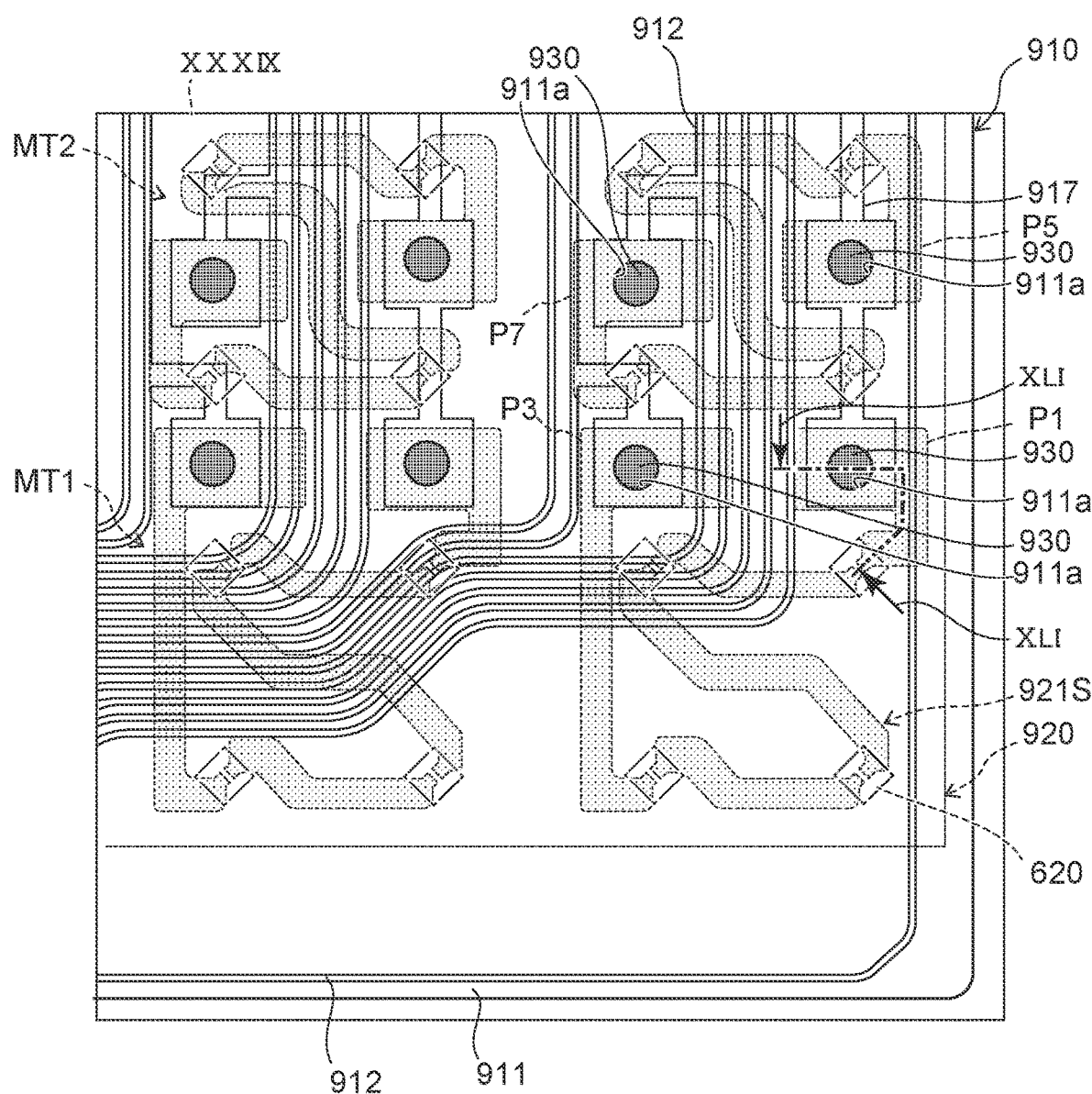
FIG. 40 is an enlarged schematic bottom plan view illustrating a portion surrounded by the dashed line XXXIX in FIG. 38 in the wiring substrate and the light-emitting module according to the ninth embodiment.
Figure 41:
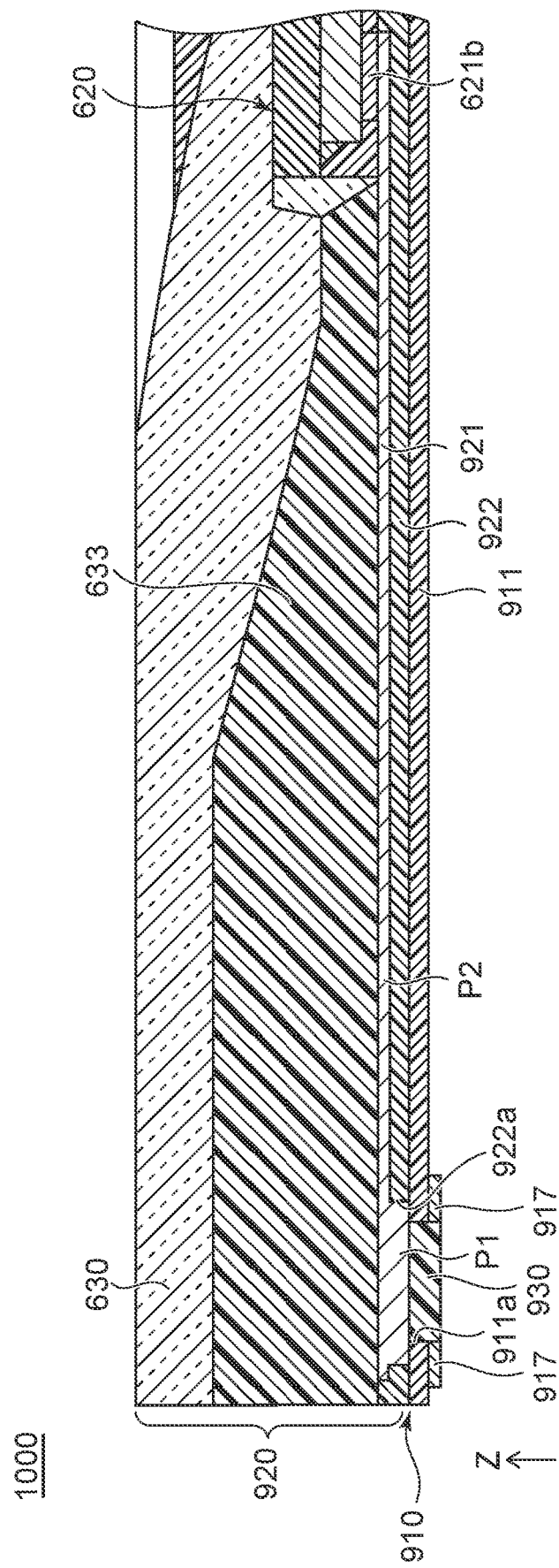
FIG. 41 is a schematic cross-sectional view taken along line XLI-XLI in FIG. 40.

Next, the connection structure between the wiring substrate 910 and the light-emitting module 920 will be described. FIG. 38 is an enlarged schematic bottom plan view illustrating a portion surrounded by a dashed line XXXVIII in FIG. 34. FIG. 39 is an enlarged schematic bottom plan view illustrating a portion surrounded by a dashed line XXXIX in FIG. 38 in the wiring substrate according to the present embodiment. FIG. 40 is an enlarged schematic bottom plan view illustrating a portion surrounded by the dashed line XXXIX in FIG. 38 in the wiring substrate and the light-emitting module according to the present embodiment. FIG. 41 is a schematic cross-sectional view taken along line XLI-XLI in FIG. 40. The wiring substrate 910 includes an insulating layer 911, a plurality of first wiring layers 912 disposed below the insulating layer 911 at different locations in a plan view and electrically connected to the pad portions P3, P7, and a plurality of second wiring layers 917 disposed below the insulating layer 911 at different locations in a plan view and electrically connected to the pad portions P1, P5. Further, as illustrated in FIG. 34, the wiring substrate 910 further includes an identification display 913 provided on the insulating layer 911. Further, the wiring substrate 910 may further include a covering layer (not shown in the drawings) disposed below the plurality of first wiring layers 912 and second wiring layers 917.

The insulating layer 911 is made of a material similar to that of the insulating layer 116 in the first embodiment. The insulating layer 911 may be adhered to the light-emitting module 920 by an adhesive sheet or the like. The insulating layer 911 may be composed of a single layer or may be composed of a plurality of layers. As illustrated in FIG. 40 and FIG. 41, the insulating layer 911 defines a through-hole 911a directly below the pad portions P1, P3 P5, P7. Each of the through-holes 911a extends through the insulating layer 911 in the Z direction. Each through-hole 911a has a circular shape in a top plan view in the present embodiment. Each through-hole in a top plan view may have other shape than that described above, and may have a polygonal shape such as a quadrangular shape, an elliptic shape, or the like. A wiring member 930 is disposed in each of the through-holes 911a.

Each of the wiring members 930 is electrically connected to a pad portion that is located directly above a respective wiring member 930 among the plurality of pad portions P1, P3, P5, P7. In FIG. 38, FIG. 39, and FIG. 40, regions where the wiring members 930 are disposed are indicated by dots for the sake of clarity. Each of the wiring members 930 is formed by curing a conductive paste.

As illustrated in FIG. 38, each of the first wiring layers 912 is located on the protruding portion 910b of the wiring substrate 910 at one end, and extends over the main body portion 910a of the wiring substrate 910. That is, one end portions of the plurality of first wiring layers 912 are collected on the protruding portion 910b. Further, as illustrated in FIG. 40, each of the first wiring layers 912 is in contact with corresponding one or more wiring members 930 connected to the pad portions P3, P7. Thus, the plurality of first wiring layers 912 and the cathodes of the plurality of wiring layer groups 921S of the light-emitting module 920 are electrically connected. The one end portions of the plurality of first wiring layers 912 collected on the protruding portions 910b are electrically connected to an external drive substrate or the like that drives the planar light source 1000.

Each of the second wiring layers 917 extends over the main body portion 910a of the wiring substrate 910. Further, each of the second wiring layers 917 is in contact with corresponding one or more wiring members 930 connected to the pad portions P1, P5. Thus, the plurality of second wiring layers 917 and the anodes of the plurality of wiring layer groups 921S of the light-emitting module 920 are electrically connected.

Thus, the plurality of first wiring layers 912 are disposed in the wiring substrate 910. Then, the end portions of the plurality of first wiring layers 912 are collected on the protruding portion 910b. In this structure, in a region near the protruding portion 910b in the main body portion 910a, portions of the plurality of first wiring layers 912 are collected to be arrayed in the Y direction. Then, in the plurality of first wiring layers 912, the portions collected to be arrayed in the Y direction on the main body portion 910a needs to be located closer to the protruding portion 910b in the Y direction than the wiring member 930 electrically connected to the wiring layer group 921S in the first row MT1.

The wiring member 930 electrically connected to the wiring layer group 921S in the first row MT1 is located directly below the pad portion P3 in the first row MT1. Accordingly, the closer the pad portion P3 is located to the outer edge of the light-emitting module 920 on the protruding portion 910b side in the Y direction, the more it is necessary to shift, to the protruding portion 910b side in the Y direction, the portions of the plurality of first wiring layers 912 collected to be arrayed in the Y direction on the main body portion 910a. In this case, it would be necessary to increase the dimension of the main body portion 910a in the Y direction so that the plurality of first wiring layers 912 is located inward of the outer edge of the main body portion 910a. On the other hand, in the present embodiment, the pad portion P3 of the wiring layer group 921S in the first row MT1 is farther from the protruding portion 910b in the Y direction than the plurality of light sources 620 to which the wiring layer group 921S connects in series. Therefore, the pad portion P3 can be separated from the outer edge on the protruding portion 910b side of the light-emitting module 920 in the Y direction. Thus, the plurality of first wiring layers 912 can be located inward of the outer edge of the wiring substrate 910 without increasing the dimension of the main body portion 910a in the Y direction. Therefore, the wiring substrate 910 can be made compact.

The identification display 913 is a display for identifying, for example, a lot of a product. The identification display 913 is, for example, a two-dimensional code such as a data matrix, a one-dimensional code such as a barcode, or a character code made from a combination of characters, numbers, symbols, or the like. The identification display 913 is made of a metal material such as copper, for example. The identification display 913 is disposed on an upper surface of the protruding portion 910b in the present embodiment as illustrated in FIG. 34. The insulating layer 911 described above is disposed between the identification display 913 and the plurality of wiring layers 912 and. The identification display 913 is exposed from the insulating layer 911. However, the identification display may be disposed on a lower surface of the protruding portion or on the surface of the main body portion. Further, the wiring substrate need not be provided with the identification display.

For the identification display 913, a metal layer such as copper disposed on the base layer 111 and isolated from the wiring layers 113, 114 can be used. In this case, the identification display 913 can be formed by irradiating the metal layer with a laser or etching the metal layer and partially removing the metal layer.

As another example, the identification display 913 can be formed by disposing the first covering layer 112 on an upper surface of the metal layer described above, irradiating the first covering layer 112 with a laser or etching the first covering layer 112, and partially removing the first covering layer 112. The region removed in the first covering layer 112 may extend therethrough or may not extend therethrough. For the first covering layer 112, a transparent material may be used, and a white material or a colored material such as green or blue may be used in view of enhancing visibility. In a case in which the metal layer is disposed on the lower surface of the base layer, the second covering layer 115 is disposed on a surface of the metal layer, and the second covering layer 115 is irradiated with a laser or etched, so that the second covering layer 115 is partially removed.

In yet another example, the identification display 913 can be formed by applying or printing a white resin or colored resin, or applying a sticker.

The configuration of the wiring substrate 910 is not limited to the above. For example, a thickness of a tip portion of the protruding portion 910b in the Y direction may be greater than a thickness of a base end portion (portion connected to the main body portion 910a) of the protruding portion 910b in the Y direction. Such a tip portion can be formed by, for example, providing a sheet made of a resin material such as polyimide on the tip portion of the protruding portion 910b.

Figure 42:
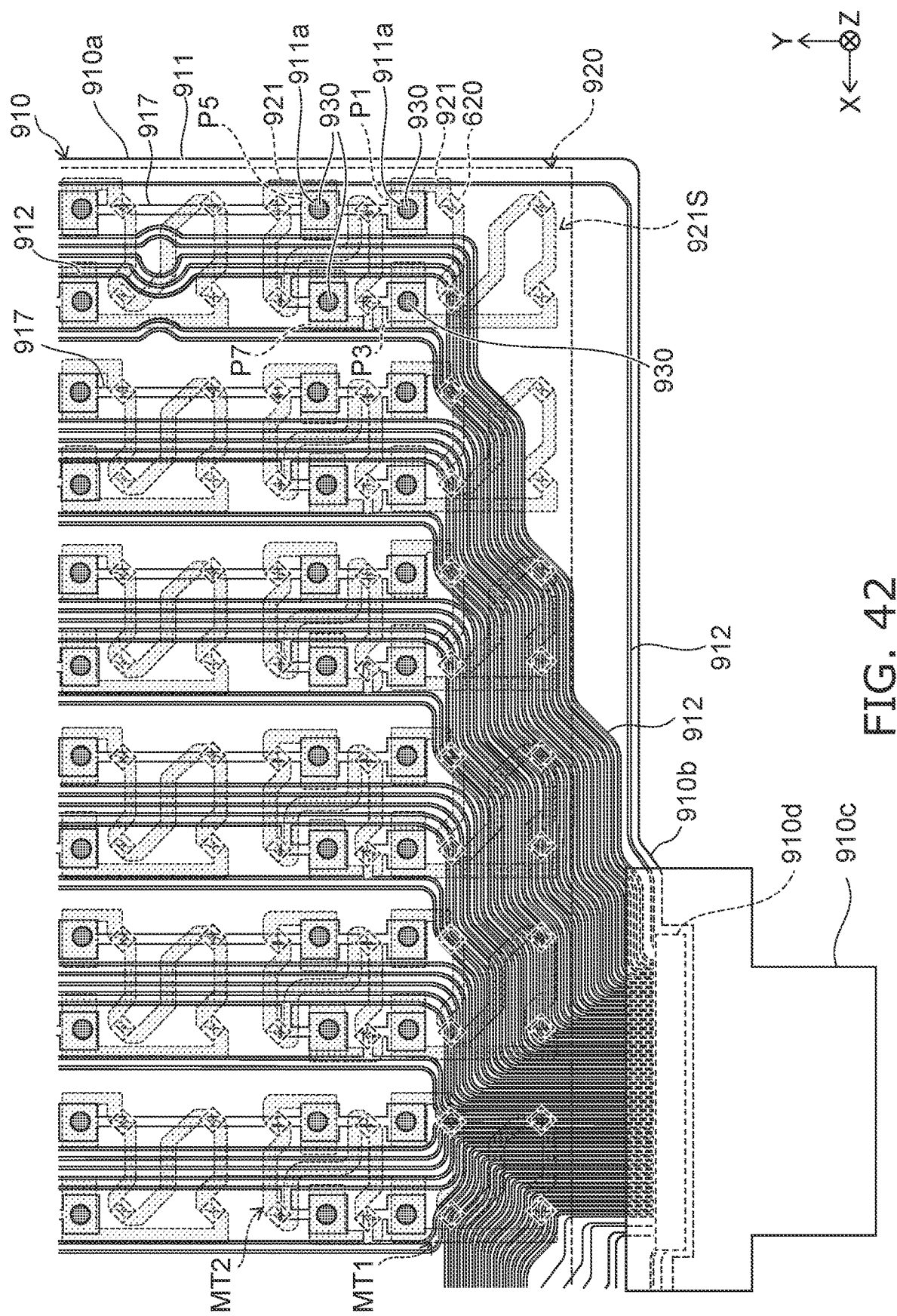
FIG. 42 is a schematic bottom plan view illustrating another example of the wiring substrate.

FIG. 42 is a schematic bottom plan view illustrating another example of the wiring substrate of the present embodiment. Further, as illustrated in FIG. 42, for example, the wiring substrate 910 may be provided with an anisotropic conductive film 910d, and the plurality of first wiring layers 912 may be collected on the anisotropic conductive film 910d. In FIG. 42, the anisotropic conductive film 910d is disposed on the protruding portion 910b. Then, a terminal 910c for connecting to an external drive substrate may be coupled to the protruding portion 910b, and thus electrically connected to the anisotropic conductive film 910d. That is, the plurality of first wiring layers 912 may be electrically connected to the terminal 910c via the anisotropic conductive film 910d. Further, the wiring substrate need not include the plurality of protruding portions. When the wiring substrate does not include the plurality of protruding portions, a plurality of anisotropic conductive films may be disposed on the lower surface of the main body portion, and the plurality of wirings may be collected on each anisotropic conductive film. The terminals may then be electrically connected to respective anisotropic conductive films.

Further, the wiring layer group 921S may be disposed on an upper surface of the wiring substrate 910, for example, on the insulating layer 911, instead of the light-emitting module 920. Further, at least a portion of the wiring layers 912, 917 in contact with the wiring member 930 may be located below the insulating layer 911. Accordingly, for example, the wiring layers 912, 917 may include a first portion located below the insulating layer 911 and in contact with the wiring member 930, a second portion located above the insulating layer 911, and a third portion penetrating the insulating layer 911 and connecting the first portion and the second portion. Further, the wiring layers 912, 917 may be separated from the through-hole 911a defined in the insulating layer 911. Also, the wiring member 930 may include a first portion that fills the through-hole 911a, and a second portion disposed below the insulating layer 911, continuous with the first portion, and in contact with the wiring layers 912, 917. The wiring layer group 921S may have a wiring pattern in which the wiring pattern illustrated in FIG. 37 is inverted with respect to an axis extending in the Y direction.

Next, an effect of the present embodiment will be described. In the planar light source 1000 in the present embodiment, the pad portion P3 in the wiring layer group 921S in the first row MT1 is farther from the protruding portion 910b in the Y direction than the plurality of light sources 620 to which the wiring layer group 921S connects in series. This allows the plurality of first wiring layers 912 to be located inward of the outer edge of the wiring substrate 910 without increasing the dimension of the main body portion 910a in the Y direction. Therefore, the wiring substrate 910 can be made compact.

Further, in the present embodiment, in a bottom plan view, each of the pad portions P5, P7 in wiring layer groups 921S adjacent to each other in the first row MT2 are located between a plurality of light sources 620 to each of which corresponding ones of these wiring layer groups 921S are connected in series. With this arrangement, the distances between the pad portions P1, P3 in the first row MT1 and the pad portions P5, P7 in the second row MT2 can be shortened. Accordingly, the distance between the through-holes 911a of the insulating layer 911 located directly below the pad portions P1, P3 and the through-holes 911a of the insulating layer 911 located directly below the pad portions P5, P7 can be shortened. When the planar light source 1000 is driven, the temperature of the planar light source 1000 increases or decreases according to a state such as the lighting or non-lighting of the light sources 620. This may cause deformation of the wiring substrate 910, the adhesive sheet, the light-emitting module 920, and the wiring member 930 constituting the planar light source 1000. When such deformation occurs, because coefficients of thermal expansion thereof differ from each other, stress is applied to the wiring member 930, which may cause cracks. In the present embodiment, the distance between the through-holes 911a of the insulating layer 911 located directly below the pad portions P1, P3 and the through-holes 911a of the insulating layer 911 located directly below the pad portions P5, P7 can be shortened as described above, which allows for reducing the stress acting on the wiring member 930. Accordingly, the occurrence of cracks in the wiring member 930 can be reduced.

Modifications

Figure 43:
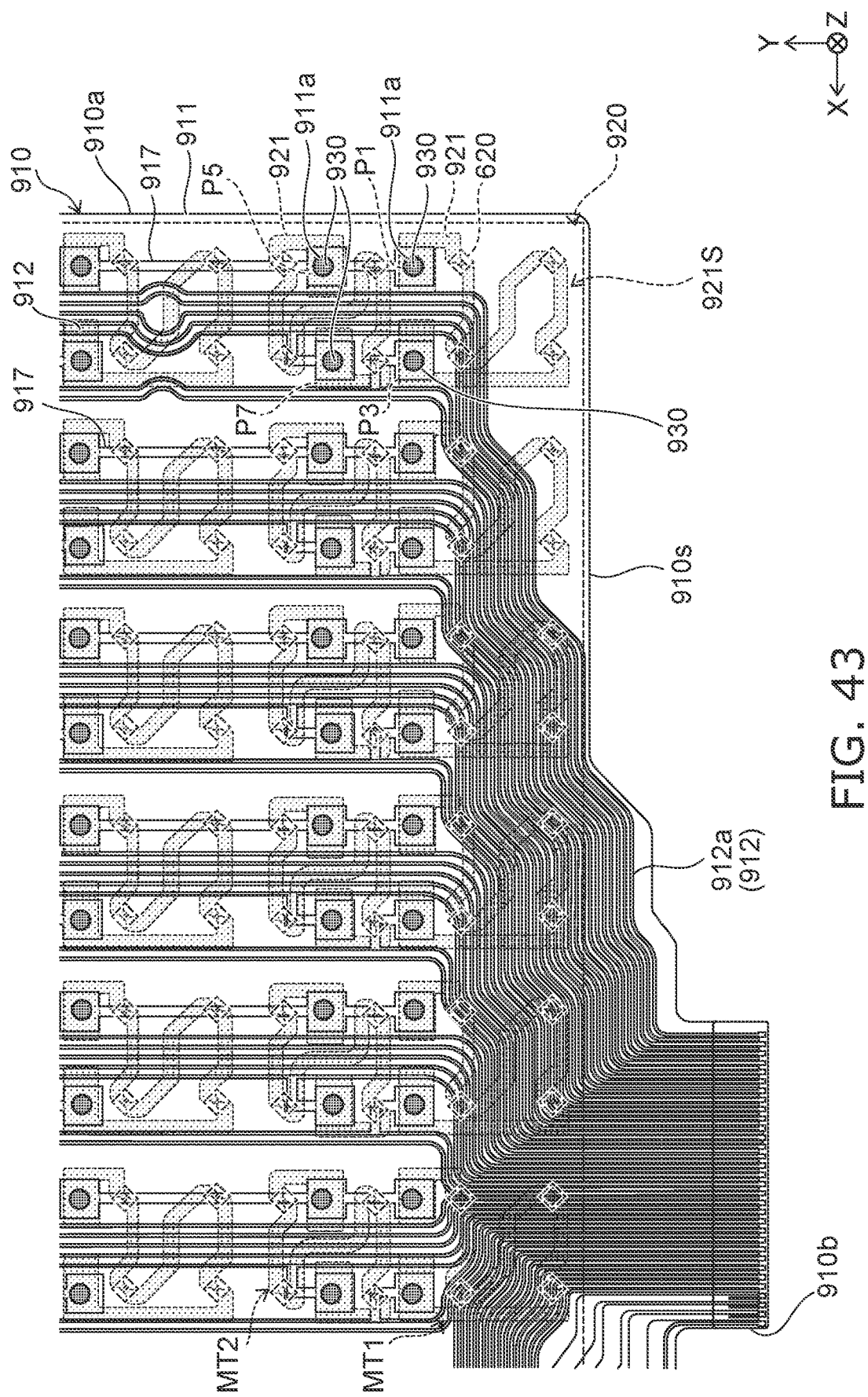
FIG. 43 is an enlarged schematic bottom plan view illustrating a portion of a wiring substrate in a modification.

Next, a modification of the ninth embodiment will be described. FIG. 43 is an enlarged schematic bottom plan view illustrating a portion of a wiring substrate in the modification. As illustrated in FIG. 43, a portion of an outer periphery of the wiring substrate 910 may have a shape extending along the shape of the first wiring layer 912a that is an outermost one of the plurality of first wiring layers 912. For example, in FIG. 43, in the main body portion 910a, a lateral surface 910s to which the protruding portion 910b is connected extends in the X direction along an outer periphery of the light-emitting module 920 and a portion of the first wiring layer 912a. Further, in FIG. 43, for example, a lateral surface of the protruding portion 910b includes two steps along the first wiring layer 912a. Thus, the dimension of the main body portion 910a of the wiring substrate 910 in the Y direction can be reduced.

In the plurality of embodiments described above, description has been made of a configuration in which the planar light source includes the light guide member, the demarcation member, the light-transmissive member, and the light adjustment member. However, the planar light source need not include the light guide member, the demarcation member, the light-transmissive member, and the light adjustment member. That is, the planar light source may be constituted by the wiring substrate and the plurality of light sources.

Embodiments of the present invention can be utilized in a backlight, for example.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:
1. A planar light source comprising:
  a wiring substrate comprising
    an insulating layer defining a first through-hole and a second through-hole that are separated from each other, and
    a first wiring layer and a second wiring layer that are disposed below the insulating layer, wherein the first wiring layer is separated from the first through-hole and the second wiring layer is separated from the second through-hole, and wherein, in a top plan view, the first wiring layer and the second wiring layer are arranged at two opposite sides with respect to the first through-hole and the second through-hole;
  a light source disposed above the wiring substrate, the light source comprising a first electrode and a second electrode that are separated from each other;
  a light guide member disposed above the wiring substrate and surrounding the light source;
  a first wiring member comprising:
    a first portion filling the first through-hole and electrically connected to the first electrode, and
    a second portion disposed below the insulating layer, continuous with the first portion, and in contact with the first wiring layer;
  a second wiring member comprising:
    a third portion filling the second through-hole and electrically connected to the second electrode, and
    a fourth portion disposed below the insulating layer, continuous with the third portion, and in contact with the second wiring layer; and a light reflective sheet disposed on a region of the wiring substrate other than the first through-hole and the second through-hole, wherein:

each of the first and second wiring members comprises a material containing a thermosetting material as a main component, the light reflective sheet comprises a thermoplastic resin as a main component, and a melting point of the light reflective sheet is higher than a curing temperature of the first and second wiring members.

2. The planar light source according to claim 1, wherein:
a region of a lateral surface of the first wiring layer, the region being in contact with the second portion and facing the first through-hole in a top plan view, is recessed in a direction away from the first through-hole, and a region of a lateral surface of the second wiring layer, the region being in contact with the fourth portion and facing the second through-hole in a top plan view, is recessed in a direction away from the second through-hole.

3. The planar light source according to claim 2, wherein:
in a top plan view, each of the first through-hole and the second through-hole has a circular shape, in a top plan view, the region of the lateral surface of the first wiring layer, which is in contact with the second portion and faces the first through-hole, has an arcuate shape, and in a top plan view, the region of the lateral surface of the second wiring layer, which is in contact with the fourth portion and faces the second through-hole, has an arcuate shape.

4. The planar light source according claim 1, wherein:
the light source further comprises:
  a first terminal disposed below the first electrode, in contact with an upper end of the first portion, and having an area in a top plan view greater than or equal to an area of the first electrode; and
  a second terminal disposed below the second electrode, in contact with an upper end portion of the third portion, and having an area in a top plan view greater than or equal to an area of the second electrode.

5. The planar light source according to claim 4, wherein:
in a top plan view, the first terminal covers the first through-hole, and the second terminal covers the second through-hole.

6. The planar light source according to claim 1, wherein:
in a top plan view, a distance between a center of the first through-hole and a center of the second through-hole is longer than a distance between a center of the first electrode and a center of the second electrode.

7. The planar light source according to claim 1, further comprising:
a covering layer covering the first wiring member and the second wiring member.

8. The planar light source according to claim 1, wherein:
each of the first wiring member and the second wiring member contains:
  a base material composed of a resin material, and
  at least one type of metal particle dispersed in the base material.

9. A planar light source comprising:
a wiring substrate comprising
  an insulating layer defining a first through-hole and a second through-hole that are separated from each other, and
  a first wiring layer and a second wiring layer that are disposed below the insulating layer, wherein the first wiring layer is separated from the first through-hole and the second wiring layer is separated from the second through-hole, and
  a covering layer covering peripheries of the first through-hole and the second through-hole on a lower surface of the insulating layer such that the first through-hole and the second through-hole are exposed, wherein a portion of the first wiring layer and a portion of the second wiring layer are exposed from the covering layer;

a light source disposed above the wiring substrate, the light source comprising a first electrode and a second electrode that are separated from each other;

a light guide member disposed above the wiring substrate and surrounding the light source;

a first wiring member comprising:
  a first portion filling the first through-hole and electrically connected to the first electrode, and
  a second portion continuous with the first portion, extending on a lower surface of the covering layer, and in contact with the portion of the first wiring layer that is exposed from the covering layer; and a second wiring member comprising:
  a third portion filling the second through-hole and electrically connected to the second electrode, and
  a fourth portion continuous with the third portion, extending on the lower surface of the covering layer, and in contact with the portion of the second wiring layer that is exposed from the covering layer, wherein:

the covering layer defines a third opening separated from the first through-hole and at which the portion of the first wiring layer is exposed, and a fourth opening separated from the second through-hole and at which the portion of the second wiring layer is exposed.

10. The planar light source according to claim 9, further comprising:
a light reflective sheet disposed on a region of the wiring substrate other than the first through-hole and the second through-hole.

11. The planar light source according to claim 10, wherein:
the wiring member comprises a material containing a thermosetting material as a main component,
the light reflective sheet comprises a thermoplastic resin as a main component, and
a melting point of the light reflective sheet is higher than a curing temperature of the wiring member.

12. The planar light source according to claim 9, wherein:
the covering layer defines a first opening at which the first through-hole is exposed and a second opening at which the second through-hole is exposed.

13. The planar light source according to claim 9, wherein:
a distance between the third opening and the fourth opening is longer than a distance between the first through-hole and the second through-hole.

14. A planar light source comprising:
a wiring substrate comprising
  an insulating layer defining a first through-hole and a second through-hole that are separated from each other, and
  a first wiring layer and a second wiring layer that are disposed below the insulating layer, wherein the first wiring layer is separated from the first through-hole and the second wiring layer is separated from the second through-hole, and a covering layer covering peripheries of the first through-hole and the second through-hole on a lower surface of the insulating layer such that the first through-hole and the second through-hole are exposed, wherein a portion of the first wiring layer and a portion of the second wiring layer are exposed from the covering layer;

a light source disposed above the wiring substrate, the light source comprising a first electrode and a second electrode that are separated from each other;

a light guide member disposed above the wiring substrate and surrounding the light source;

a first wiring member comprising:
- a first portion filling the first through-hole and electrically connected to the first electrode, and
- a second portion continuous with the first portion, extending on a lower surface of the covering layer, and in contact with the portion of the first wiring layer that is exposed from the covering layer;

a second wiring member comprising:
- a third portion filling the second through-hole and electrically connected to the second electrode, and
- a fourth portion continuous with the third portion, extending on the lower surface of the covering layer, and in contact with the portion of the second wiring layer that is exposed from the covering layer; and a light reflective sheet disposed on a region of the wiring substrate other than the first through-hole and the second through-hole, wherein:

each of the first wiring member and the second wiring member comprises a material containing a thermosetting material as a main component, the light reflective sheet comprises a thermoplastic resin as a main component, and a melting point of the light reflective sheet is higher than a curing temperature of the first and second wiring members.

15. The planar light source according to claim 14, wherein:

the covering layer defines a first opening at which the first through-hole is exposed and a second opening at which the second through-hole is exposed.

16. The planar light source according to claim 14, wherein:

a distance between the third opening and the fourth opening is longer than a distance between the first through-hole and the second through-hole.

* * * * *